(12) United States Patent
Byeon et al.

(10) Patent No.: US 9,433,120 B2
(45) Date of Patent: *Aug. 30, 2016

(54) DISPLAY APPARATUS

(71) Applicant: LG ELECTRONICS INC., Seoul (KR)

(72) Inventors: Jonghyun Byeon, Seoul (KR); Sunghwan Kim, Seoul (KR); Yunjoo Kim, Seoul (KR); Cheolsoo Kim, Seoul (KR); Sangdon Park, Seoul (KR); Moungyoub Lee, Seoul (KR); Hyoungsuck Oh, Seoul (KR); Deongjin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 166 days.

This patent is subject to a terminal disclaimer.

(21) Appl. No.: 14/316,588

(22) Filed: Jun. 26, 2014

(65) Prior Publication Data

US 2014/0307409 A1 Oct. 16, 2014

Related U.S. Application Data

(63) Continuation of application No. 14/055,036, filed on Oct. 16, 2013, now Pat. No. 8,797,479, which is a
(Continued)

(30) Foreign Application Priority Data

| Oct. 28, 2010 | (KR) | 10-2010-0106193 |
| Oct. 28, 2010 | (KR) | 10-2010-0106194 |
| Oct. 28, 2010 | (KR) | 10-2010-0106196 |
| Jan. 12, 2011 | (KR) | 10-2011-0003123 |
| Jan. 12, 2011 | (KR) | 10-2011-0003124 |
| Jan. 17, 2011 | (KR) | 10-2011-0004541 |
| Jan. 17, 2011 | (KR) | 10-2011-0004544 |
| Mar. 31, 2011 | (KR) | 10-2011-0029966 |
| Aug. 19, 2011 | (KR) | 10-2011-0082942 |
| Sep. 18, 2011 | (KR) | 10-2011-0093778 |

(51) Int. Cl.
*G02F 1/1333* (2006.01)
*H05K 7/14* (2006.01)
*H05K 5/00* (2006.01)

(52) U.S. Cl.
CPC ....... *H05K 7/1438* (2013.01); *G02F 1/133308* (2013.01); *H05K 5/0017* (2013.01); *G02F 2001/133314* (2013.01); *G02F 2202/28* (2013.01)

(58) Field of Classification Search
CPC ............. H05K 7/1487; H05K 7/1489; H05K 7/1438; H05K 7/183; H05K 5/0204; H05K 5/0217; H05K 5/0004; H05K 5/0017; G06F 1/16; G06F 1/1601; G06F 1/1333; G06F 1/33308; G06F 1/133608; G06F 2001/133314; G06F 2001/133322; G06F 2001/133317; G06F 2001/133325; G06F 2001/133328; G06F 2201/46; G06F 2201/465
USPC ....... 349/58, 56; 361/679.58, 724, 809, 810, 361/679.01, 801, 825, 97.1, 633, 634, 361/249.01, 632, 97.2
See application file for complete search history.

(56) References Cited

U.S. PATENT DOCUMENTS

| 6,222,597 B1 | 4/2001 | Muramatsu | 349/58 |
| 7,808,586 B2 | 10/2010 | Mochizuki | 349/110 |

(Continued)

FOREIGN PATENT DOCUMENTS

| EP | 2 026 408 A1 | 2/2009 |
| EP | 2 058 693 A1 | 5/2009 |

(Continued)

OTHER PUBLICATIONS

United States Office Action dated Jul. 23, 2014 issued in U.S. Appl. No. 13/800,867.

(Continued)

*Primary Examiner* — Thoi Duong
(74) *Attorney, Agent, or Firm* — KED & Associates, LLP

(57) ABSTRACT

A display apparatus includes a plurality of first brackets adhered to the rear panel. A first bracket has a recess on a first surface where an adhesive is applied, and a first protrusion extending from a second surface and a second protrusion extending from the first protrusion. A connection bracket has a side wall and a plurality of first tab portions. The tab portion is provided into an opening of the first protrusion. A second bracket is provided adjacent to the plurality of the first brackets and attached to the connection bracket. A frame is mounted to the at least one second bracket. A light source is provided between the frame and the second bracket.

57 Claims, 99 Drawing Sheets

Related U.S. Application Data continuation of application No. 13/652,616, filed on Oct. 16, 2012, now Pat. No. 8,605,230, which is a continuation of application No. 13/283,738, filed on Oct. 28, 2011, now Pat. No. 8,319,912.

(60) Provisional application No. 61/407,916, filed on Oct. 29, 2010, provisional application No. 61/526,273, filed on Aug. 23, 2011, provisional application No. 61/537,520, filed on Sep. 21, 2011.

(56) References Cited

U.S. PATENT DOCUMENTS

| | | | |
|---|---|---|---|
| 7,911,774 B2 | 3/2011 | Nakanishi et al. | 361/679.21 |
| 8,319,912 B2 | 11/2012 | Byeon et al. | 349/58 |
| 8,416,361 B2 | 4/2013 | Kim et al. | 349/58 |
| 8,508,687 B2 | 8/2013 | Kim et al. | 349/60 |
| 8,797,479 B2 * | 8/2014 | Byeon | G02F 1/133308 349/58 |
| 2003/0090614 A1 | 5/2003 | Kim et al. | |
| 2003/0128307 A1 | 7/2003 | Ito et al. | 349/58 |
| 2003/0223249 A1 | 12/2003 | Lee et al. | 362/561 |
| 2005/0151894 A1 | 7/2005 | Katsuda et al. | 349/58 |
| 2005/0285991 A1 | 12/2005 | Yamazaki | |
| 2006/0033412 A1 | 2/2006 | Lee | |
| 2006/0146486 A1 | 7/2006 | Wikstrom et al. | |
| 2009/0122221 A1 | 5/2009 | Lee | 349/58 |
| 2009/0190062 A1 | 7/2009 | Sudo | |
| 2009/0225252 A1 | 9/2009 | Jeong | 349/58 |
| 2009/0237583 A1 | 9/2009 | Chol | 349/58 |
| 2009/0268121 A1 | 10/2009 | Hisada | 349/58 |
| 2009/0295648 A1 | 12/2009 | Dorsey et al. | |
| 2010/0171889 A1 | 7/2010 | Pantel et al. | 349/1 |
| 2010/0182531 A1 | 7/2010 | Teratani | |
| 2010/0302457 A1 | 12/2010 | Yamamoto et al. | 348/725 |
| 2011/0260959 A1 | 10/2011 | Son et al. | |
| 2012/0050639 A1 | 3/2012 | Kim et al. | 349/58 |
| 2012/0062815 A1 | 3/2012 | Kim et al. | 349/61 |
| 2012/0092585 A1 | 4/2012 | Byeon et al. | 349/58 |
| 2012/0105761 A1 | 5/2012 | Lee et al. | 349/58 |
| 2012/0106048 A1 | 5/2012 | Byeon et al. | 361/679.01 |
| 2012/0106121 A1 | 5/2012 | Lee et al. | 362/19 |
| 2012/0106122 A1 | 5/2012 | Ryu et al. | 362/19 |
| 2012/0182700 A1 | 7/2012 | Byeon et al. | 361/749 |
| 2013/0038559 A1 | 2/2013 | Byeon et al. | 345/173 |

FOREIGN PATENT DOCUMENTS

| | | |
|---|---|---|
| EP | 2 256 539 A2 | 12/2010 |
| JP | 2001-183628 A | 7/2001 |
| JP | 2002-108238 A | 4/2002 |
| JP | 2004-133098 A | 4/2004 |
| JP | 2004-133099 A | 4/2004 |
| JP | 2005-077557 A | 3/2005 |
| JP | 2007-101938 A | 4/2007 |
| JP | 2008-216814 A | 9/2009 |
| KR | 10-1998-015704 A | 5/1998 |
| KR | 10-1998-022417 A | 7/1998 |
| KR | 10-2002-0031895 A | 5/2002 |
| KR | 10-2002-0056704 A | 7/2002 |
| KR | 10-2003-0074628 | 9/2003 |
| KR | 10-2004-0033818 A | 4/2004 |
| KR | 10-0480822 B1 | 4/2005 |
| KR | 10-0487435 B1 | 5/2005 |
| KR | 10-2005-0099692 A | 10/2005 |
| KR | 10-0517136 B1 | 1/2006 |
| KR | 10-2006-0133651 A | 2/2006 |
| KR | 10-0570647 B1 | 4/2006 |
| KR | 10-2008-0106604 A | 12/2008 |
| KR | 10-2009-0016971 A | 2/2009 |
| KR | 10-2009-0042452 A | 4/2009 |
| KR | 10-0931583 B1 | 12/2009 |
| KR | 10-2010-0077279 A | 7/2010 |
| TW | 200819830 A | 5/2008 |
| TW | 200829131 A | 7/2008 |
| WO | WO 2009/104448 A1 | 8/2009 |

OTHER PUBLICATIONS

United States Office Action date Feb. 23, 2015 issued in U.S. Appl. No. 13/800,867.
European Search Report dated Mar. 2, 2015 issued in Application No. 14003993.4.
International Search Report dated Dec. 22, 2011 issued in Application No. PCT/KR2011/002064.
Korean Notice of Allowance dated Feb. 20, 2012 issued in Application No. 10-2010-0106196.
Korean Office Action dated Apr. 12, 2012 issued in Application No. 10-2010-0092577.
International Search Report dated Apr. 13, 2012 issued in Application No. PCT/KR2011/008166.
International Search Report dated Apr. 16, 2012 issued in Application No. PCT/KR2011/009077.
International Search Report dated Apr. 27, 2012 issued in Application No. PCT/KR2011/008142.
European Search Report dated May 22, 2012 issued in Application No. 11 00 9073.
European Search Report dated May 29, 2012 issued in Application No. 11 00 8668.
United States Notice of Allowance dated Sep. 24, 2012 issued in U.S. Appl. No. 13/283,738.
United States Notice of Allowance dated Dec. 6, 2012 issued in U.S. Appl. No. 13/288,122.
U.S. Office Action dated Feb. 13, 2013 issued in Application U.S. Appl. No. 13/652,616.
U.S. Office Action dated Mar. 18, 2013 issued in U.S. Appl. No. 13/284,142.
U.S. Notice of Allowance dated Apr. 12, 2013 issued in U.S. Appl. No. 13/077,111.
European Search Report dated Aug. 30, 2013 issued in Application No. 13 00 3606.
United States Office Action dated Nov. 7, 2013 issued in U.S. Appl. No. 13/800,867.
United States Office Action dated Dec. 16, 2013 issued in U.S. Appl. No. 14/055,036.
European Search Report dated Jun. 23, 2015 issued in Application No. 14003993.4.

* cited by examiner (A)

(B)

(A)

(B)

DISPLAY APPARATUS

CROSS-REFERENCE TO RELATED APPLICATIONS

This application is a Continuation Application of prior U.S. patent application Ser. No. 14/055,036 filed Oct. 16, 2013, which is a Continuation Application of prior U.S. patent application Ser. No. 13/652,616 filed Oct. 16, 2012 (now U.S. Pat. No. 8,605,230), which is a Continuation Application of prior U.S. patent application Ser. No. 13/283,738 filed Oct. 28, 2011 (now U.S. Pat. No. 8,319,912 issued Nov. 27, 2012), which claims the benefit of Korean Patent Application Nos. 10-2010-0106193, 10-2010-0106194 and 10-2010-0106196 all filed on Oct. 28, 2010; 10-2011-0003123 and 10-2011-0003124 both filed on Jan. 12, 2011; 10-2011-0004541 and 10-2011-0004544 both filed on Jan. 17, 2011; 10-2011-0029966 filed on Mar. 31, 2011; 10-2011-0082942 filed on Aug. 19, 2011; 10-2011-0093778 filed on Sep. 18, 2011; and U.S. Provisional Application Nos. 61/407,916 filed on Oct. 29, 2010; 61/526,273 filed on Aug. 23, 2011; and 61/537,520 filed on Sep. 21, 2011, which are incorporated herein by reference for all purposes as if fully set forth herein.

BACKGROUND OF THE INVENTION

1. Field of the Invention

Embodiments of the invention relate to a display apparatus.

2. Discussion of the Related Art

With the development of the information society, various demands for display devices have been increasing. Various display devices, such as liquid crystal displays (LCDs), plasma display panels (PDPs), electroluminescent displays (ELDs), and vacuum fluorescent displays (VFDs), have been recently studied and used to meet various demands for the display devices. Among the display devices, a liquid crystal display panel of the liquid crystal display includes a liquid crystal layer, and a thin film transistor (TFT) substrate and a color filter substrate that are positioned opposite each other with the liquid crystal layer interposed therebetween. The liquid crystal display panel displays an image using light provided by a backlight unit of the liquid crystal display.

FIG. 1 illustrates a related art display device.

As shown in FIG. 1, a related art display device includes a display panel 100P including a front substrate and a back substrate, an optical layer 120P disposed in the rear of the display panel 100P, a frame 130P disposed in the rear of the optical layer 120P, first and second fastening parts 160P and 170P for fastening the display panel 100P, the optical layer 120P, and the frame 130P, a protective substrate 110P disposed in the front of the display panel 100P, a third fastening part 150P for fastening the protective substrate 110P, and a back cover 140P which is connected to the third fastening part 150P and is disposed in the rear of the frame 130P.

The related art display device has the complicated structure disclosed herein, and also it is difficult to achieve a thin profile of the related art display device. Further, visibility of the related art display device is reduced.

SUMMARY OF THE INVENTION

In one aspect, there is a display apparatus including a front panel and a rear panel attached to each other and having a plurality of liquid crystals provided in a gap between the first and rear panels, a plurality of first brackets adhered to the rear panel by an adhesive, each first bracket having a recess on a first surface where the adhesive is applied, and a first protrusion extending from a second surface and a second protrusion extending from the first protrusion, the first and second surfaces being opposite surface, the first protrusion having an opening, at least one connection bracket having a side wall extending in a first direction and a plurality of first tab portions extending in a second direction, the first and second directions being perpendicular to each other, the tab portion being provided into the opening of the of the first protrusion, at least one second bracket provided adjacent to the plurality of the first brackets and attached to the at least one connection bracket, a frame mounted to the at least one second bracket, and a light source having at least an optical sheet, a light guide and a plurality of light emitting diodes (LEDs), the light source being provided between the frame and the at least one second bracket.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
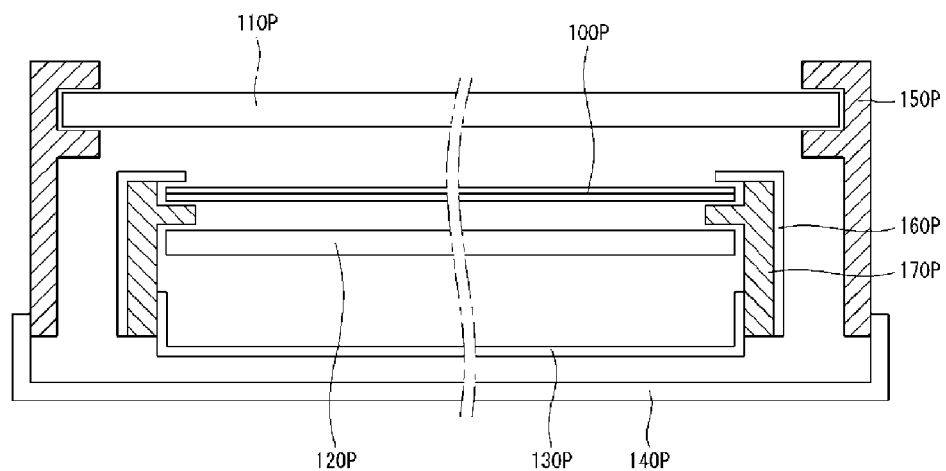
FIG. 1 illustrates a related art display device.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, a liquid crystal display panel is used as an example of a display panel. Other display panels may be used. For example, a plasma display panel (PDP), a field emission display (FED) panel, and an organic light emitting diode (OLED) display panel may be used.

FIGS. 2 to 5 illustrate a configuration of a display apparatus according to an example embodiment of the invention.

Figure 2:
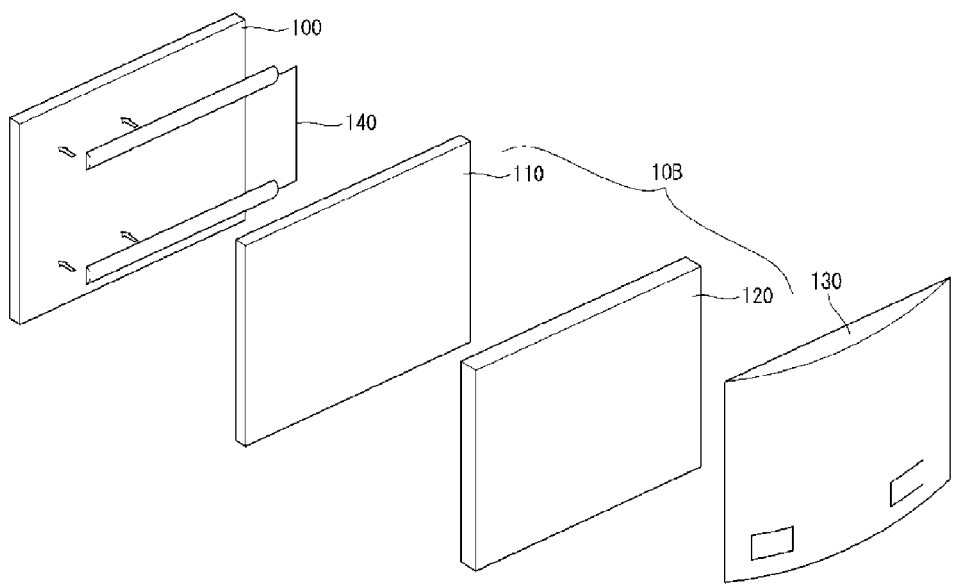
FIGS. 2 to 5 illustrate a configuration of a display apparatus according to an example embodiment of the invention.

As shown in FIG. 2, a display apparatus according to an example embodiment of the invention may include a display panel 100, a backlight unit 10B including an optical layer 110, a light source 120, a back cover 130, and a bracket 140.

The display panel 100 displaying an image may include a front substrate and a back substrate that are positioned opposite each other. The bracket 140 may be attached to a non-display area of a back surface of the back substrate of the display panel 100.

The optical layer 110 may be disposed between the back substrate and the back cover 130. The optical layer 110 may not be fixed to the bracket 140.

Alternatively, the optical layer 110 may be fixed to the bracket 140.

The optical layer 110 may include a plurality of sheets. For example, although not shown, the optical layer 110 may include at least one of a prism sheet and a diffusion sheet.

The backlight unit 10B may be disposed in the rear of the optical layer 110. Although not shown, the backlight unit 10B may further include a frame as well as the light source 120. In the embodiment disclosed herein, the backlight unit 10B includes the light source 120, the optical layer 110, and the frame (not shown). However, the backlight unit 10B may include a light guide plate (not shown). Further, in the embodiment disclosed herein, the backlight unit 10B may be used as the light source 120 and thus may indicate the light source 120. In other word, the backlight unit 10B may be referred to as the light source.

The configuration of the backlight unit may be variously changed.

Various types of light sources 120 may be used in the embodiment of the invention. For example, the light source may be one of a light emitting diode (LED) chip and a LED package having at least one LED chip. In this instance, the light source may be a colored LED emitting at least one of red, green, and blue light or a white LED.

Although the embodiment of the invention describes the direct type backlight unit 10B as an example, an edge type backlight unit may be used.

The back cover 130 may be positioned in the rear of the backlight unit 10B. The back cover 130 may protect the backlight unit 10B and the optical layer 110 from an impact or a pressure applied from the outside.

The optical layer 110 may be closely attached to the display panel 100. Alternatively, the optical layer 110 may be separated from the display panel 100 by a predetermined distance.

Alternatively, the backlight unit 10B may be closely attached to the optical layer 110. In this instance, a thickness of the display apparatus according to the embodiment of the invention may be reduced.

Figure 3:
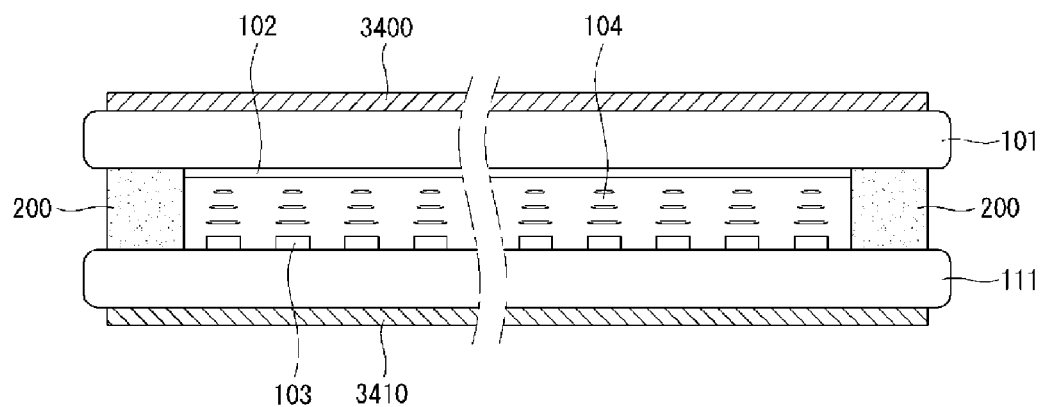

As shown in FIG. 3, the display panel 100 may include a front substrate 101 and a back substrate 111, that are positioned opposite each other and attached to each other to form a uniform cell gap therebetween. A liquid crystal layer 104 may be formed between the front substrate 101 and the back substrate 111.

A seal part 200 may be formed between the front substrate 101 and the back substrate 111 to seal the liquid crystal layer 104.

A color filter 102 may be positioned on the front substrate 101 to implement red, green, and blue colors. The color filter 102 may include a plurality of pixels each including red, green, and blue subpixels. Other configurations of the subpixels may be used for the pixel. For example, each pixel may include red, green, blue, and white subpixels. When light is incident on the color filter 102, the color filter 102 may generate images corresponding to the red, green, and blue colors.

A predetermined transistor 103, for example, a thin film transistor (TFT) may be formed on the back substrate 111. The transistor 103 may turn on or off liquid crystals in each pixel. In this instance, the front substrate 101 may be referred to as a color filter substrate, and the back substrate 111 may be referred to as a TFT substrate.

The display panel 100 may further include a front polarizing film 3400 and a back polarizing film 3410. The front polarizing film 3400 may be positioned on a front surface of the front substrate 101 to polarize light passing through the display panel 100. The back polarizing film 3410 may be positioned on a back surface of the back substrate 111 to polarize light passing through the optical layer 110 positioned in the rear of the back substrate 111. In the embodiment disclosed herein, the front polarizing film 3400 may be referred to as a first front polarizing film, and the back polarizing film 3410 may be referred to as a second front polarizing film.

The liquid crystal layer 104 may include a plurality of liquid crystal molecules, and the arrangement of the liquid crystal molecules may change in response to a driving signal supplied by the transistor 103. Hence, light provided by the backlight unit 10B may be incident on the color filter 102 based on changes in the molecular arrangement of the liquid crystal layer 104. As a result, the color filter 102 may implement red, green, and blue light, and thus a predetermined image may be displayed on the front substrate 101 of the display panel 100.

Figure 4:
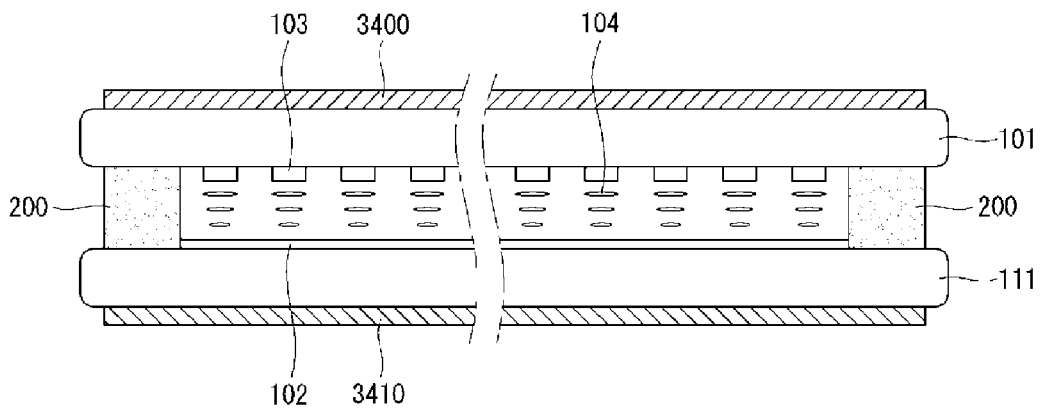

Alternatively, as shown in FIG. 4, a color filter 102 for implementing red, green, and blue colors may be positioned on the back substrate 111.

Further, a predetermined transistor 103, for example, a TFT may be formed on the front substrate 101. The transistor 103 may turn on or off liquid crystals in each pixel. In this instance, the back substrate 111 may be referred to as a color filter substrate, and the front substrate 101 may be referred to as a TFT substrate.

As above, when the transistor 103 is formed on the front substrate 101, it is easy to install a connecting unit, such as a cable and a flexible printed circuit board, for connecting a driving board (not shown) to the transistor 103 on the front substrate 101.

Further, the driving board may be disposed in the rear of the display panel 100. In this instance, a length of the connecting unit for connecting the driving board to the transistor 103 may be reduced.

Figure 5:
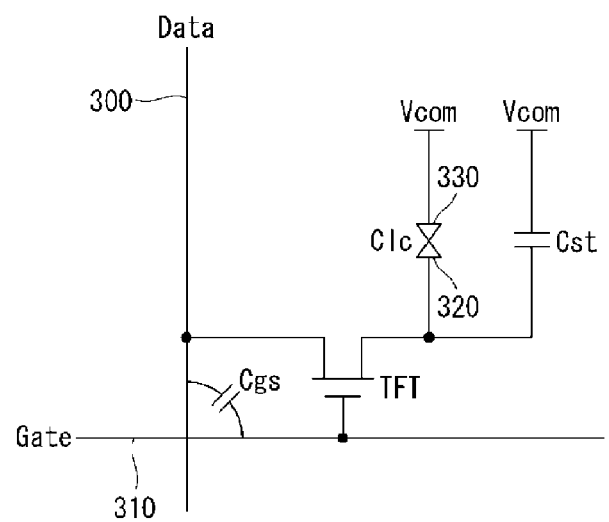

As shown in FIG. 5, each pixel of the display panel 100 may include a data line 300, a gate line 310 crossing the data line 300, and the TFT 103 connected to a crossing of the data line 300 and the gate line 310.

The TFT 103 supplies a data voltage supplied through the data line 300 to a pixel electrode 320 of a liquid crystal cell Clc in response to a gate pulse from the gate line 310. The liquid crystal cell Clc is driven by an electric field generated by a voltage difference between a voltage of the pixel electrode 320 and a common voltage Vcom applied to a common electrode 330, thereby controlling an amount of light passing through a polarizing plate. A storage capacitor Cst is connected to the pixel electrode 320 of the liquid crystal cell Clc and holds the voltage of the liquid crystal cell Clc.

Since the above-described structure and the above-described configuration of the display panel 100 are only one example, they may be changed, added, or omitted.

Figure 6:
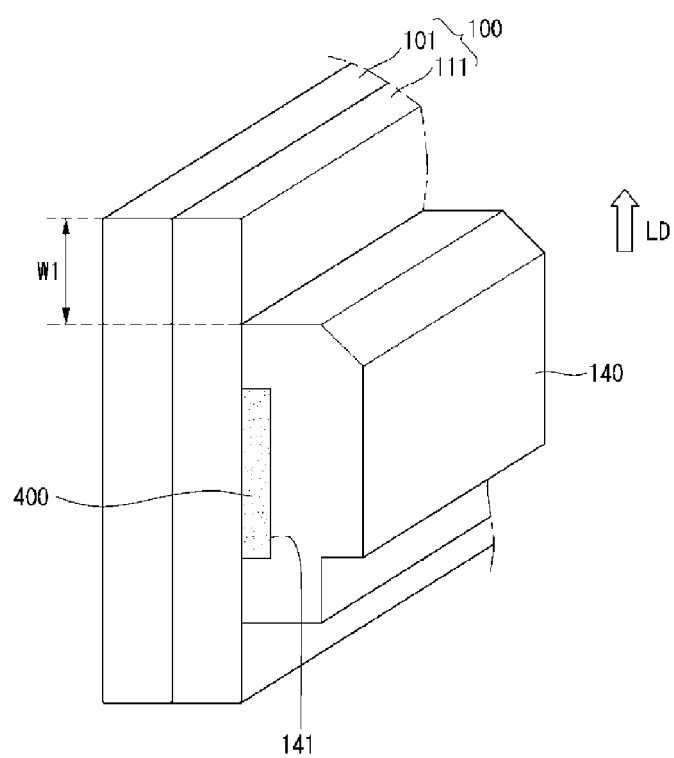
FIGS. 6 to 124 illustrate a structure of a display apparatus according to an example embodiment of the invention.
Figure 119:
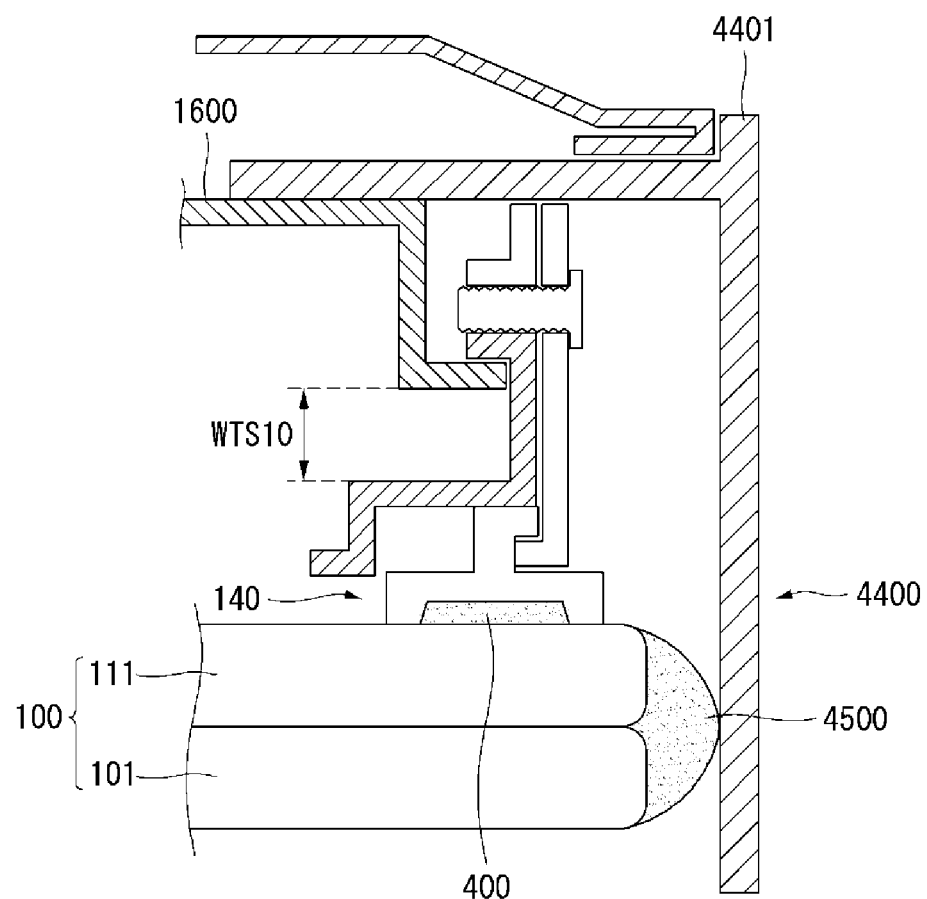

FIGS. 6 to 119 illustrate a structure of a display apparatus according to an example embodiment of the invention. In the following description, the descriptions of the configuration and the structure described above are omitted.

As shown in FIG. 6, an adhesive layer 400 may be formed between the back surface of the back substrate 111 of the display panel 100 and the bracket 140. The bracket 140 may be attached to the back surface of the back substrate 111 of the display panel 100 using the adhesive layer 400.

As above, when the bracket 140 is attached to the back surface of the back substrate 111 using the adhesive layer 400, a supporter such as a pem nut and a boss and a fastener such as a screw are not used to fasten the bracket 140 to the back substrate 111. Therefore, a fixing process may be simply performed, the manufacturing cost may be reduced, and the thickness of the display apparatus may be reduced.

A groove 141 may be formed in one surface of the bracket 140 opposite the back substrate 111, so as to improve an adhesive strength between the bracket 140 and the back substrate 111. It may be preferable that the adhesive layer 400 is formed in the groove 141. In this instance, because the groove 141 may prevent from an adhesive material of the adhesive layer 400 from being discharged to the outside of the bracket 140, an attaching process may be easily performed.

As above, when the bracket 140 is attached to the back surface of the back substrate 111, the display panel 100 may include a portion extending further than the adhesive layer 400 in a longitudinal direction LD of the display panel 100. Further, the display panel 100 may include a portion W1 extending further than the bracket 140 in the longitudinal direction LD.

Figure 7:
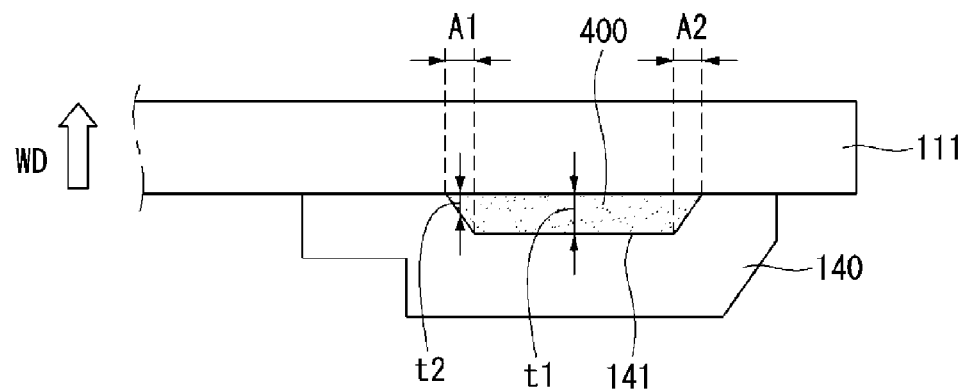

As shown in FIG. 7, the groove 141 may include portions having each a different depth.

More specifically, the groove 141 of the bracket 140 may include portions A1 and A2 each having a gradually decreasing or increasing depth in a width direction WD, so as to further improve the adhesive strength between the bracket 140 and the back substrate 111 while efficiently injecting the adhesive material of the adhesive layer 400 into the groove 141.

For example, a depth t1 of a middle portion of the groove 141 may be different from a depth t2 of an edge portion of the groove 141. A length of the groove 141 in the edge portion of the groove 141 may gradually decrease.

In other words, the adhesive layer 400 formed in the groove 141 may include portions having each a different thickness. For example, a width of a middle portion of the adhesive layer 400 may be greater than a width of an edge portion of the adhesive layer 400.

Figure 8:
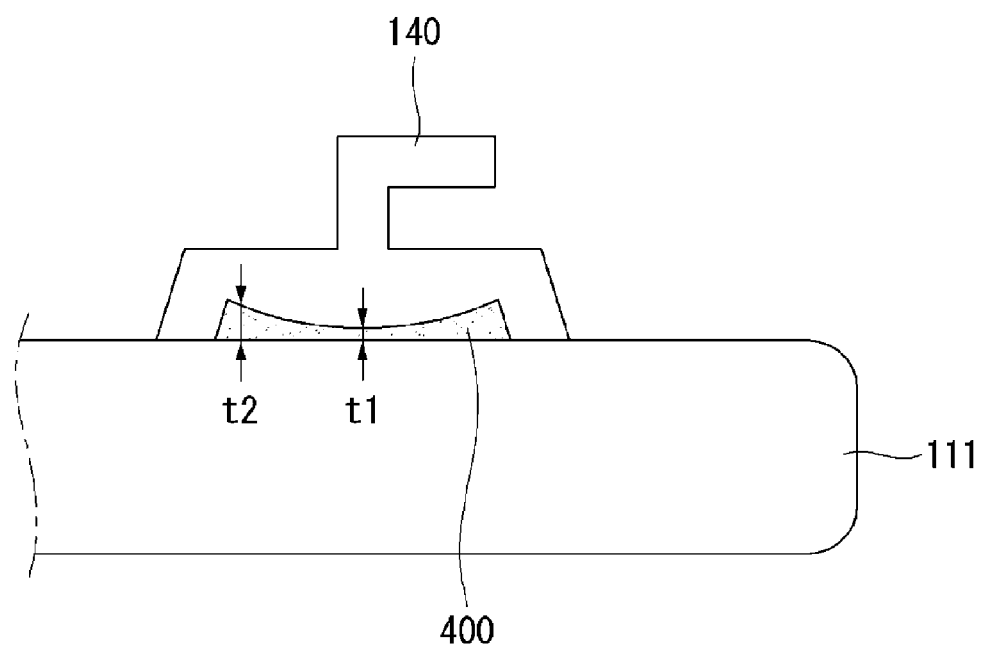

Alternatively, as shown in FIG. 8, a width t1 of the middle portion of the adhesive layer 400 may be less than a width t2 of the edge portion of the adhesive layer 400. Even in this case, because an amount of the adhesive material of the adhesive layer 400 may increase, the adhesive strength between the bracket 140 and the back substrate 111 may be improved.

The shape of the bracket 140 may be variously changed.

Figure 9:
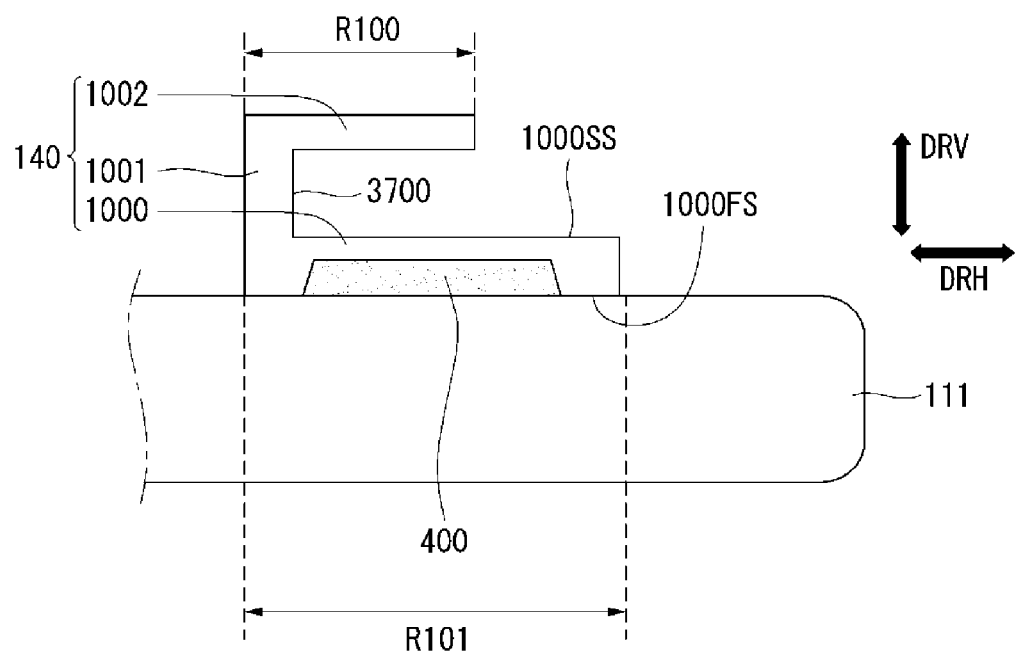

For example, as shown in FIG. 9, the bracket 140 may include a base 1000, a head 1002, and a pillar 1001 for connecting the base 1000 to the head 1002. The adhesive layer 400 may be disposed between the base 1000 of the bracket 140 and the back substrate 111.

In other word, the bracket 140 has a recess (A groove) on a first surface 1000FS where the adhesive for adhesive layer 400 is applied. And the bracket has a first protrusion 1001 extending from a second surface 1000SS and a second protrusion 1002 extending from the first protrusion 1001. In this instance, the first and second surfaces 1000FS, 1000SS being opposite surface.

And, the first protrusion 1001 of the bracket extending away from the rear panel 111 in a width direction (i.e., a vertical direction DRV or a third direction) of the display panel and the second protrusion 1002 extend from an end of the first protrusion 1001 in a longitudinal direction (i.e., a horizontal direction DRH or a second direction) of the display panel such that the first and second protrusions 1001, 1002 form an inverted L-shape.

A width R101 of the base 1000 providing a space for the adhesive layer 400 may be greater than a width R100 of the head 1002.

A groove 3700 may be formed between the base 1000 and the head 1002.

Figure 10:
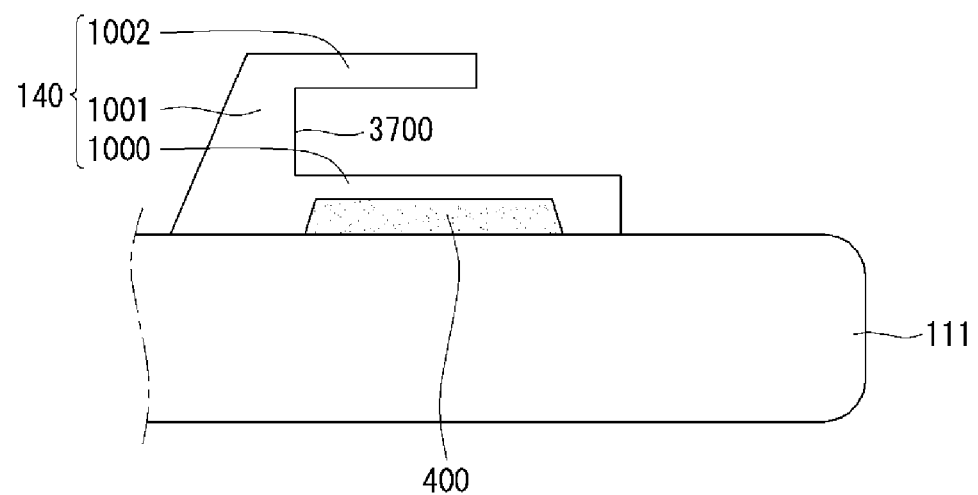

Alternatively, as shown in FIG. 10, the pillar 1001 of the bracket 140 may include a portion inclined based on the back substrate 111 of the display panel 100. Preferably, the pillar 1001 may include a portion inclined toward the outside of the display panel 100. In this instance, the bracket 140 may include a portion having different widths. More specifically, the bracket 140 may include a portion having different widths as measured in the longitudinal direction of the display panel 100, i.e., the horizontal direction. In other words, the bracket 140 may include a portion having a gradually deceasing width as the bracket 140 goes in the direction away from the display panel 100.

In this instance, even if the size of a dummy area positioned outside an active area of the display panel 100, on which the image is displayed, is reduced, an excessive reduction in the luminance of the image in a boundary between the dummy area and the active area may be prevented.

Figure 11:
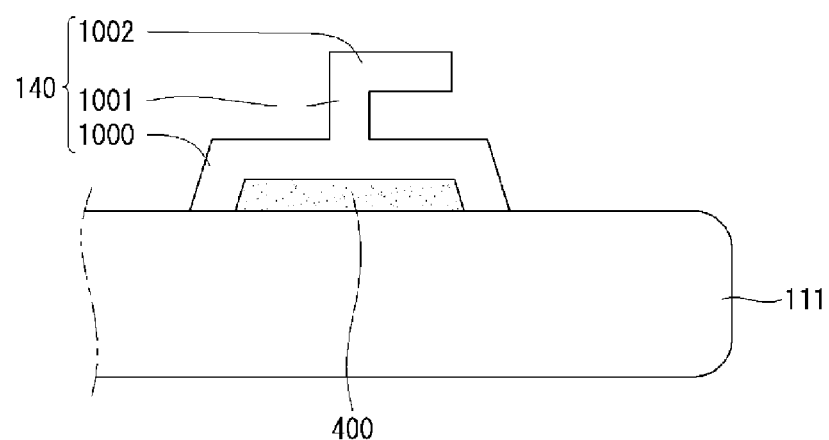

Alternatively, as shown in FIG. 11, the position of the pillar 1001 on the base 1000 may vary.

Figure 12:
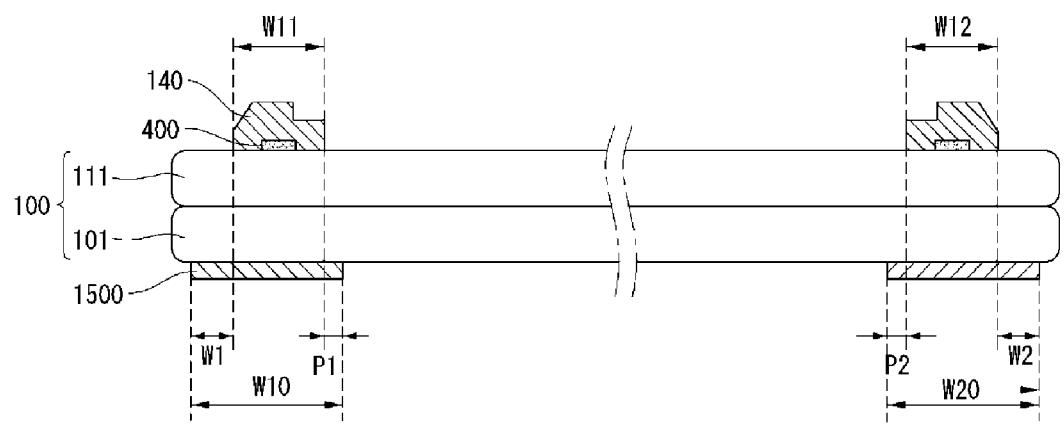

As shown in FIG. 12, a blocking member 1500 may be positioned at an edge of the front surface of the front substrate 101. Preferably, the blocking member 1500 may be attached to the edge of the front surface of the front substrate 101. Because the blocking member 1500 hides the dummy area of the display panel 100, the image displayed on a screen area (i.e., the active area) may be more prominently showed.

The blocking member 1500 may have lightness lower than ambient lightness. For example, the lightness of the blocking member 1500 may be lower than lightness of the display panel 100. For this, the blocking member 1500 may be substantially black. For example, the blocking member 1500 may be substantially a black tape and may be formed by attaching a black tape to the front surface of the front substrate 101. Thus, the blocking member 1500 may be referred to as a black layer.

Figure 13:
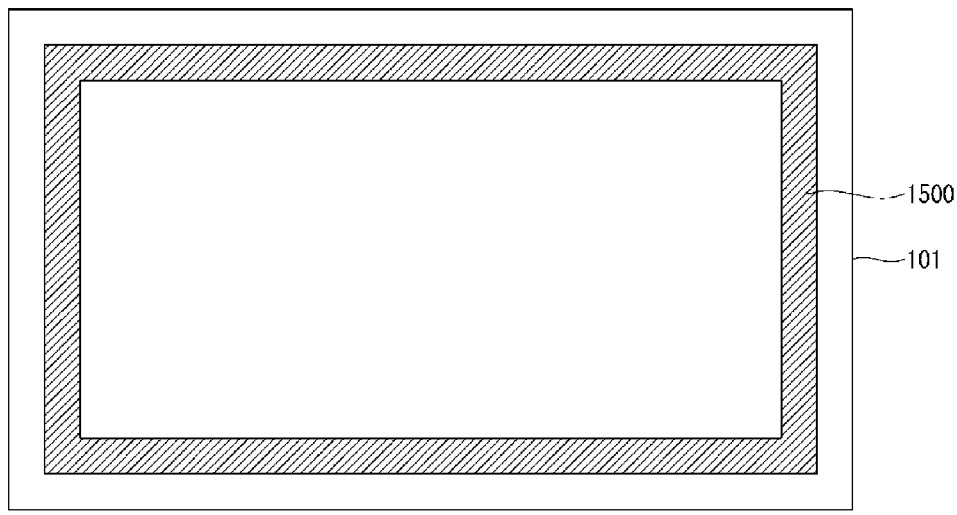

Because the blocking member 1500 is positioned on the front surface of the front substrate 101 and the edge of the front surface of the front substrate 101 is exposed, almost the entire portion of the blocking member 1500 may be exposed as shown in FIG. 13. In other words, when the observer in the front of the display panel 100 views the display panel 100, the observer may view almost the entire portion of the blocking member 1500. Namely, almost the entire portion of the blocking member 1500 may be observed.

Because the bracket 140 does not display the image, it may be preferable that the bracket 140 is positioned in the dummy area outside the screen area. Further, it may be preferable that the bracket 140 is hidden by the blocking member 1500. Hence, as shown in FIG. 12, the blocking member 1500 may overlap the bracket 140. Preferably, the bracket 140 may entirely overlap the bracket 140. More preferably, widths W10 and W20 of the blocking member 1500 may be greater than widths W11 and W12 of the bracket 140. In this instance, the blocking member 1500 may include portions P1 and P2 extending further than the bracket 140 in the middle direction of the front substrate 101. Further, the blocking member 1500 may include portions W1 and W2 extending further than the bracket 140 in a direction opposite the middle direction of the front substrate 101.

The widths W10 and W20 of the blocking member 1500 and the widths W11 and W12 of the bracket 140 are a width in a cross section of the display panel 100.

Figure 14:
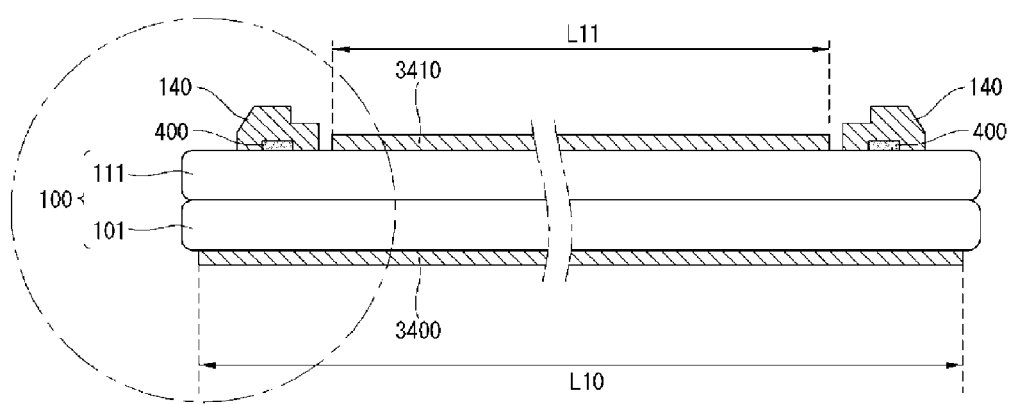

As shown in FIG. 14, the front polarizing film 3400 may be positioned on the front surface of the front substrate 101 of the display panel 100, and the back polarizing film 3410 may be positioned on the back surface of the back substrate 111.

A width L10 of the front polarizing film 3400 positioned on the front substrate 101 may be different from a width L11 of the back polarizing film 3410 positioned on the back substrate 111. The width L10 of the front polarizing film 3400 and the width L11 of the back polarizing film 3410 are a width in the cross section of the display panel 100.

Preferably, the width L10 of the front polarizing film 3400 may be greater than the width L11 of the back polarizing film 3410. In other words, an end of at least one side of the front polarizing film 3400 may extend further than the back polarizing film 3410.

Figure 15:
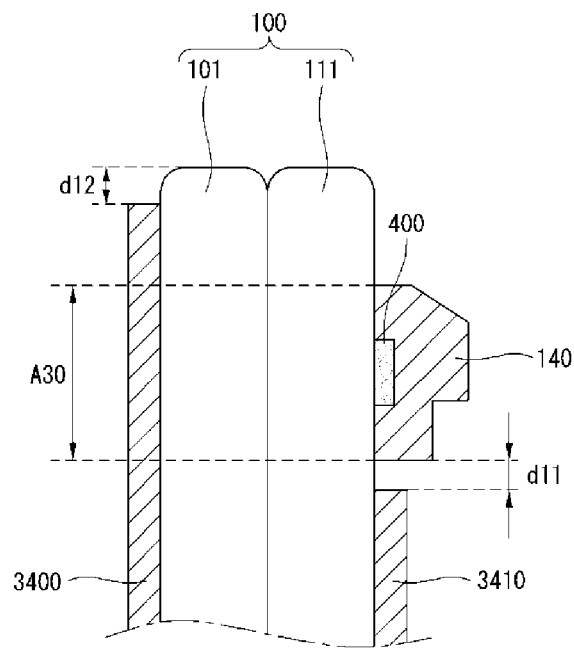

More specifically, as shown in FIG. 15, the front polarizing film 3400 may include a portion A30 overlapping the bracket 140. The bracket 140 may be separated from the back polarizing film 3410 by a predetermined distance d11 in a direction parallel to the longitudinal direction of the back substrate 111. In this instance, the bracket 140 may be directly attached to the back substrate 111. Hence, the adhesive strength between the bracket 140 and the back substrate 111 may be improved.

Further, the front polarizing film 3400 may be separated from an end of the front surface of the front substrate 101 by a predetermined distance d12. In this instance, a process for attaching the front polarizing film 3400 to the front substrate 101 may be easily performed, and the production yield may be improved.

Figure 16:
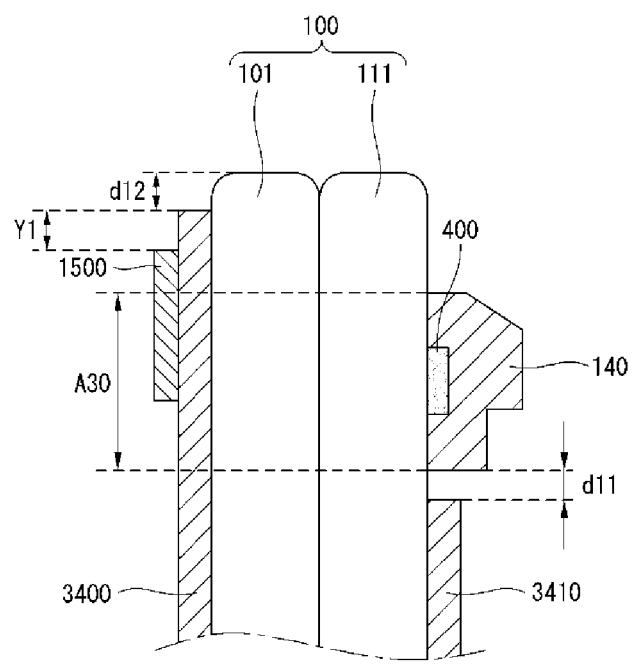

As shown in FIG. 16, the blocking member 1500 may overlap the front polarizing film 3400. For example, the blocking member 1500 may include a portion positioned on the front polarizing film 3400.

Further, the front polarizing film 3400 may include a portion Y1 extending further than the blocking member 1500 in a direction away from the middle of the display panel 100. FIG. 16 shows that the blocking member 1500 is positioned on the front polarizing film 3400. However, the blocking member 1500 may be positioned between the front polarizing film 3400 and the front substrate 101. Even in this case, the front polarizing film 3400 may include the portion Y1 extending further than the blocking member 1500 in the direction away from the middle of the display panel 100.

Figure 17:
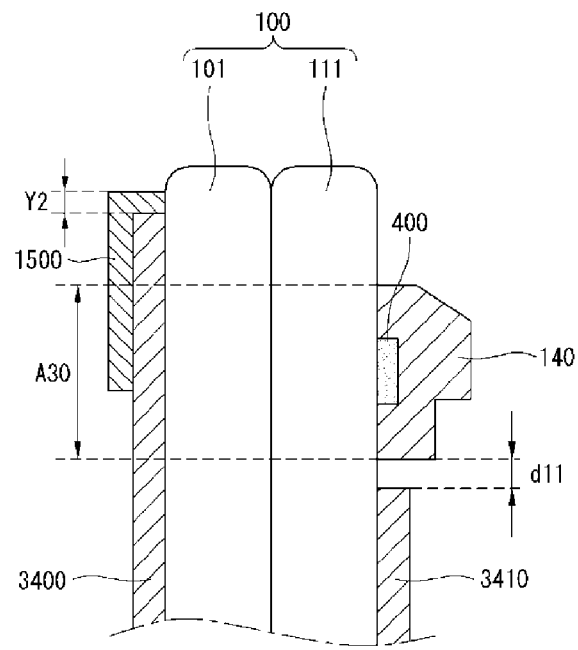

Alternatively, as shown in FIG. 17, the blocking member 1500 may include a portion Y2 extending further than the front polarizing film 3400 in the direction away from the middle of the display panel 100. In this case, the blocking member 1500 may contact both the front polarizing film 3400 and the front substrate 101.

FIG. 17 shows that the blocking member 1500 is positioned on the front polarizing film 3400. However, the blocking member 1500 may be positioned between the front polarizing film 3400 and the front substrate 101. Even in this case, the blocking member 1500 may include the portion Y2 extending further than the front polarizing film 3400 in the direction away from the middle of the display panel 100.

Figure 18:
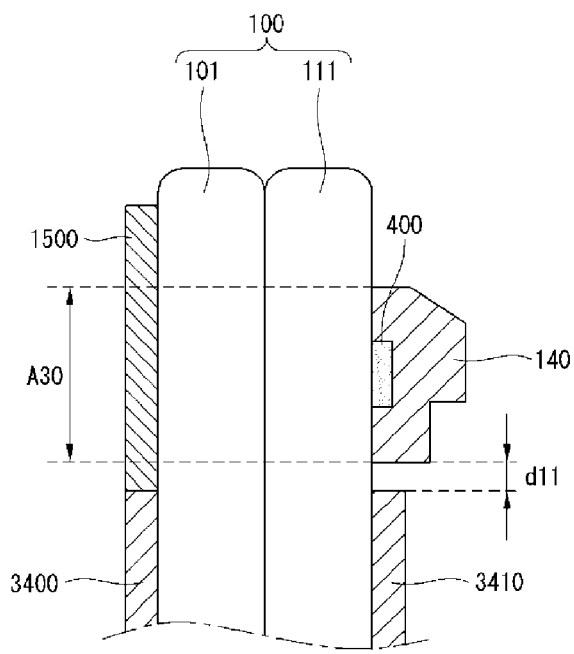

Alternatively, as shown in FIG. 18, the blocking member 1500 and the front polarizing film 3400 may be formed on the same layer level. In this instance, the blocking member 1500 may be positioned outside the front polarizing film 3400.

Figure 19:
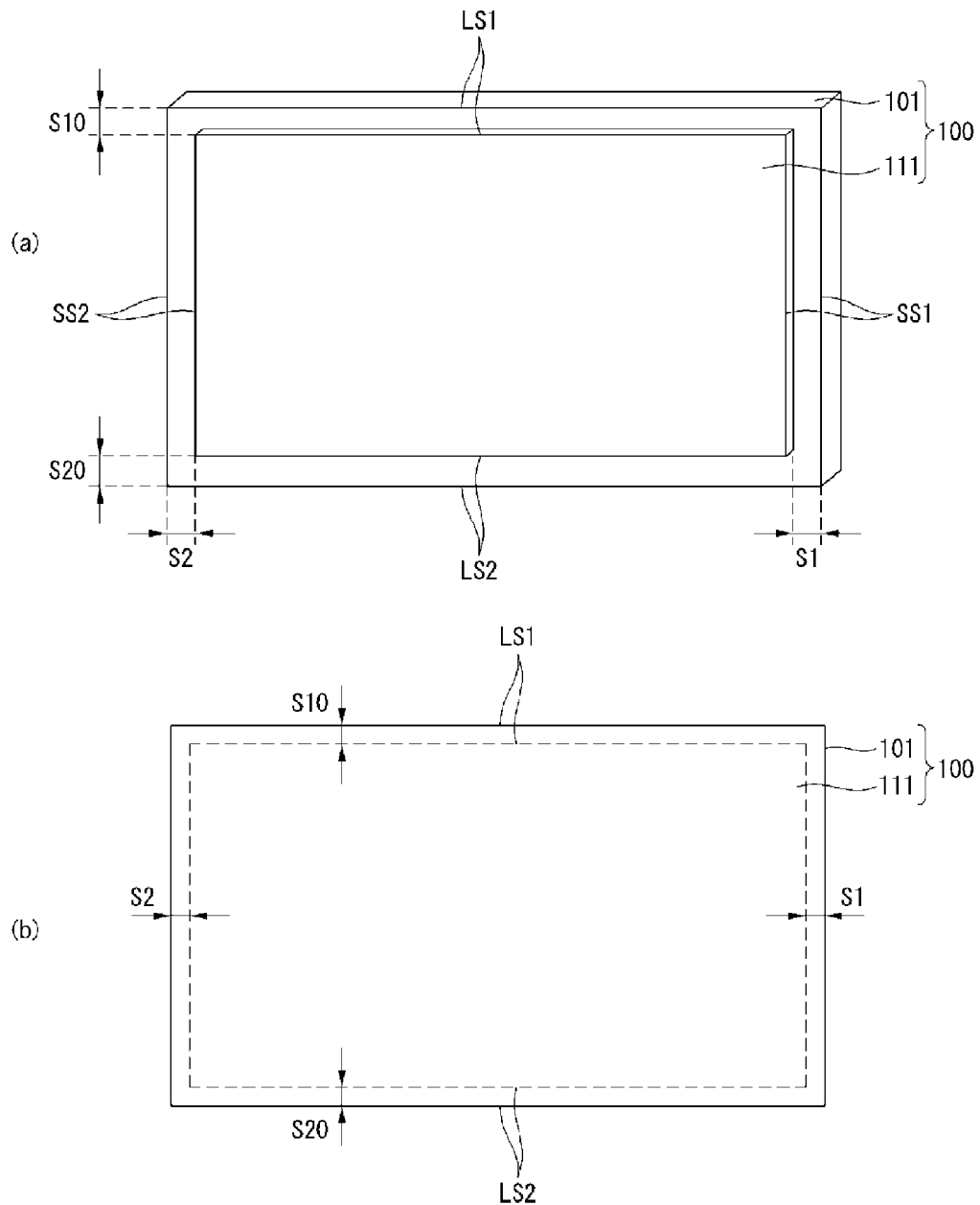

As shown in FIGS. 19(*a*) and 19(*b*), short sides SS1 and SS2 of the front substrate 101 may extend further than short sides SS1 and SS2 of the back substrate 111, and long sides LS1 and LS2 of the front substrate 101 may extend further than long sides LS1 and LS2 of the back substrate 111. In other words, an end of at least one side of the front substrate 101 may extend further than the back substrate 111.

For example, the first short side SS1 of the front substrate 101 may extend further than the first short side SS1 of the back substrate 111 corresponding to the first short side SS1 of the front substrate 101 by a first length S1. The second short side SS2 of the front substrate 101 may extend further than the second short side SS2 of the back substrate 111 corresponding to the second short side SS2 of the front substrate 101 by a second length S2. The first length S1 may be substantially equal to the second length S2.

Alternatively, the first length S1 may be different from the second length S2. In this instance, the structure of the first short side SS1 of the front substrate 101 may be different from the structure of the second short side SS2 of the front substrate 101.

For example, a sufficient space may be provided on the first short side SS1 of the back substrate 111, so as to mount a gate driver on the first short side SS1 of the back substrate 111 corresponding to the first short side SS1 of the front substrate 101. In this instance, the first length S1 may be less than the second length S2.

Further, the first long side LS1 of the front substrate 101 may extend further than the first long side LS1 of the back substrate 111 corresponding to the first long side LS1 of the front substrate 101 by a length S10. The second long side LS2 of the front substrate 101 may extend further than the second long side LS2 of the back substrate 111 corresponding to the second long side LS2 of the front substrate 101 by a length S20. The length S10 and the length S20 may be different from each other.

Figure 20:
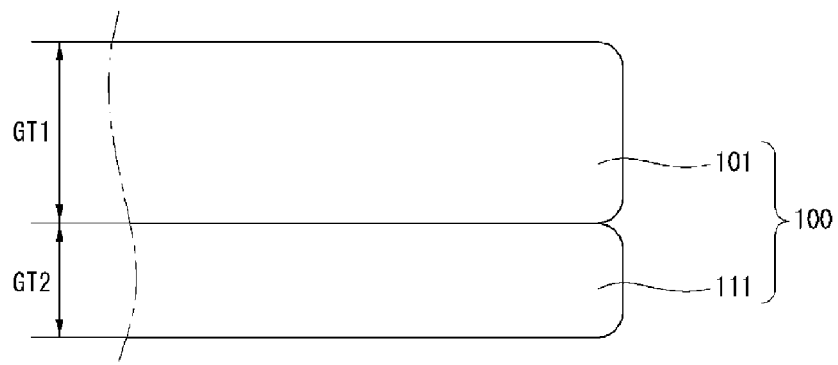

As shown in FIG. 20, a thickness GT1 of the front substrate 101 may be greater than a thickness GT2 of the back substrate 111. Hence, the front substrate 101 may have a sufficient strength. Therefore, even if the edge of the front surface of the front substrate 101 is exposed, a damage of the front substrate 101 may be prevented.

Figure 21:
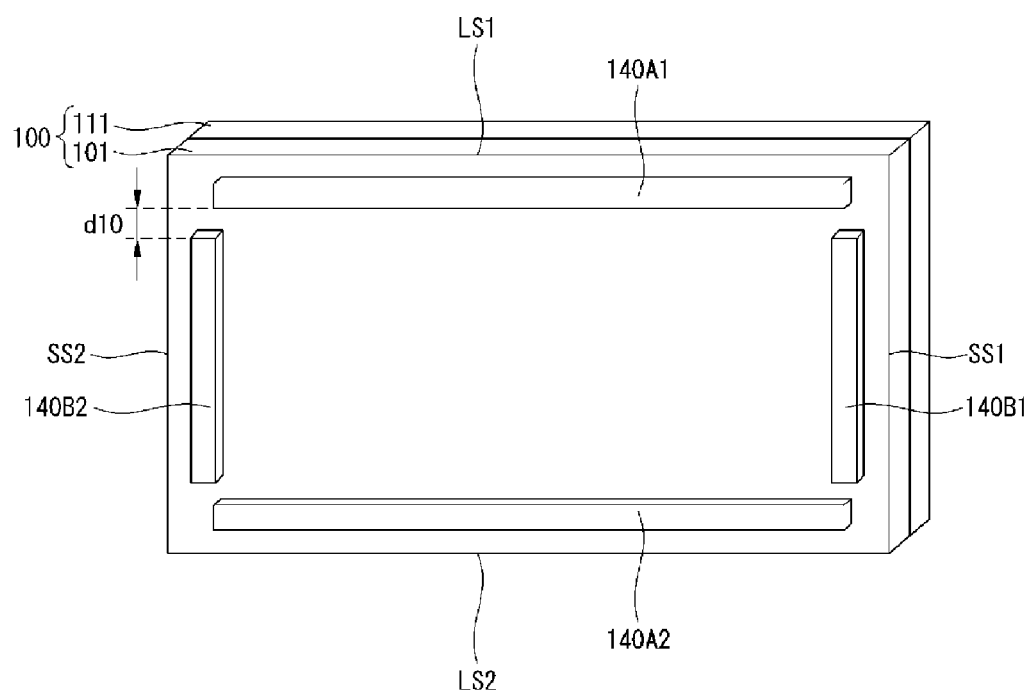

In the embodiment of the invention, the bracket 140 may be divided into a plurality of parts. For example, as shown in FIG. 21, the bracket 140 may include transverse brackets 140A1 and 140A2 and longitudinal brackets 140B1 and 140B2.

The transverse brackets 140A1 and 140A2 may be respectively attached to the long sides LS1 and LS2 of the back surface of the back substrate 111 of the display panel 100. The longitudinal brackets 140B1 and 140B2 may be respectively attached to the short sides SS1 and SS2 of the back surface of the back substrate 111.

The transverse brackets 140A1 and 140A2 may be separated from the longitudinal brackets 140B1 and 140B2 by a predetermined distance d10. Preferably, the transverse brackets 140A1 and 140A2 and the longitudinal brackets 140B1 and 140B2 may be separated from each other in the corner of the back surface of the back substrate 111.

In this instance, a process for attaching the transverse brackets 140A1 and 140A2 and the longitudinal brackets 140B1 and 140B2 to the back substrate 111 may be easily performed, and the manufacturing cost of the bracket 140 may be reduced. Hence, the manufacturing cost of the display apparatus may be reduced.

Figure 22:
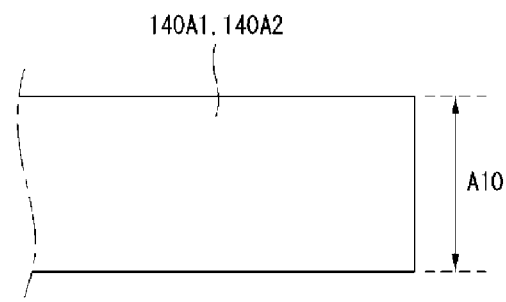
Figure 22:
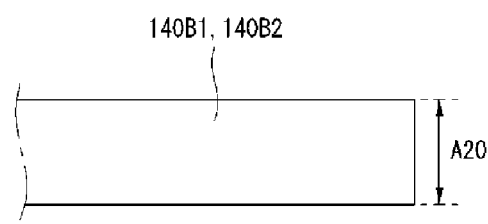

A width A10 of each of the transverse brackets 140A1 and 140A2 may be different from a width A20 of each of the longitudinal brackets 140B1 and 140B2. For example, as shown in FIG. 22, the width A10 of each of the transverse brackets 140A1 and 140A2 may be greater than the width A20 of each of the longitudinal brackets 140B1 and 140B2.

Figure 23:
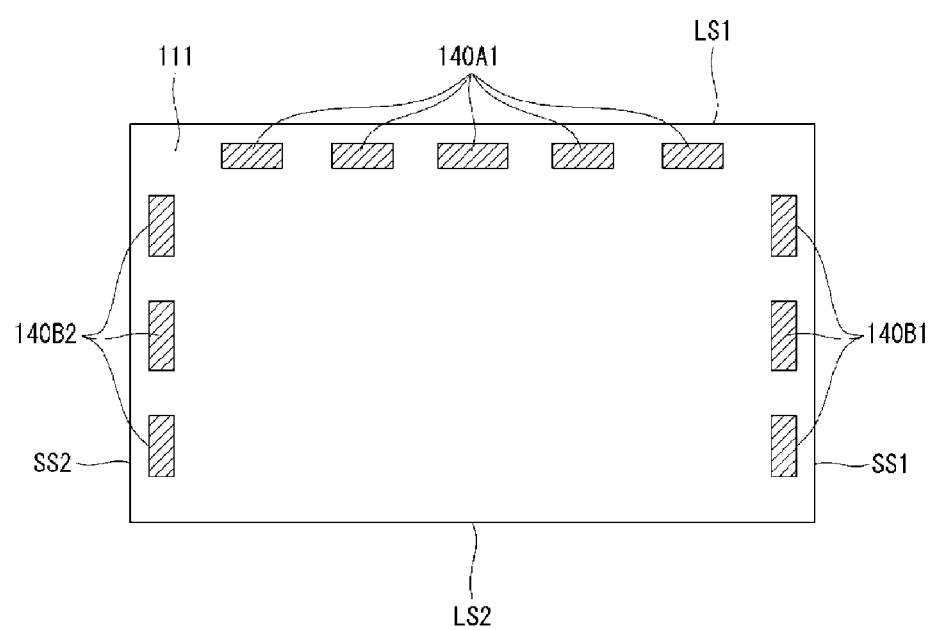

Alternatively, the bracket 140 may be divided into a plurality of sub-brackets positioned parallel to one another. For example, as shown in FIG. 23, the transverse bracket 140A1 positioned in a first area LS1 of the back substrate 111 may be divided into a plurality of sub-brackets, the first longitudinal bracket 140B1 positioned in a third area SS1 of the back substrate 111 may be divided into a plurality of sub-brackets, and the second longitudinal bracket 140B2 positioned in a fourth area SS2 of the back substrate 111 may be divided into a plurality of sub-brackets.

In other words, the plurality of transverse brackets 140A1 in the first area LS1 of the display panel 100 may be positioned parallel to one another in a first direction, for example, in a direction parallel to the long side LS of the display panel 100. Further, the plurality of first longitudinal brackets 140B1 in the third area SS1 of the display panel 100 may be positioned parallel to one another in a second direction crossing the first direction, for example, in a direction parallel to the short side SS of the display panel 100. The plurality of second longitudinal brackets 140B2 in the fourth area SS2 of the display panel 100 may be positioned parallel to one another in the second direction.

As above, when the bracket 140 is divided into the plurality of sub-brackets, a deformation amount of the back cover 130 may be distributed into the plurality of sub-brackets even if the back cover 130 is deformed. Hence, a light leakage phenomenon may be reduced.

Figure 24:
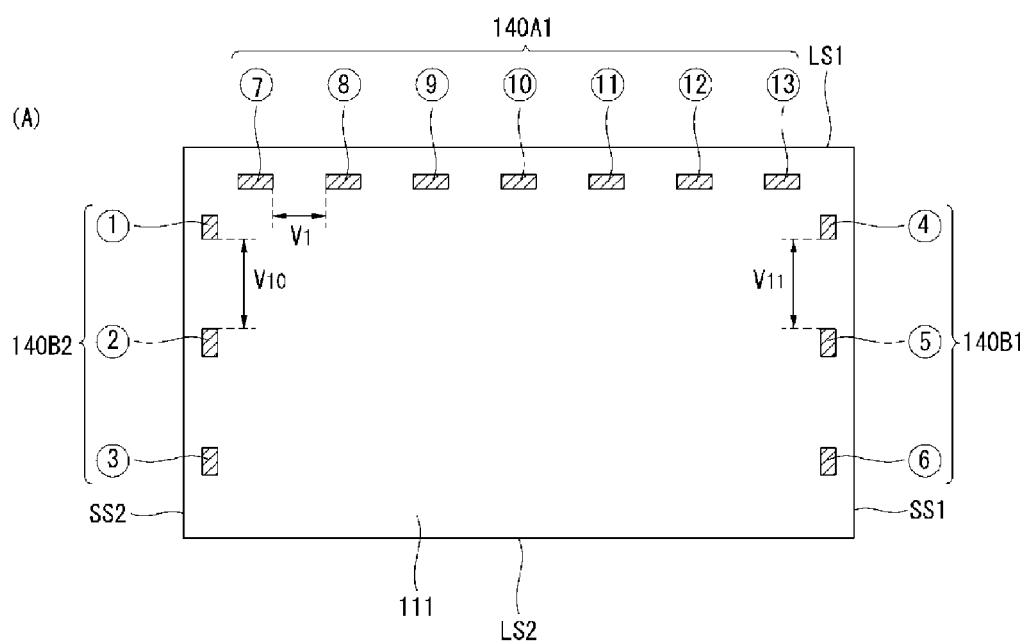
Figure 24:
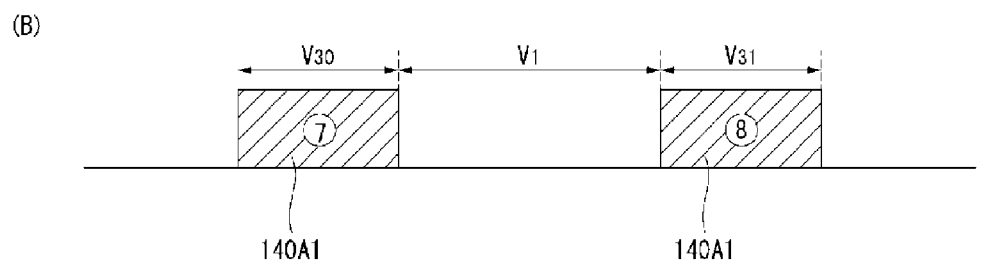

As shown in FIG. 24(A), it is assumed that the transverse bracket 140A1 positioned in the first area of the display panel 100, for example, the first area of the back substrate 111 (i.e., the first long side LS1 of the back substrate 111) is divided into a total of seven transverse brackets ⑦, ⑧, ⑨, ⑩, ⑪, ⑫, and ⑬; the first longitudinal bracket 140B1 positioned in the third area of the display panel 100, for example, the third area of the back substrate 111 (i.e., the first short side SS1 of the back substrate 111) is divided into a total of three longitudinal brackets ①, ②, and ③; and the second longitudinal bracket 140B2 positioned in the fourth area of the display panel 100, for example, the fourth area of the back substrate 111 (i.e., the second short side SS2 of the back substrate 111) is divided into a total of three longitudinal brackets ④, ⑤, and ⑥.

A distance between the adjacent transverse brackets 140A1 may be different from distances between the adjacent longitudinal brackets 140B1 and 140B2. Preferably, the distance between the adjacent transverse brackets 140A1 may be less than the distances between the adjacent longitudinal brackets 140B1 and 140B2. For example, a distance V1 between the first and second transverse brackets ⑦ and ⑧ may be less than a distance V11 between the 1-1 and 1-2 longitudinal brackets ④ and ⑤ and a distance V10 between the 2-1 and 2-2 longitudinal brackets ① and ②.

A reason why the distance between the adjacent transverse brackets 140A1 is less than the distances between the adjacent longitudinal brackets 14061 and 14062 is as follows.

The lengths of the first and second long sides LS1 and LS2 of the display panel 100 are longer than the lengths of the first and second short sides SS1 and SS2 of the display panel 100, and thus the pressure may be mainly applied to the first and second long sides LS1 and LS2 of the display panel 100. Considering this, it may be preferable that the transverse brackets 140A1 positioned on the first long side LS1, to which the relatively high pressure is applied, are positioned closer than the longitudinal brackets 14061 and 14062.

Further, the total number of transverse brackets ⑦, ⑧, ⑨, ⑩, ⑪, ⑫, and ⑬ positioned on the first long side LS1 of the display panel 100 may be more than a sum of the total number of first longitudinal brackets ①, ②, and ③ positioned on the first short side SS1 of the display panel 100 and the total number of second longitudinal brackets ④, ⑤, and ⑥ positioned on the second short side SS1 of the display panel 100.

A distance between the two adjacent brackets 140 may be greater than a width of the bracket 140.

For example, as shown in FIG. 24(b), it may be preferable that a distance V1 between the first and second transverse brackets ⑦ and ⑧ among the plurality of transverse brackets 140A1 is greater than a width V30 of the first transverse bracket ⑦ and a width V31 of the second transverse bracket ⑧.

A distance between the two adjacent brackets 140 may vary depending on their position on the display panel 100.

Figure 25:
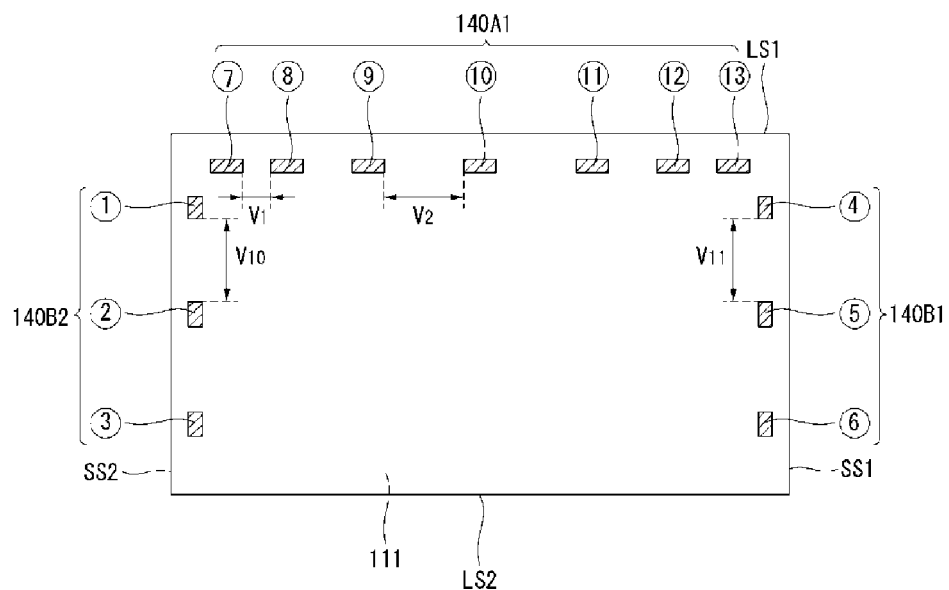

For example, as shown in FIG. 25, in the plurality of transverse brackets 140A1 (i.e., ⑦, ⑧, ⑨, ⑩, ⑪, ⑫, and ⑬) positioned on the first long side LS1 of the display panel 100, a distance V1 between the first and second transverse brackets ⑦ and ⑧ may be different from a distance V2 between the third and fourth transverse brackets ⑨ and ⑩. Preferably, the distance V1 between the first and second transverse brackets ⑦ and ⑧ may be less than the distance V2 between the third and fourth transverse brackets ⑨ and ⑩.

In other words, as the transverse brackets 140A1 on the first long side LS1 of the display panel 100 go from the middle to the outside of the first long side LS1, a distance between the two adjacent transverse brackets 140A1 may increase. In this instance, the structural stability of the display apparatus may be improved.

A distance between the two adjacent brackets 140 in the corner of the display panel 100 may be set to be relatively small.

Figure 26:
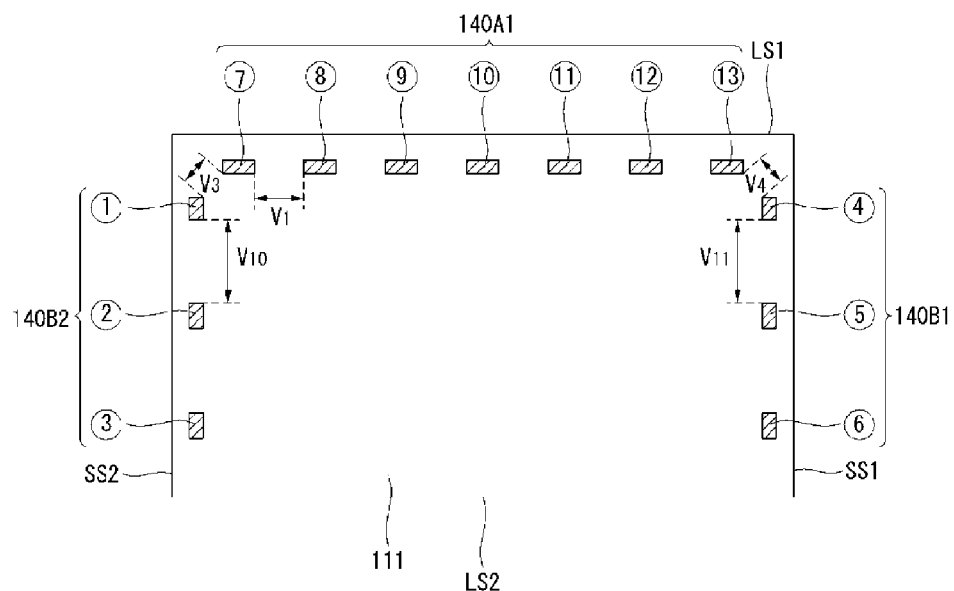

For example, as shown in FIG. 26, a shortest distance V4 between the transverse bracket 140A1 and the first longitudinal bracket 140B1 in a boundary between the first area LS1 and the third area SS1 of the display panel 100 may be less than a distance V11 (or V10) between the two adjacent longitudinal brackets 140B1 (or 140B2) and a distance V1 between the two adjacent transverse brackets 140A1. In other words, the distance V4 between the seventh transverse bracket ⑬ positioned in the first area LS1 of the display panel 100 and the 1-1 longitudinal bracket ④ positioned in the third area SS1 of the display panel 100 may be less than the distance V1 between the first and second transverse brackets ⑦ and ⑧ and the distance V10 between the 2-1 and 2-2 longitudinal brackets ① and ②.

Further, a shortest distance V3 between the transverse bracket 140A1 and the second longitudinal bracket 14062 in a boundary between the first area LS1 and the fourth area SS2 of the display panel 100 may be less than the distance V11 (or V10) between the two adjacent longitudinal brackets 14061 (or 14062) and the distance V1 between the two adjacent transverse brackets 140A1. In other words, the distance V3 between the first transverse bracket ⑦ positioned in the first area LS1 of the display panel 100 and the 2-1 longitudinal bracket ① positioned in the fourth area SS2 of the display panel 100 may be less than the distance V1 between the first and second transverse brackets ⑦ and ⑧ and the distance V10 between the 2-1 and 2-2 longitudinal brackets ① and ②.

In this instance, the structural stability of the display apparatus may be further improved.

Figure 27:
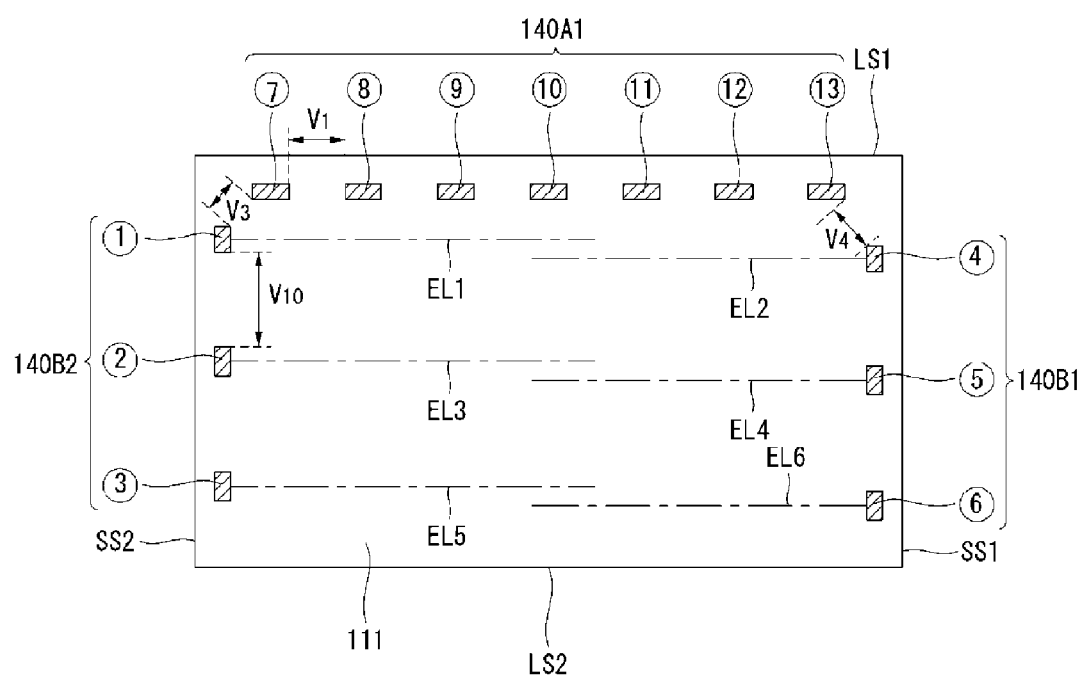

As shown in FIG. 27, the shortest distance V4 between the transverse bracket 140A1 and the first longitudinal bracket 140B1 in the boundary between the first area LS1 and the third area SS1 of the display panel 100 may be different from the shortest distance V3 between the transverse bracket 140A1 and the second longitudinal bracket 140B2 in the boundary between the first area LS1 and the fourth area SS2 of the display panel 100. For example, the shortest distance V4 may be greater than the shortest distance V3.

In this instance, the plurality of first longitudinal brackets 140B1 in the third area SS1 of the display panel 100 and the plurality of second longitudinal brackets 140B2 in the fourth area SS2 of the display panel 100 may be alternately disposed.

For example, a first straight line EL1, which passes through the 2-1 longitudinal bracket ① positioned in the fourth area SS2 of the display panel 100 and is vertical to the short side SS of the display panel 100, may not meet a second straight line EL2, which passes through the 1-1 longitudinal bracket ④ positioned in the third area SS1 of the display panel 100 and is vertical to the short side SS of the display panel 100. The first straight line EL1 and the second straight line EL2 may be separated from each other in a direction vertical to the long side LS of the display panel 100. In this instance, the 2-1 longitudinal bracket ① and the 1-1 longitudinal bracket ④ may be considered to be alternately disposed.

In other words, a distance between the 2-1 longitudinal bracket ① and the first long side LS1 of the display panel 100 may be less than a distance between the 1-1 longitudinal bracket ④ and the first long side LS1 of the display panel 100. Further, a distance between the 2-3 longitudinal bracket ③ and the second long side LS2 of the display panel 100 may be greater than a distance between the 1-3 longitudinal bracket ⑥ and the second long side LS2 of the display panel 100. Hence, the light leakage phenomenon may be further reduced.

The plurality of transverse brackets 140A1, the plurality of first longitudinal brackets 140B1, or the plurality of second longitudinal brackets 140B2 may be arranged in zigzag.

Figure 28:
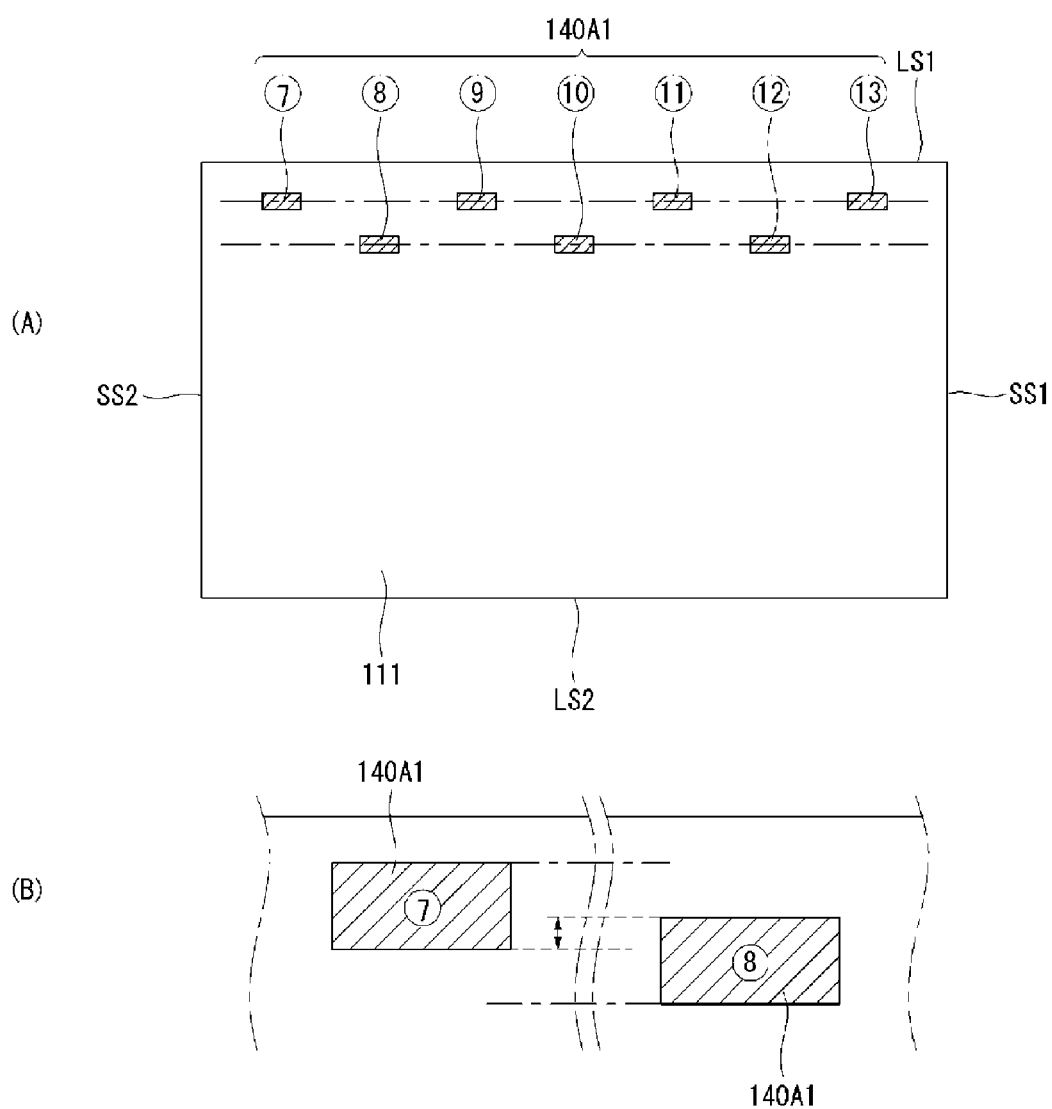

For example, as shown in FIG. 28(A), the plurality of transverse brackets 140A1 (i.e., ⑦, ⑧, ⑨, ⑩, ⑪, ⑫, and ⑬) positioned on the first long side LS1 of the display panel 100 may be arranged in a zigzag pattern.

More specifically, as shown in FIG. 28(B), the first and second transverse brackets ⑦ and ⑧ may partially overlap each other in a direction parallel to the long side LS of the display panel 100.

Figure 29:
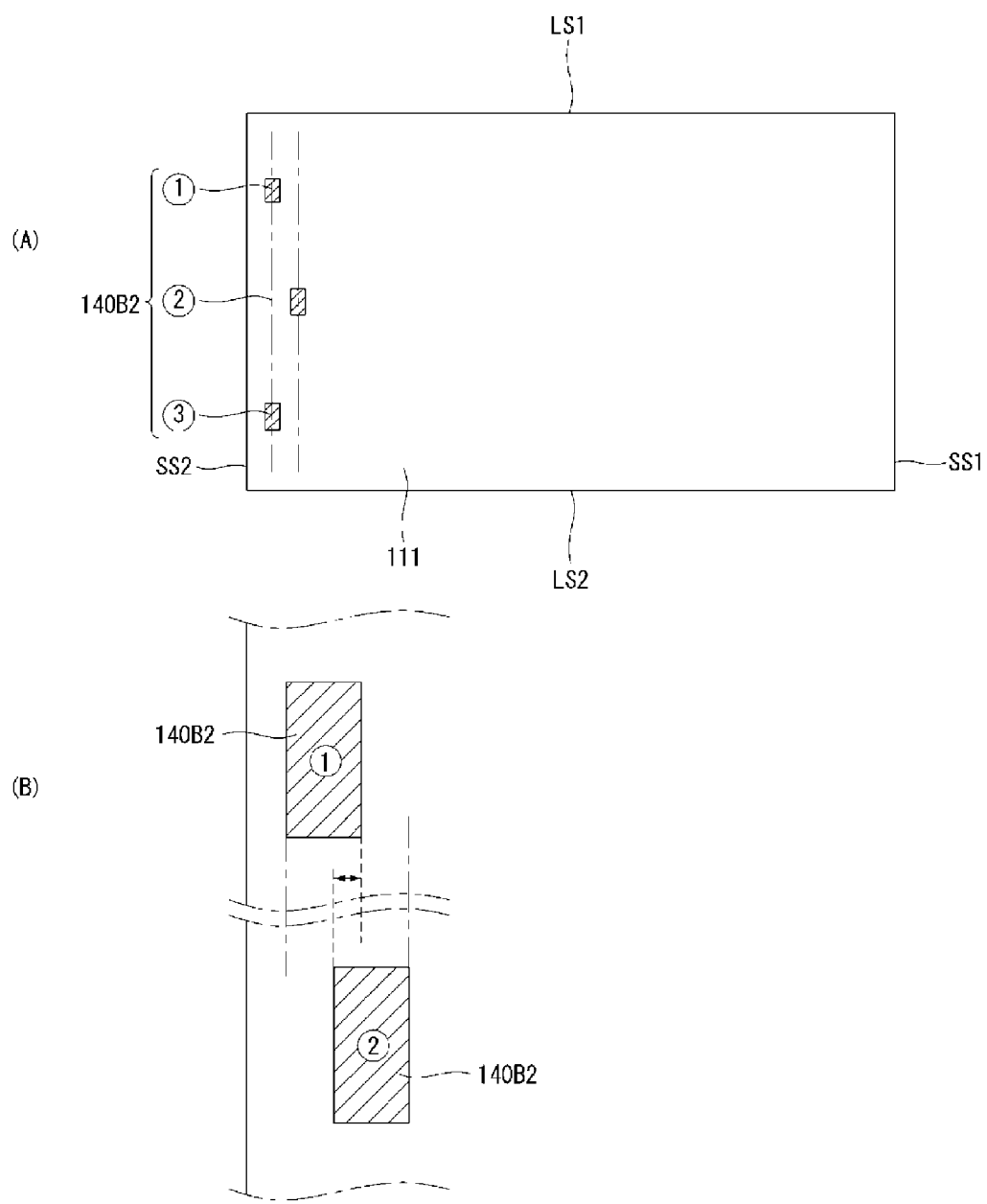

Alternatively, as shown in FIG. 29(A), the plurality of second longitudinal brackets 140B2 (i.e., ①, ②, and ③) positioned on the second short side SS2 of the display panel 100 may be arranged in a zigzag pattern.

More specifically, as shown in FIG. 29(B), the 2-1 and 2-2 longitudinal brackets ① and ② may partially overlap each other in a direction parallel to the short side SS of the display panel 100.

Hereinafter, the display apparatus according to the embodiment of the invention is described in the assumption that the bracket 140 includes the base 1000, the head 1002, and the pillar 1001. The display apparatus according to the embodiment of the invention is not limited to the following structure of the bracket 140.

Figure 30:
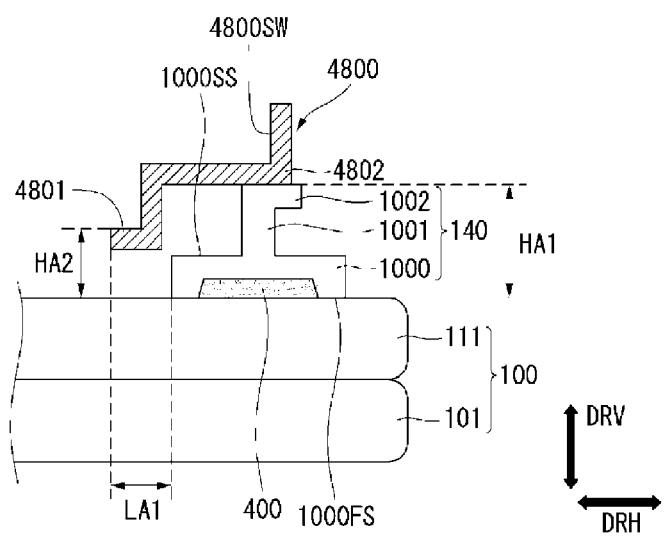

As shown in FIG. 30, an auxiliary bracket 4800 may be disposed on the bracket 140. More specifically, the auxiliary bracket 4800 may be disposed on the head 1002 of the bracket 140. In the embodiment disclosed herein, the bracket 140 may be referred to as a first bracket, and the auxiliary bracket 4800 may be referred to as a second bracket.

Further, the auxiliary bracket 4800 may include a potion 4801 positioned close to the back substrate 111. Hereinafter, the potion 4801 of the auxiliary bracket 4800 is referred to as the low altitude part 4801.

More specifically, when the height of the bracket 140 is measured from the back surface of the back substrate 111, a height HA2 of the low altitude part 4801 of the auxiliary bracket 4800 may be lower than a maximum height HA1 of the bracket 140.

Further, the low altitude part 4801 of the auxiliary bracket 4800 may extend further than the bracket 140 in the middle direction of the display panel 100 by a predetermined distance LA1.

In other word, at least one auxiliary bracket 4800 provided adjacent to the plurality of the brackets 140. And, the at least one auxiliary bracket 4800 includes a side wall 4800SW which extends in parallel with the side wall (not shown) of the at least one connection bracket (not shown). These are described in detail below.

And, the at least one auxiliary bracket 4800 includes a first ledge 4802 and a second ledge 4801 extending in the second direction (i.e., a horizontal direction DRH) and spaced from each other by an extension extending in the third direction (i.e., a vertical direction DRV), the extension being coupled to an end of the first and second ledge 4802, 4801.

In this case, the first ledge 4802 is provided between the second protrusion 1002 and the frame (not shown) and the first ledge contacts the frame. These are described in detail below.

Figure 31:
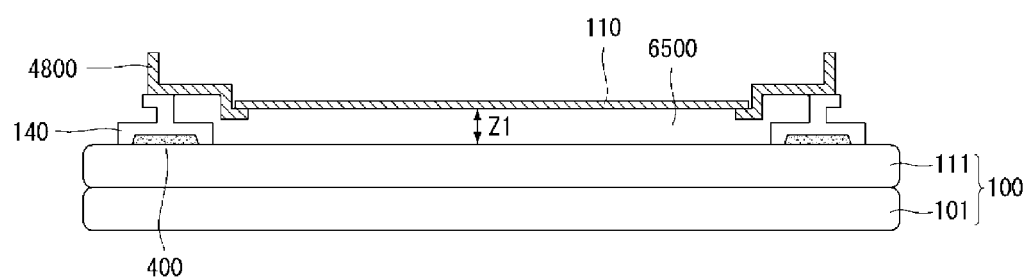

Further, as shown in FIG. 31, the optical layer 110 between the display panel 100 and the back cover may be disposed on the auxiliary bracket 4800. For example, the optical layer 110 may be disposed on the low altitude part 4801 of the auxiliary bracket 4800. In other word, the second ledge 4801 of the auxiliary bracket 4800 is configured to provide support for the back light unit.

The optical layer 110 may not be fixed to the auxiliary bracket 4800 and may be placed on the low altitude part 4801 of the auxiliary bracket 4800. In this instance, the optical layer 110 may move on the auxiliary bracket 4800.

As above, when the optical layer 110 is disposed on the auxiliary bracket 4800, the optical layer 110 may be separated from the back substrate 111 by a predetermined distance Z1. Hence, an air gap 6500 may be formed between the back substrate 111 and the optical layer 110.

As above, when the air gap 6500 is formed between the back substrate 111 and the optical layer 110, the optical characteristics of the display apparatus may be improved by the air gap 6500.

In the embodiment of the invention, the structure and the shape of the auxiliary bracket 4800 may be variously changed.

Figure 32:
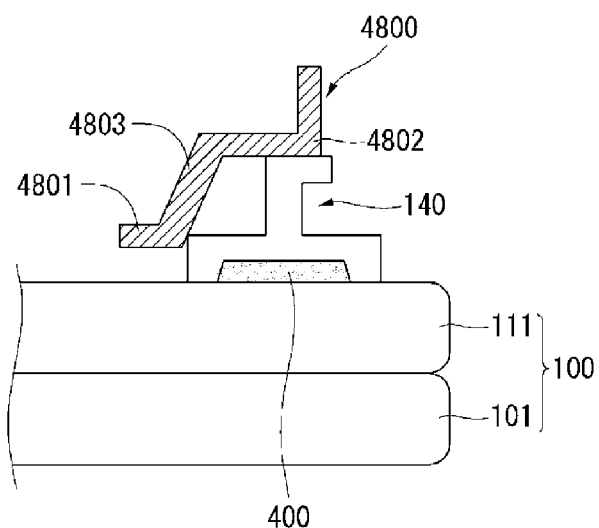

For example, as shown in FIG. 32, the auxiliary bracket 4800 may include the low altitude part 4801, a receiving part 4802 placed on the bracket 140, and a connecting part 4803 for connecting the low altitude part 4801 to the receiving part 4802. The connecting part 4803 may have the shape inclined by a predetermined angle based on the back surface of the back substrate 111.

In this instance, the light block resulting from the auxiliary bracket 4800 may be reduced, and thus the luminance may be improved.

Figure 33:
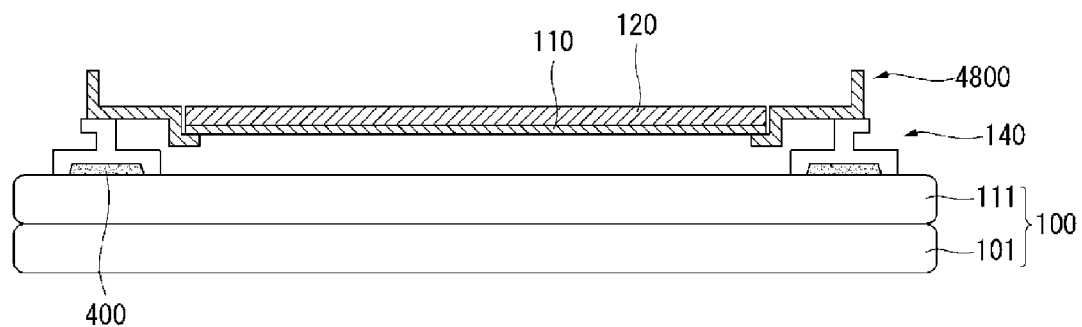

As shown in FIG. 33, the light source 120 may be disposed on the optical layer 110. The light source 120 may be disposed on the low altitude part 4801 of the auxiliary bracket 4800 along with the optical layer 110. In this instance, the light source 120 may be the direct type backlight unit.

Figure 34:
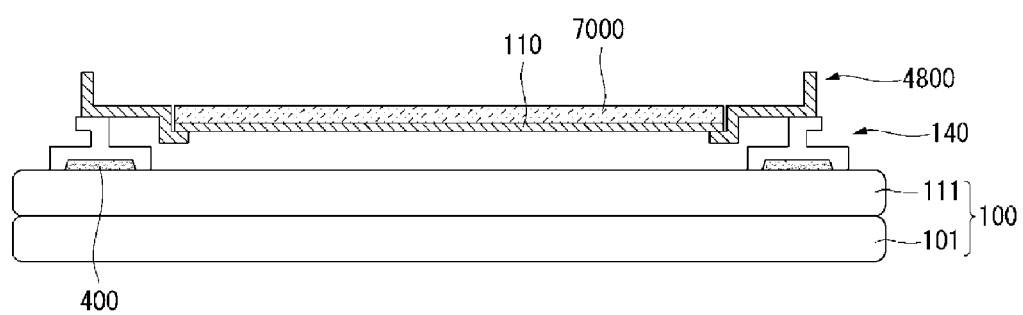

Alternatively, as shown in FIG. 34, a light guide plate 7000 may be disposed on the optical layer 110. In this instance, the backlight unit 10B may be the edge type backlight unit. Further, the edge type backlight unit 10B may include an edge type light source, the optical layer 110, and the light guide plate 7000. When the edge type backlight unit 10B includes the light guide plate 7000, the edge type light source may be disposed on the side of the light guide plate 7000.

As above, the display apparatus according to the embodiment of the invention may include the direct type backlight unit or the edge type backlight unit. In other words, both the direct type backlight unit and the edge type backlight unit may be applied to the embodiment of the invention. In the embodiment of the invention, the edge type backlight unit may be classified into a bottom edge type backlight unit including a bottom edge type light source and a side edge type backlight unit including a side edge type light source.

Figure 35:
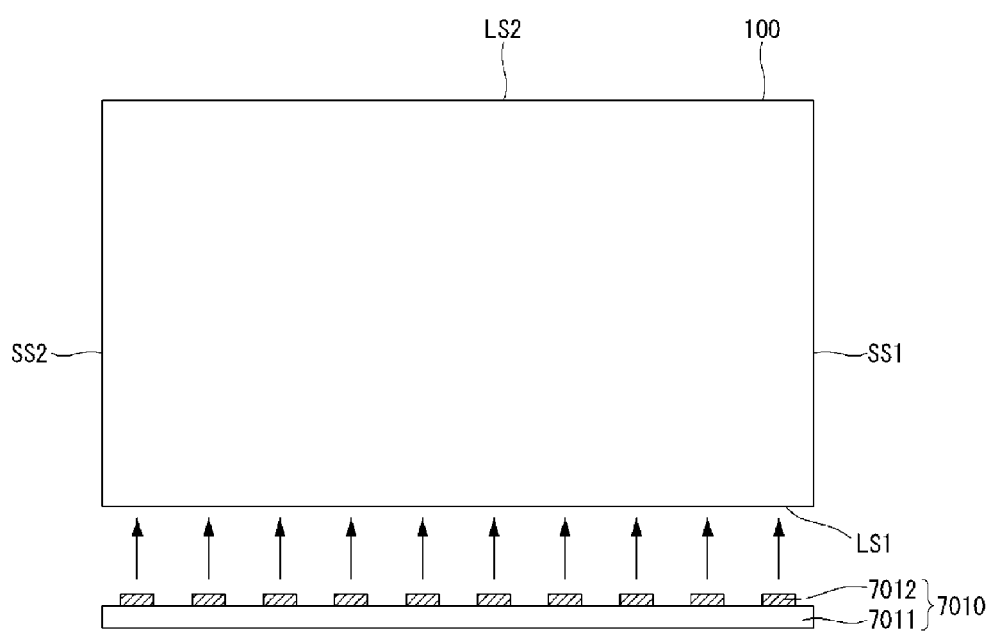

As shown in FIG. 35, a bottom edge type light source 7010 may emit light to the light guide plate 7000 positioned on the long side LS of the display panel 100. For example, the bottom edge type light source 7010 may be positioned on the second long side LS2 corresponding to the lower side among the first and second long sides LS1 and LS2 of the display panel 100.

Figure 36:
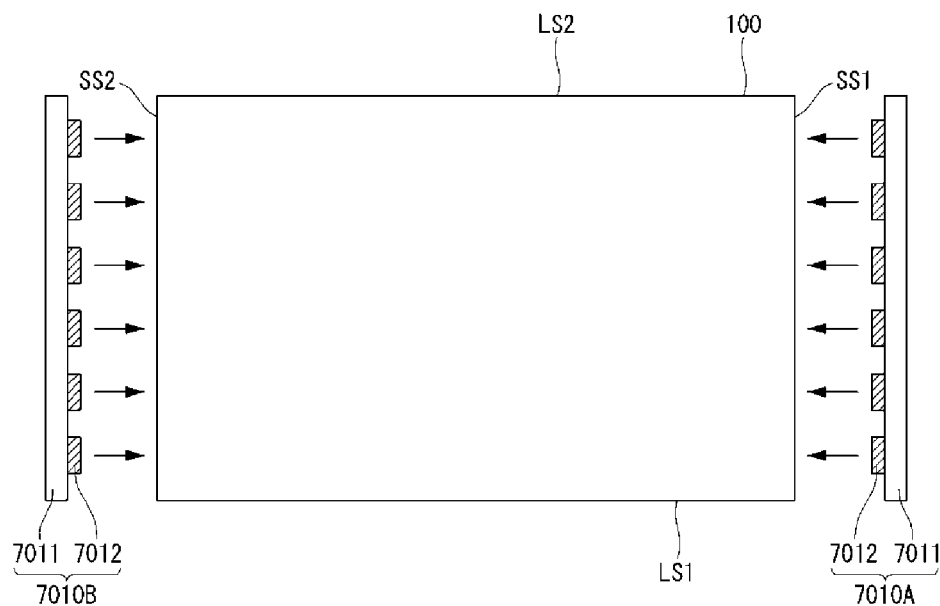

As shown in FIG. 36, a side edge type light source 7010 may emit light to the light guide plate 7000 positioned on the short side SS of the display panel 100. For example, a first side edge type light source 7010A may be positioned on the first short side SS1 of the display panel 100, and a second side edge type light source 7010B may be positioned on the second short side SS2 of the display panel 100.

The edge type backlight unit, which will be described below, may correspond to both the bottom edge type backlight unit and the side edge type backlight unit.

Figure 37:
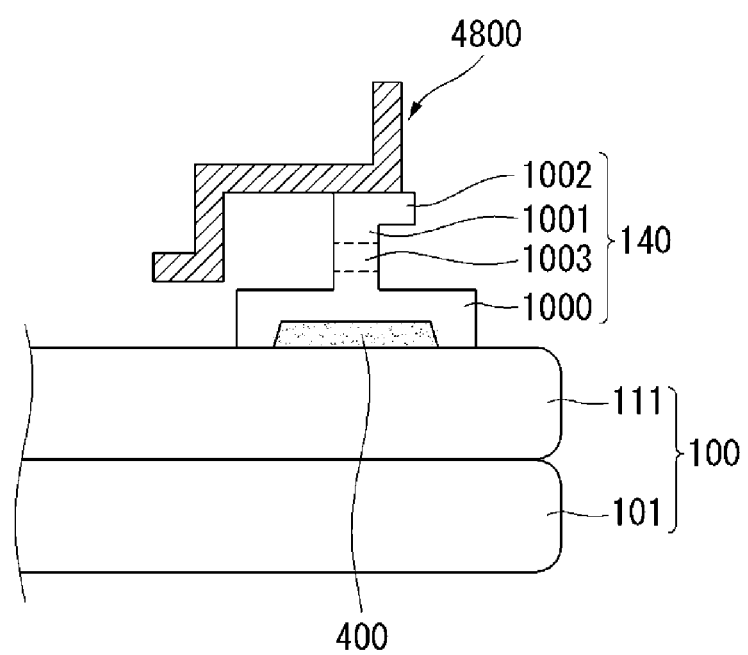

As shown in FIG. 37, a hole (Opening) 1003 may be formed in the bracket 140.

As shown in FIG. 38(a), a connection frame 5000 may be connected to the bracket 140 through the hole 1003. The connection frame 5000 may not be fixed to the bracket 140, and a portion of the connection frame 5000 may be inserted into the hole 1003 of the bracket 140. Hence, an external pressure, for example, a twist transferred to the connection frame 5000 may be prevented from being transferred to the display panel 100 through the bracket 140, and the light leakage phenomenon may be further reduced.

In this case, auxiliary bracket 4800 provided adjacent to the plurality of the brackets 140 and attached to the at least one connection frame 5000.

In other word, the connection frame 5000 having a side wall and a plurality of first tab portions extending in the second direction (i.e., a horizontal direction DRH), the first tab portion being provided into the opening 1003 of the of the first protrusion of the bracket 140.

In this case, a width STA1 of the first tab portion is greater than a width STA2 of the second protrusion of the bracket 140 in the second direction such that an end of the first tab portion extends through the opening 1003 of the first protrusion of the bracket 140.

Alternatively, as shown in FIG. 38(b), a groove 1004 may be formed in the bracket 140. The groove 1004 may be provided between the head 1002 and the base 1000 of the bracket 140. Further, a portion of the connection frame 5000 may be inserted into the groove 1004 of the bracket 140. Even in this case, the movement of the connection frame 5000 may be sufficiently controlled.

The connection frame 5000 may be connected to the auxiliary bracket 4800. The connection frame 5000 may be referred to as the connection bracket.

Figure 39:
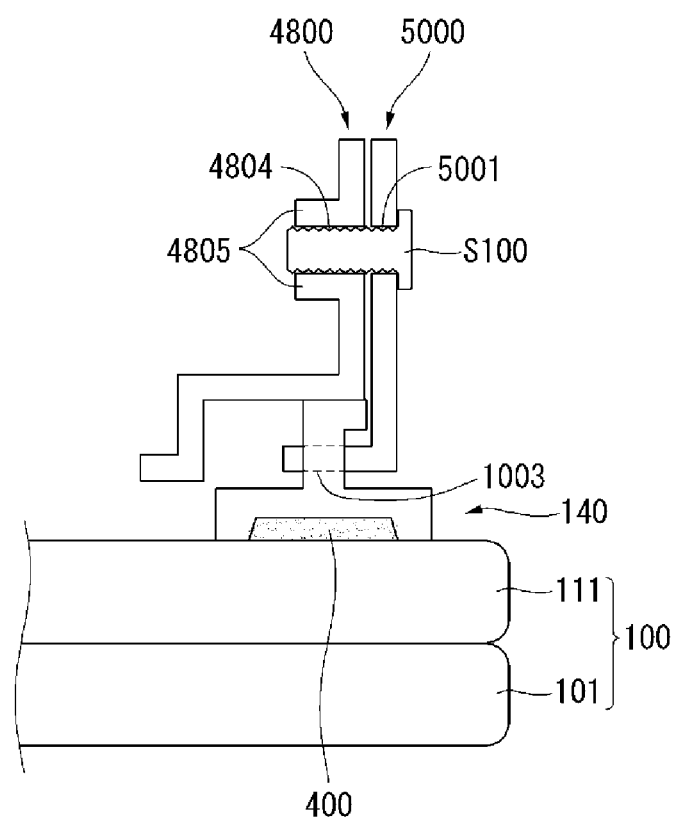

For example, as shown in FIG. 39, a hole 5001 may be formed in the connection frame 5000, and a hole 4804 corresponding to the hole 5001 of the connection frame 5000 may be formed in the auxiliary bracket 4800. A fastening member S100 such as a screw may connect the connection frame 5000 to the auxiliary bracket 4800 through the hole 5001 of the connection frame 5000 and the hole 4804 of the auxiliary bracket 4800. In other words, the connection frame 5000 may include a first portion 5003 inserted into a hole (or a groove) 1003 of the bracket 140 and a second portion 5004 fastening to the auxiliary bracket 4800. The first portion 5003 of the connection frame 5000 may be a horizontal portion, and the second portion 5004 of the connection frame 5000 may be a vertical portion.

A protrusion 4805 protruding in the direction toward the middle of the display panel 100 may be formed around the hole 4804 of the auxiliary bracket 4800.

Alternatively, the connection frame 5000 may be connected to the auxiliary bracket 4800 without the fastening member such as the screw.

Figure 40:
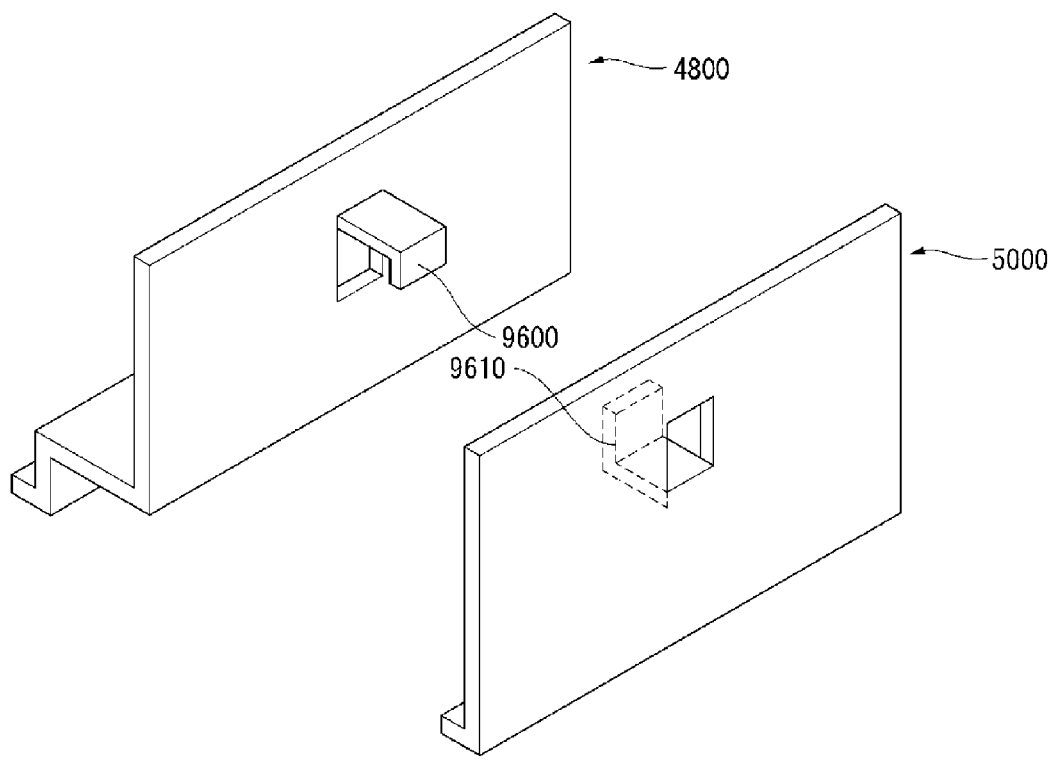

For example, as shown in FIG. 40, a first hook 9600 protruding in the direction away from the display panel 100 may formed in the auxiliary bracket 4800. A second hook 9610 protruding in the direction toward the middle of the display panel 100 may formed at a location corresponding to the first hook 9600 in the connection frame 5000.

The sheet metal processing may be performed on a portion of the auxiliary bracket 4800 to form the first hook 9600. The sheet metal processing may be performed on a portion of the connection frame 5000 to form the second hook 9610.

Figure 41:
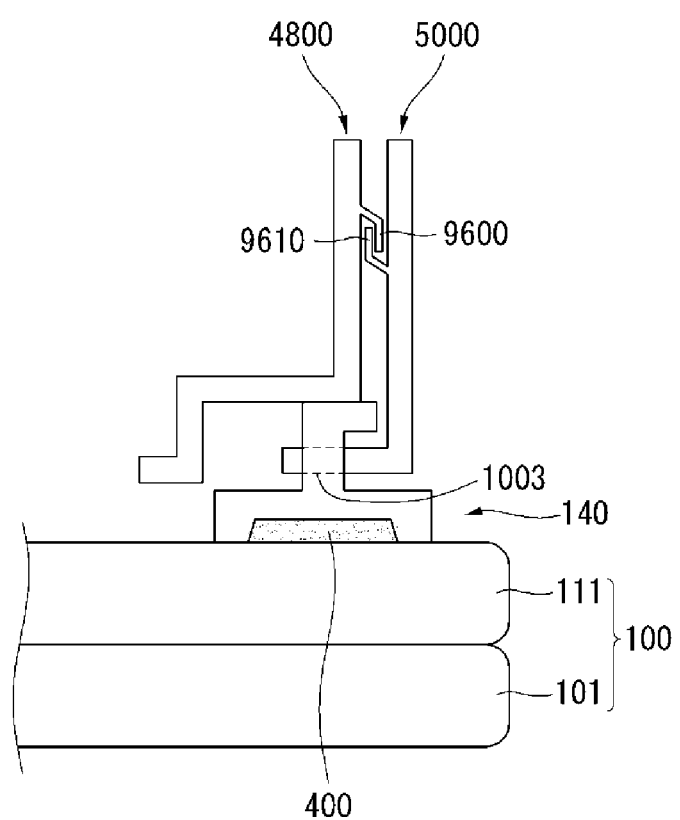

As shown in FIG. 41, when the first hook 9600 is interlocked with the second hook 9610, the auxiliary bracket 4800 and the connection frame 5000 may be connected to each other. In this instance, because the connection frame 5000 is not fixed to the auxiliary bracket 4800, an external pressure such as a twist applied to the auxiliary bracket 4800 may be prevented from being transferred to the display panel 100 through the auxiliary bracket 4800 and the connection frame 5000. Hence, the light leakage phenomenon may be further reduced.

Figure 42:
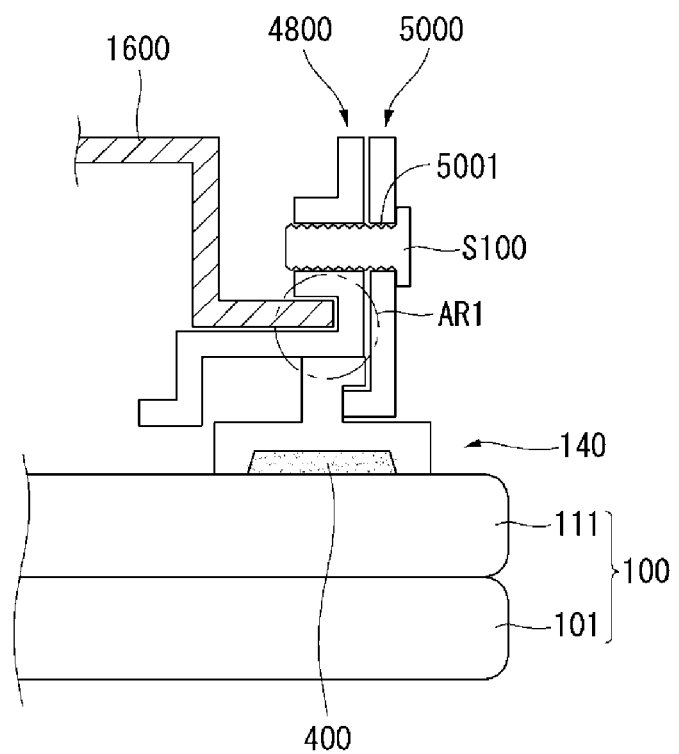

A frame 1600 may be disposed between the back cover 130 and the display panel 100. As shown in FIG. 42, the frame 1600 may include a portion positioned on the auxiliary bracket 4800. In the embodiment disclosed herein, the frame 1600 may be a frame included in the backlight unit or a frame separate from the backlight.

As shown in FIG. 42, an end of the frame 1600 in a first area AR1 may be positioned on the auxiliary bracket 4800, and a portion of the frame 1600 may contact the auxiliary bracket 4800. In other word, the frame 1600 mounted to the at least one auxiliary bracket 4800.

The end of the frame 1600 may be inserted into a formation portion of the protrusion 4805 of the auxiliary bracket 4800. In this instance, a fixing strength of the frame 1600 may be improved.

Figure 43:
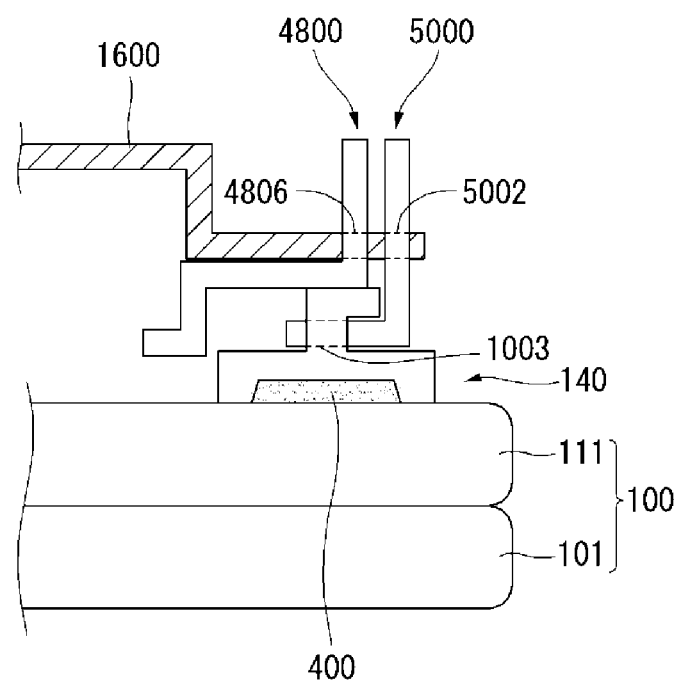

Alternatively, as shown in FIG. 43, a hole 4806 corresponding to the frame 1600 may be formed in the auxiliary bracket 4800, and a hole 5002 corresponding to the frame 1600 may be formed in the connection frame 5000.

In the structure illustrated in FIG. 43, the frame 1600 may be fixed by inserting the end of the frame 1600 into the hole 4806 of the auxiliary bracket 4800 and the hole 5002 of the connection frame 5000.

Figure 44:
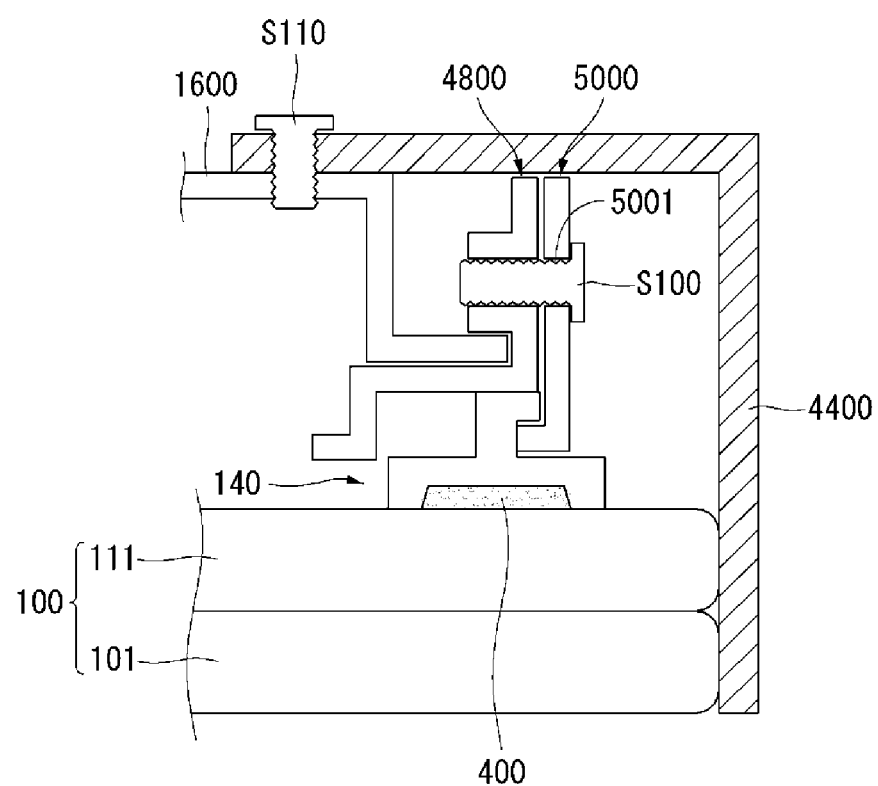

As shown in FIG. 44, a side cover 4400 including a portion positioned on the side of the display panel 100 may be connected to the frame 1600. In other word, the side cover 4400 provided adjacent to sides of the front and back substrate 101, 111.

For example, a predetermined fastening member S110 such as a screw may connect the frame 1600 to the side cover 4400.

The side cover 4400 may prevent a foreign material such as dust from being penetrated into the display apparatus and may protect the side of the display panel 100 from a damage.

Figure 45:
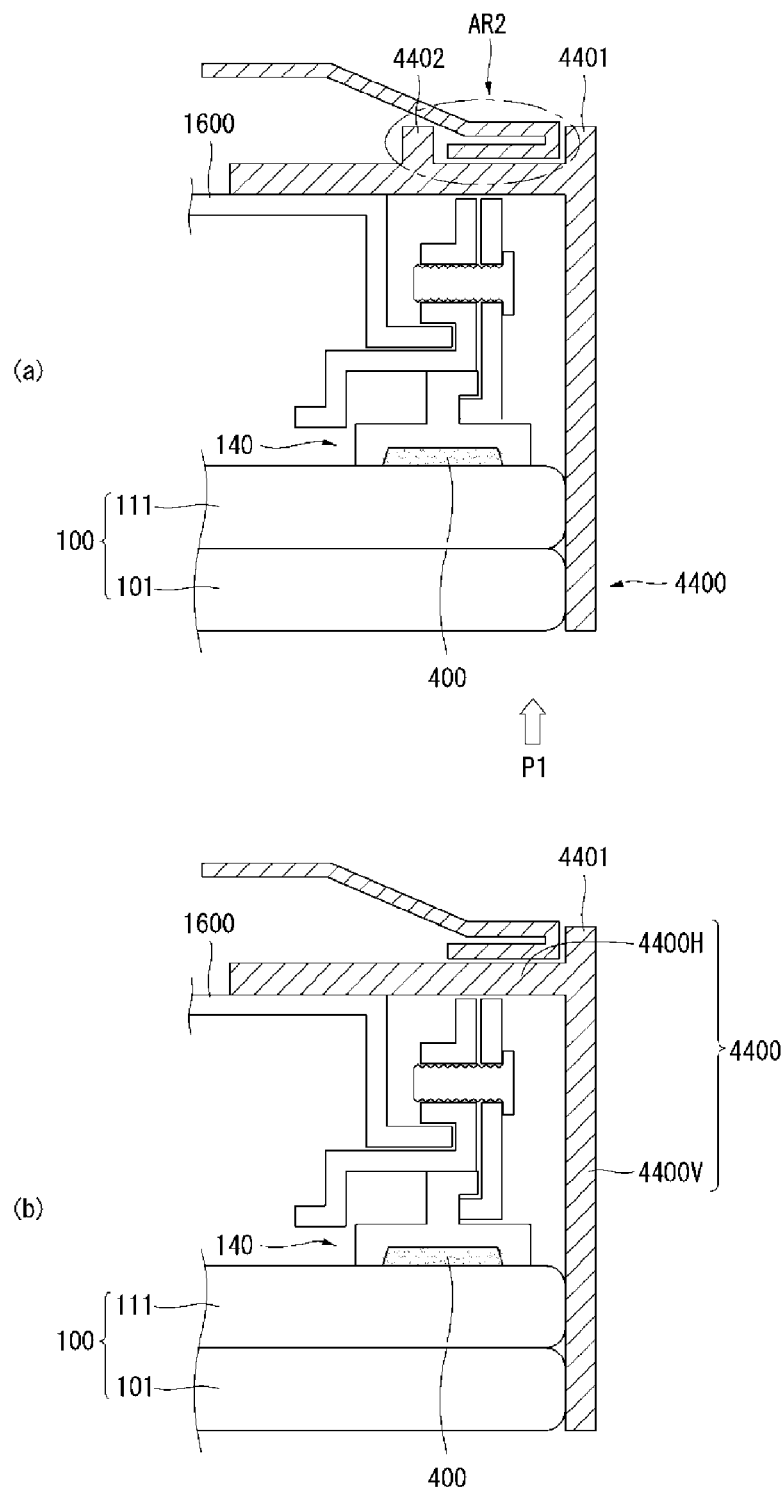

As shown in FIG. 45, the back cover 130 is disposed in the rear of the display panel 100 and may be connected to the side cover 4400. In other word, the back cover 130 is provided on the side cover 4400.

For example, as shown in FIG. 45 (A), the side cover 4400 may include first protrusion 4401 and second protrusion 4402 protruding in the direction toward the rear of the display panel 100. An end of the back cover 130 may be inserted between the first protrusion 4401 and the second protrusion 4402 as indicated in a second area AR2.

A portion of the side cover 4400 may extend in the direction toward the middle of the display panel 100, so as to more efficiently fix the side cover 4400. As shown in FIG. 45 (A), (B), the side cover 4400 may include a portion extending further than the bracket 140 in the direction toward the middle of the display panel 100.

In this instance, the side cover 4400 may include a portion positioned between the back cover 130 and the display panel 100 in a width direction (i.e., a vertical direction) of the display panel 100.

Alternatively, as shown in FIG. 45 (B), the second protrusion 4402 may be omitted from the side cover 4400. In this case, the first protrusion 4401 may support the back cover 130 sufficiently.

As above, an edge of the front surface of the display panel 100 may be exposed in a state where the back cover 130 is connected to the side cover 4400. The exposure of the edge of the front surface of the display panel 100 may indicate that an edge of a front surface of the front polarizing film 3400 attached to the front substrate 101 is exposed. Alternatively, the exposure of the edge of the front surface of the display panel 100 may indicate that an edge of the front surface of the front substrate 101 is exposed.

In this instance, when the observer in the front of the display panel 100 (i.e., at a first position P1) views the display panel 100, the observer may observe almost the entire area of the display panel 100. Hence, an attractive appearance of the display panel 100 may be provided. Further, because another edge of the side of the display panel 100 may not be showed to the observer, a visual effect, in which the observer may feel that the screen size of the display panel 100 is greater than the real screen size of the display panel 100, may be obtained.

In other word, the side cover 4400 includes a sidewall 4400V and an overhang portion 4400H extending in a second direction (i.e., a horizontal direction DRH), a first end portion of the sidewall 4400V covers the sides of the front and back substrates 101, 111. And, the overhang portion 4400H being provide at the second end portion, which opposite from the first end portion, and the overhang portion being space from an end of the sidewall 4400V by a prescribed distance in the third direction (i.e., a vertical direction DRV) such that the side cover 4400 provides a rim for a back cover 130.

Figure 46:

As shown in FIG. 46, a protective layer 4500 may be formed on the side of the display panel 100. The protective layer 4500 may protect the side of the front substrate 101 and the side of the back substrate 111 from an external pressure and an impact.

The protective layer 4500 may contain a substantially transparent material. Further, the protective layer 4500 may contain a photocurable material cured by light such as ultraviolet rays.

Figure 47:
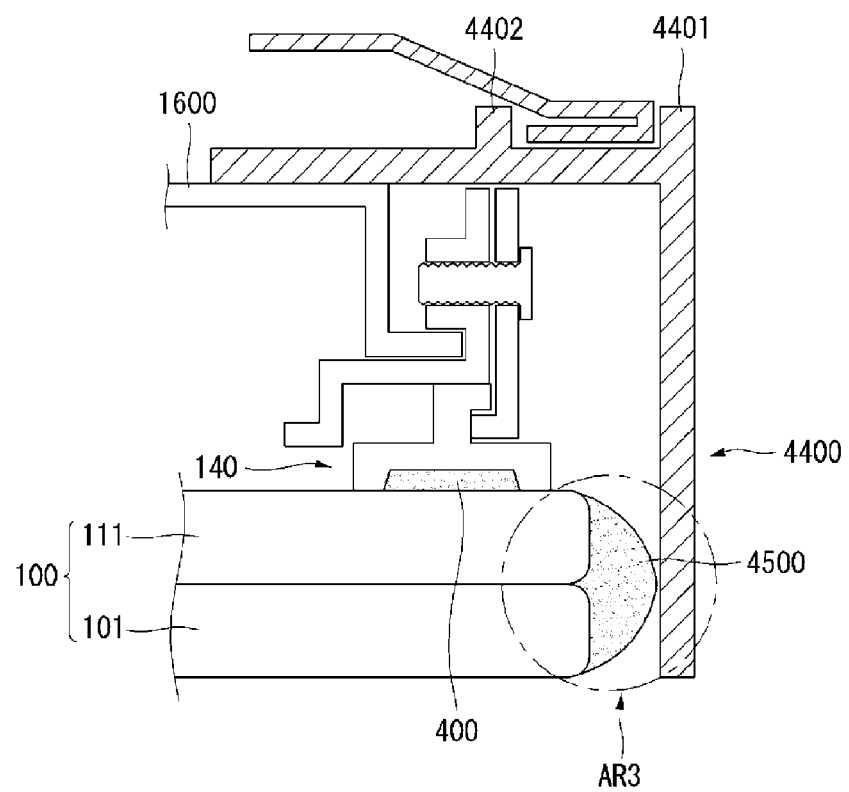

As above, when the protective layer 4500 is formed on the side of the display panel 100, the protective layer 4500 may be considered to be positioned between the side cover 4400 and the display panel 100 as indicated in a third area AR3 of FIG. 47. Hence, a collision between the side cover 4400 and the side of the display panel 100 may be prevented.

The protective layer 4500 is described in detail below with reference to FIG. 48.

The protective layer 4500 may be formed by coating a protective material having the flexibility on the side of the display panel 100 and curing the coated protective material using light such as ultraviolet rays.

Figure 48:
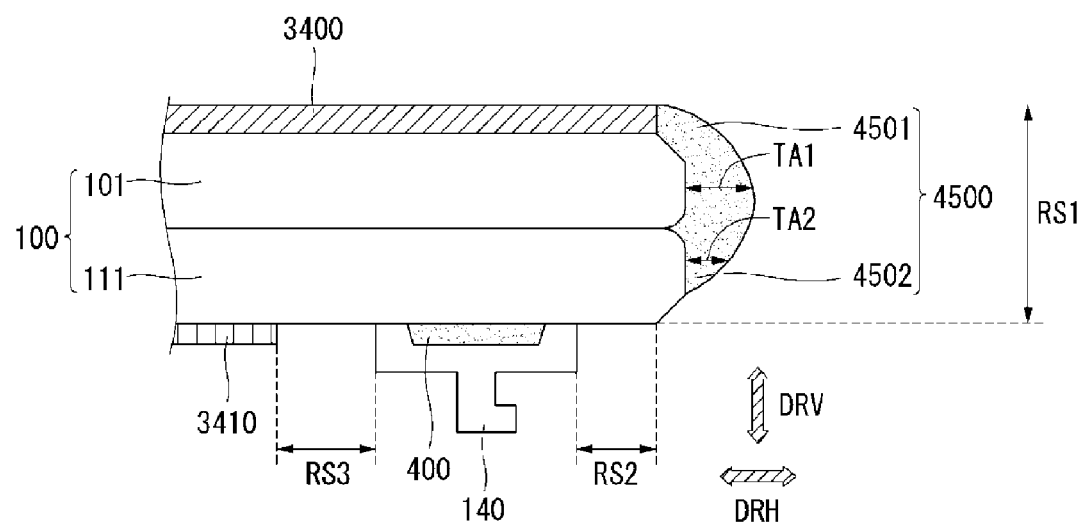

As shown in FIG. 48, the protective layer 4500 may be inclined in the direction of the front substrate 101. The protective layer 4500 may include a first protective part 4501 contacting the front substrate 101 and a second protective part 4502 contacting the back substrate 111. A thickness TA1 of the first protective part 4501 may be greater than a thickness TA2 of the second protective part 4502 in a longitudinal direction (i.e., a horizontal direction DRH) of the display panel 100. In other words, the maximum thickness TA1 of the first protective part 4501 may be greater than the maximum thickness TA2 of the second protective part 4502 in the longitudinal direction DRH of the display panel 100.

Further, the first protective part 4501 of the protective layer 4500 may contact the front polarizing film 3400 positioned in the front of the front substrate 101. In this instance, an adhesive strength of the protective layer 4500 may increase. On the other hand, the second protective part 4502 of the protective layer 4500 may not contact the back polarizing film 3410 attached to the back surface of the back substrate 111 and may be separated from the back polarizing film 3410 by a predetermined distance.

A length RS1 of the protective layer 4500 in a width direction (i.e., a vertical direction DRV) of the display panel 100 may be greater than the maximum thickness TA1 of the protective layer 4500 in the longitudinal direction DRH of the display panel 100, so as to improve the structural stability of the protective layer 4500 and to easily manufacture the protective layer 4500.

The protective layer 4500 may be separated from the bracket 140 by a predetermined distance RS2, so as to prevent a reduction in the adhesive strength between the bracket 140 and the back substrate 111. On the other hand, when the distance RS2 between the protective layer 4500 and the bracket 140 is excessively wide, the size of the dummy area, on which the image is not displayed, may increase. Considering this, it may be preferable that the protective layer 4500 is separated from the bracket 140 by the sufficient small distance RS2. It may be preferable that the distance RS2 between the protective layer 4500 and the bracket 140 is less than a distance RS3 between the back polarizing film 3410 and the bracket 140. Further, it may be preferable that the distance RS2 between the protective layer 4500 and the bracket 140 is less than the length RS1 of the protective layer 4500 in the width direction DRV of the display panel 100.

Figure 49:
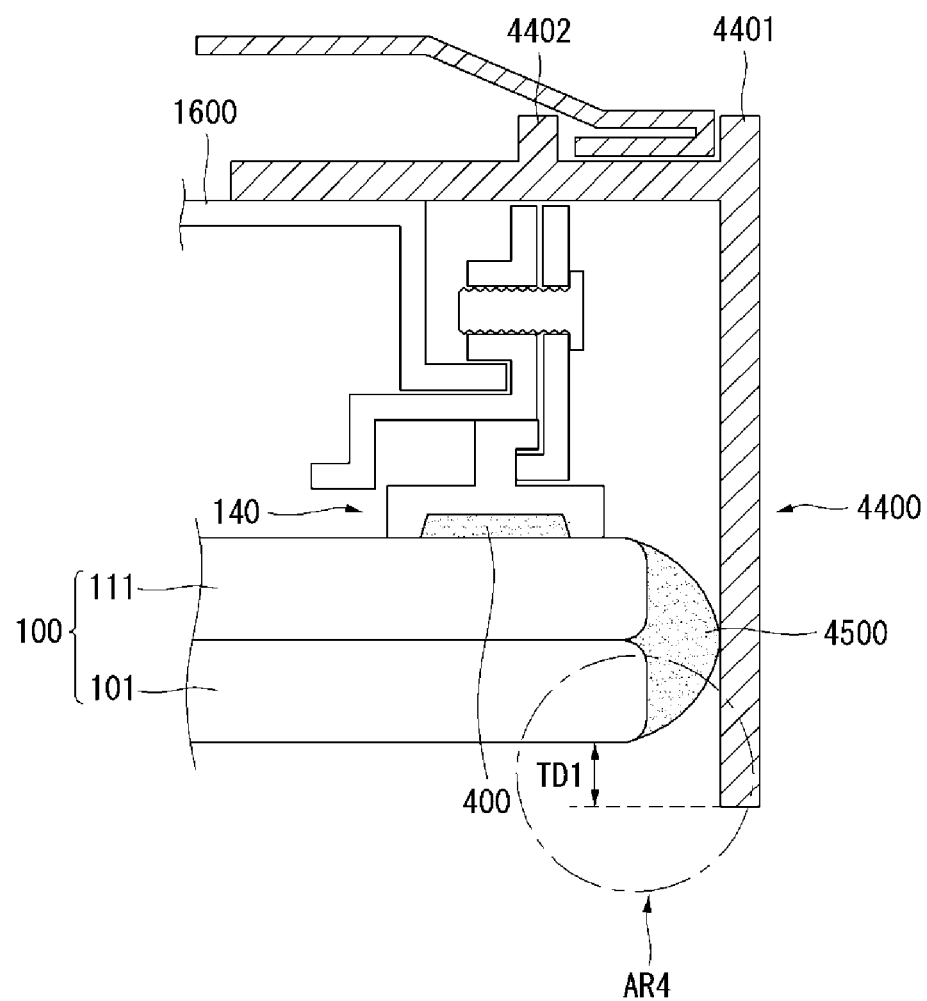

As shown in FIG. 49, the side cover 4400 may include a portion extending further than the front substrate 101 by a predetermined distance TD1 in the front direction of the front substrate 101 as indicated in a fourth area AR4. In other words, the side cover 4400 may include a portion protruding further than the front substrate 101 in the front of the display panel 100. Even in this case, the edge of the front surface of the front substrate 101 may be exposed.

As above, when the side cover 4400 protrudes further than the front substrate 101, the side cover 4400 may protect more efficiently the front substrate 101.

When the size of the portion of the side cover 4400 protruding further than the front substrate 101 is excessively large, the entire thickness of the display apparatus may excessively increase. Therefore, it may be preferable that a length TD1 of the portion of the side cover 4400 protruding further than the front substrate 101 is properly adjusted. This is described in detail below with reference to FIG. 50.

Figure 50:
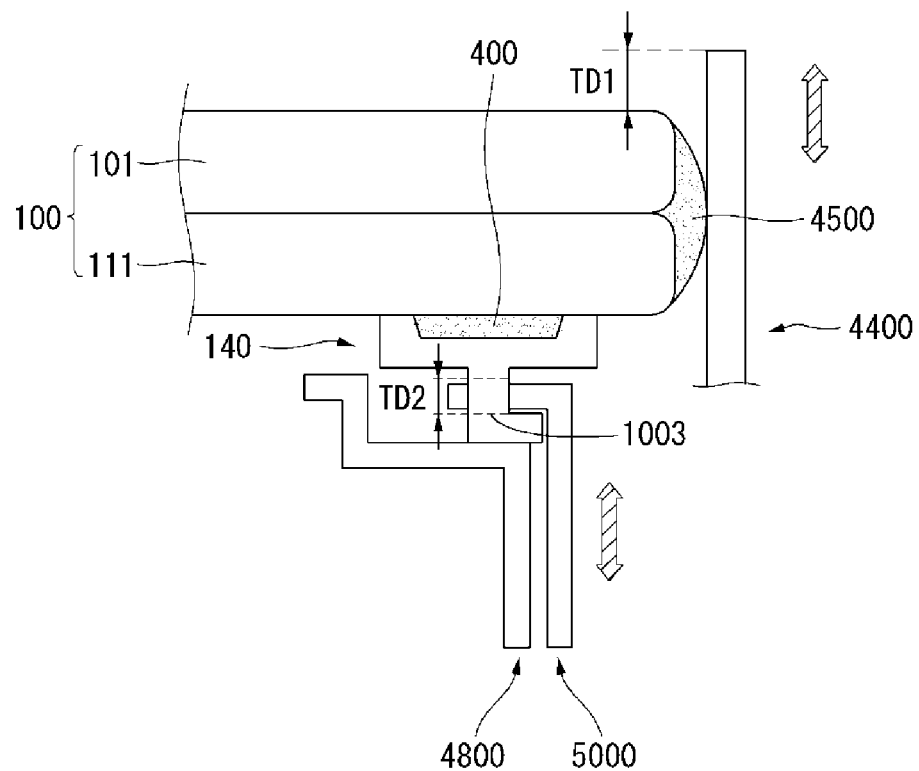

As shown in FIG. 50, a hole 1003 corresponding to the connection frame 5000 may be formed in the bracket 140. Further, the end of the connection frame 5000 may be inserted into the hole 1003 of the bracket 140. This was described in detail above with reference to FIG. 38.

In the structure illustrated in FIG. 50, the end of the connection frame 5000 may move inside the hole 1003 of the bracket 140 in the vertical direction.

If the end of the connection frame 5000 moves upward inside the hole 1003 of the bracket 140, the side cover 4400 connected to the connection frame 5000 may move upward. Hence, the length TD1 of the portion of the side cover 4400 protruding further than the front substrate 101 may increase.

On the other hand, if the end of the connection frame 5000 moves downward inside the hole 1003 of the bracket 140, the side cover 4400 connected to the connection frame 5000 may move downward. Hence, the length TD1 of the portion of the side cover 4400 protruding further than the front substrate 101 may decrease.

Considering this, even when the bent end of the connection frame 5000 is closely attached to the bracket 140 inside the hole 1003 of the bracket 140 in the direction away from the display panel 100, the side cover 4400 may include the portion protruding further than the front substrate 101 irrespective of the movement of the end of the connection frame 5000.

Alternatively, when the length TD1 of the portion of the side cover 4400 protruding further than the front substrate 101 is set to be greater than a width TD2 of the hole 1003 of the bracket 140 in the vertical direction, the side cover 4400 may include the portion protruding further than the front substrate 101 irrespective of the movement of the end of the connection frame 5000.

In a cross section taken along a straight line CSL1 passing through the first and second short sides SS1 and SS2 of the display panel 100 as shown in FIG. 51(A), as shown in FIG. 51(B), the side cover 4400 may be disposed at each of both ends of the display apparatus, and the back cover 130 may be disposed in the rear of the display panel 100.

Figure 51:
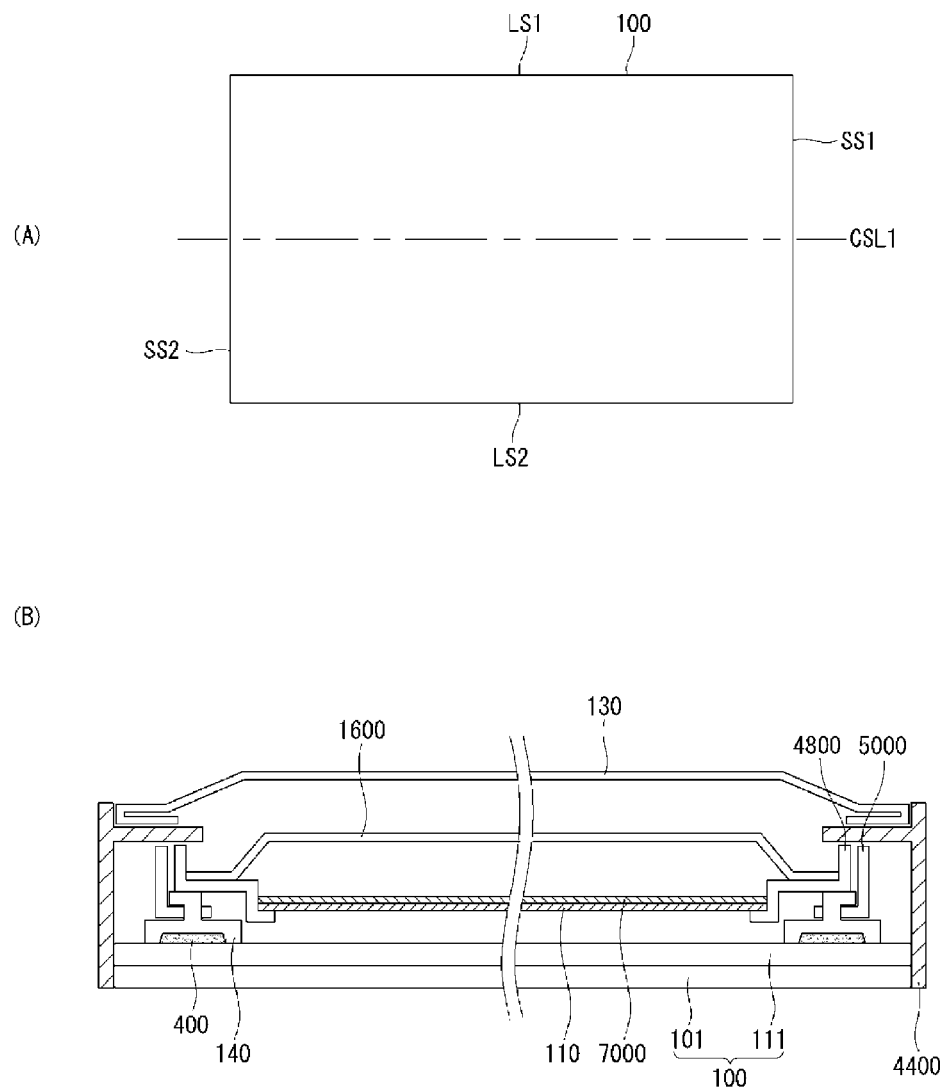

FIG. 51 is a schematic cross-sectional view of the display apparatus according to the embodiment of the invention in the vertical direction.

The structure and the shape of the frame 1600 may be variously changed. Other structure of the frame 1600 is described below with reference to FIGS. 52 and 53.

Figure 52:
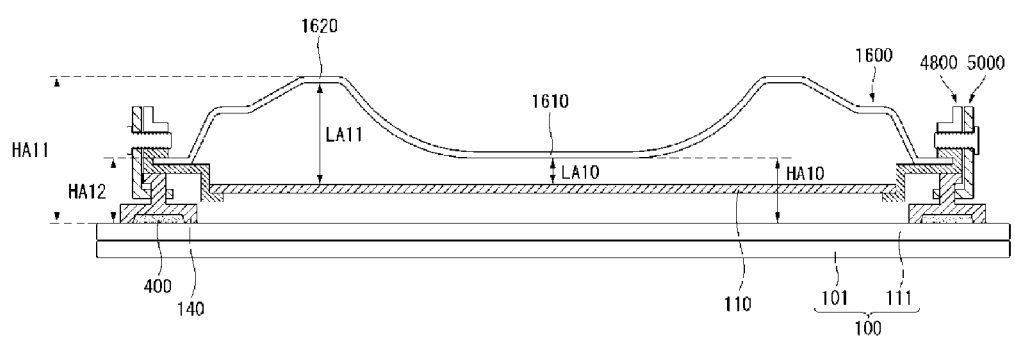

As shown in FIG. 52, a middle portion 1610 of the frame 1600 may be depressed in the direction toward the display panel 100.

The frame 1600 may include a protrusion frame 1620 positioned between an end of the frame 1600 and the depressed middle portion 1610 of the frame 1600. A height HA11 of the protrusion frame 1620 may be greater than a height HA12 of the end of the frame 1600 as measured from the back surface of the back substrate 111. The end of the frame 1600 may overlap the bracket 140 in the width direction (i.e., the vertical direction) of the display panel 100. Further, a height HA10 of the middle portion 1610 of the frame 1600 may be less than the height HA11 of the protrusion frame 1620 of the frame 1600 as measured from the back surface of the back substrate 111.

As above, when the middle portion 1610 of the frame 1600 is depressed in the direction toward the display panel 100, the entire length of the frame 1600 may increase. Hence, rigidity of the frame 1600 may be improved, and an increase in the total thickness of the display apparatus may be prevented.

Figure 53:
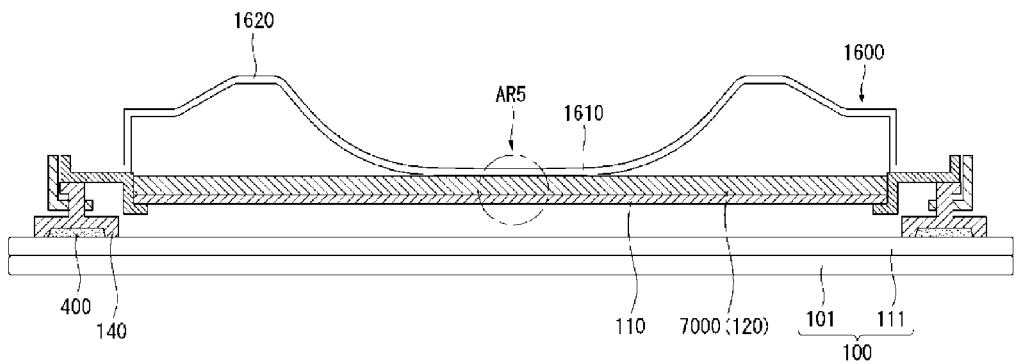

Further, when the middle portion 1610 of the frame 1600 is depressed, the middle portion 1610 may contact the light guide plate 7000 positioned between the optical layer 110 and the frame 1600 as indicated in a fifth area AR5 shown in FIG. 53. If the direct type backlight unit 120 is used, the middle portion 1610 of the frame 1600 may contact the direct type backlight unit 120. In this instance, the structural reliability of the display apparatus may be improved.

The structure and the shape of the side cover 4400 may be variously changed. Other structure of the side cover 4400 is described below.

Hereinafter, it is assumed that the transverse bracket 140A is attached to the first long side LS1 of the back surface of the back substrate 111, and the first and second longitudinal brackets 140B1 and 140B2 are respectively attached to the first and second short sides SS1 and SS2 of the back surface of the back substrate 111.

Figure 54:
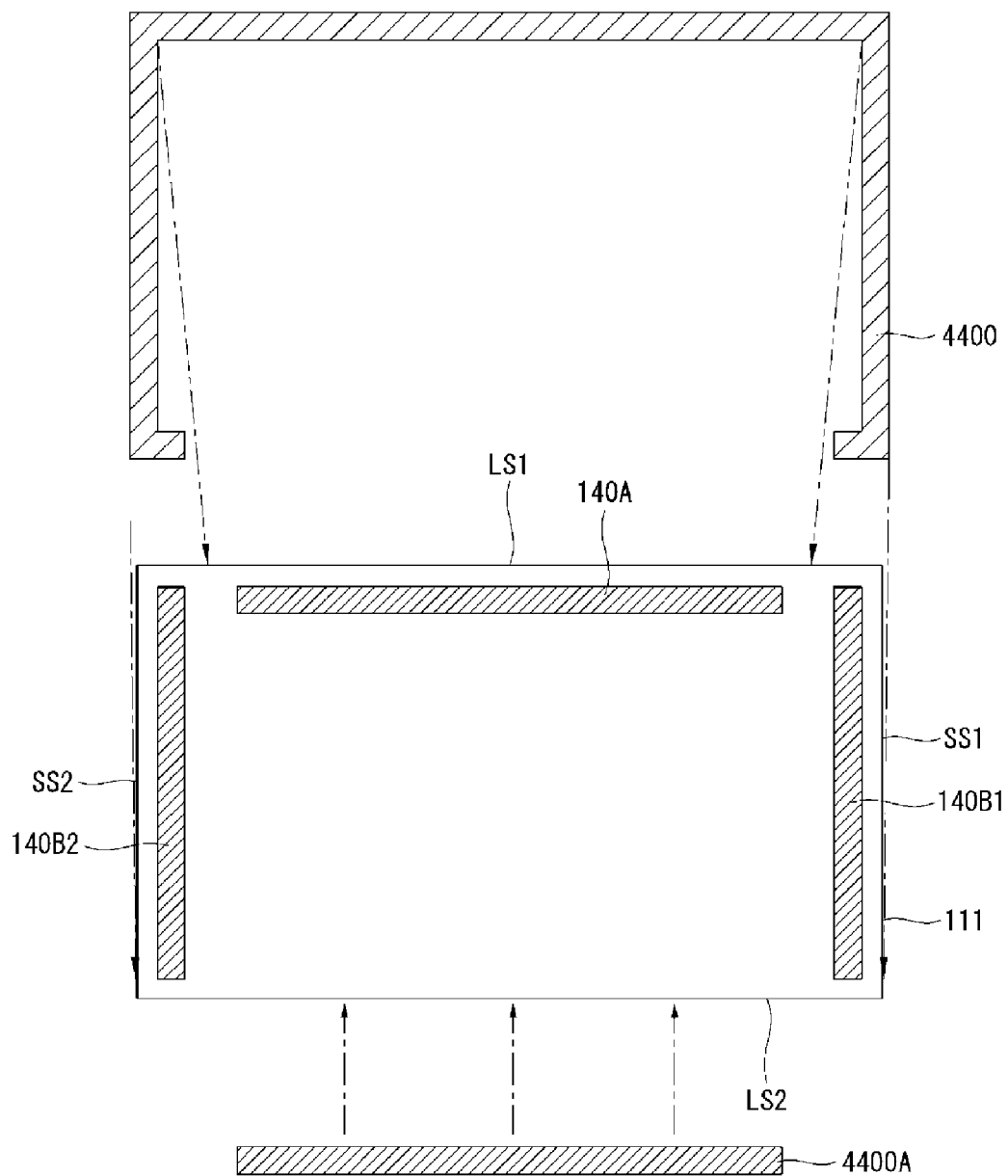

As shown in FIG. 54, the side cover 4400 may have the structure corresponding to the transverse bracket 140A and the first and second longitudinal brackets 140B1 and 140B2. Hence, the side cover 4400 may have the structure in which one side of the side cover 4400 is open. In other words, the side cover 4400 may have the structure in which one side of the side cover 4400 corresponding to the second long side LS2 of the back substrate 111 is open.

Further, an auxiliary side cover 4400A may be disposed on the second long side LS2 of the back substrate 111.

Figure 55:
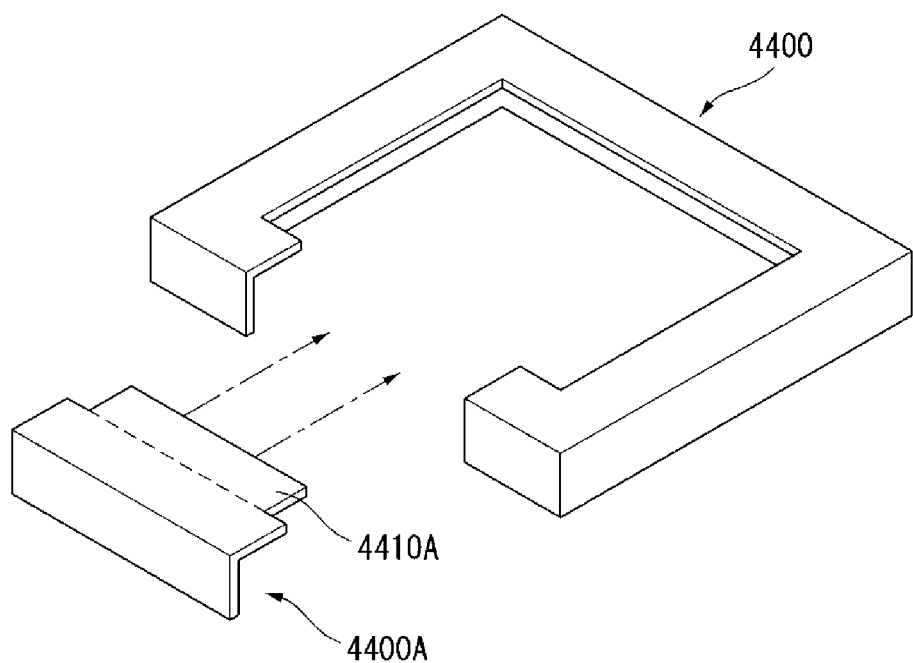

As shown in FIG. 55, the auxiliary side cover 4400A may be positioned at a location corresponding to the opened side of the side cover 4400 and may be coupled with the side cover 4400. The auxiliary side cover 4400A may include an additional part 4410A to dispose other devices such as a speaker (not shown) and an electronic receiver (not shown).

A method for combining the auxiliary side cover 4400A with the side cover 4400 is described below.

Figure 56:
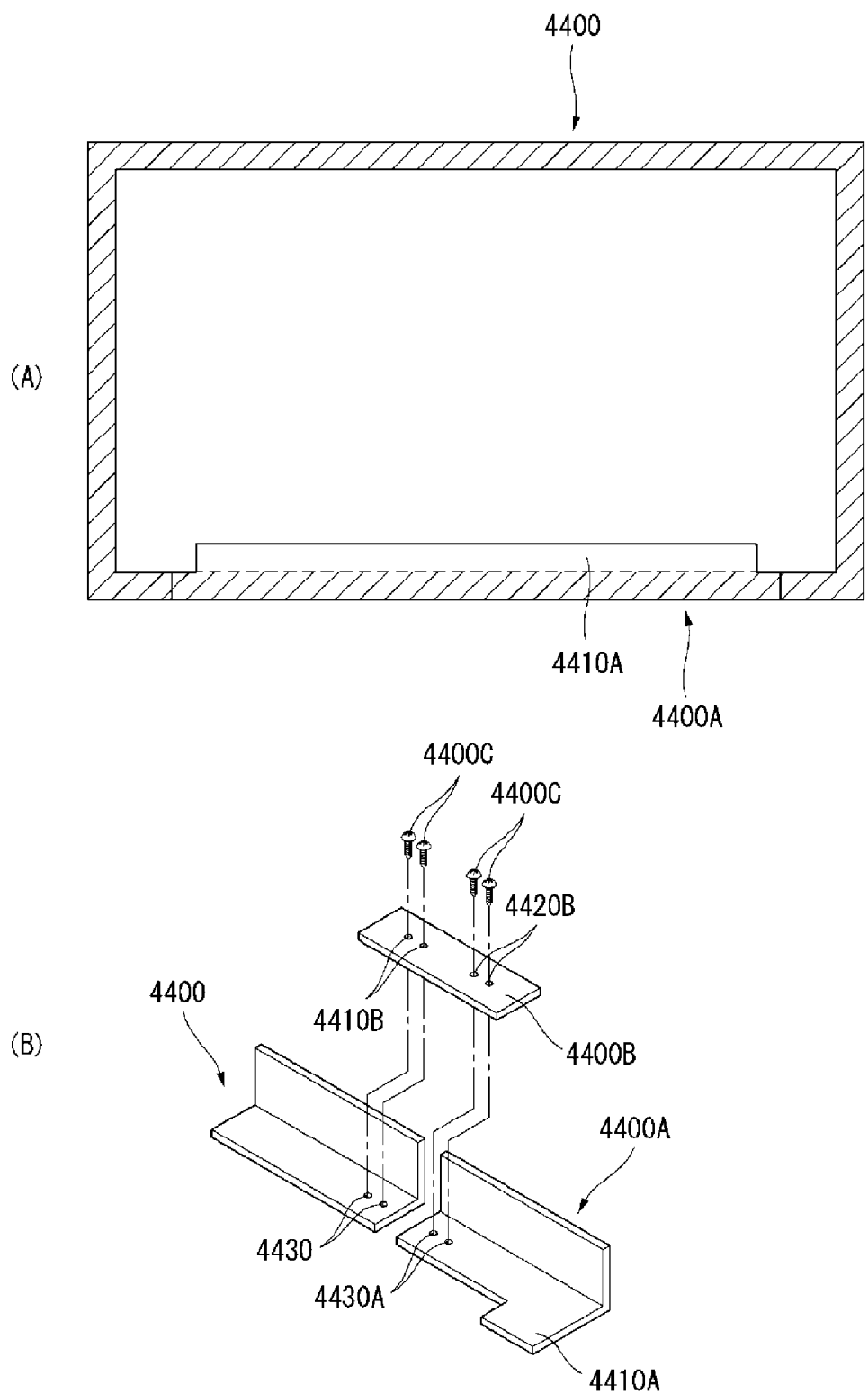

As shown in FIG. 56, the side cover 4400 may have first connection holes 4430, and the auxiliary side cover 4400A may have second connection holes 4430A. Further, a connection bar 4400B may have third connection holes 4410B respectively corresponding to the first connection holes 4430 and fourth connection holes 4420B respectively corresponding to the second connection holes 4430A.

Some of fastening members 4400C such as a screw may pass through the third connection holes 4410B and the first connection holes 4430, thereby connecting the connection bar 4400B to the side cover 4400. Further, other fastening members 4400C may pass through the fourth connection holes 4420B and the second connection holes 4430A, thereby connecting the connection bar 4400B to the auxiliary side cover 4400A. Hence, the fastening members 4400C may connect the side cover 4400 to the auxiliary side cover 4400A.

Figure 57:
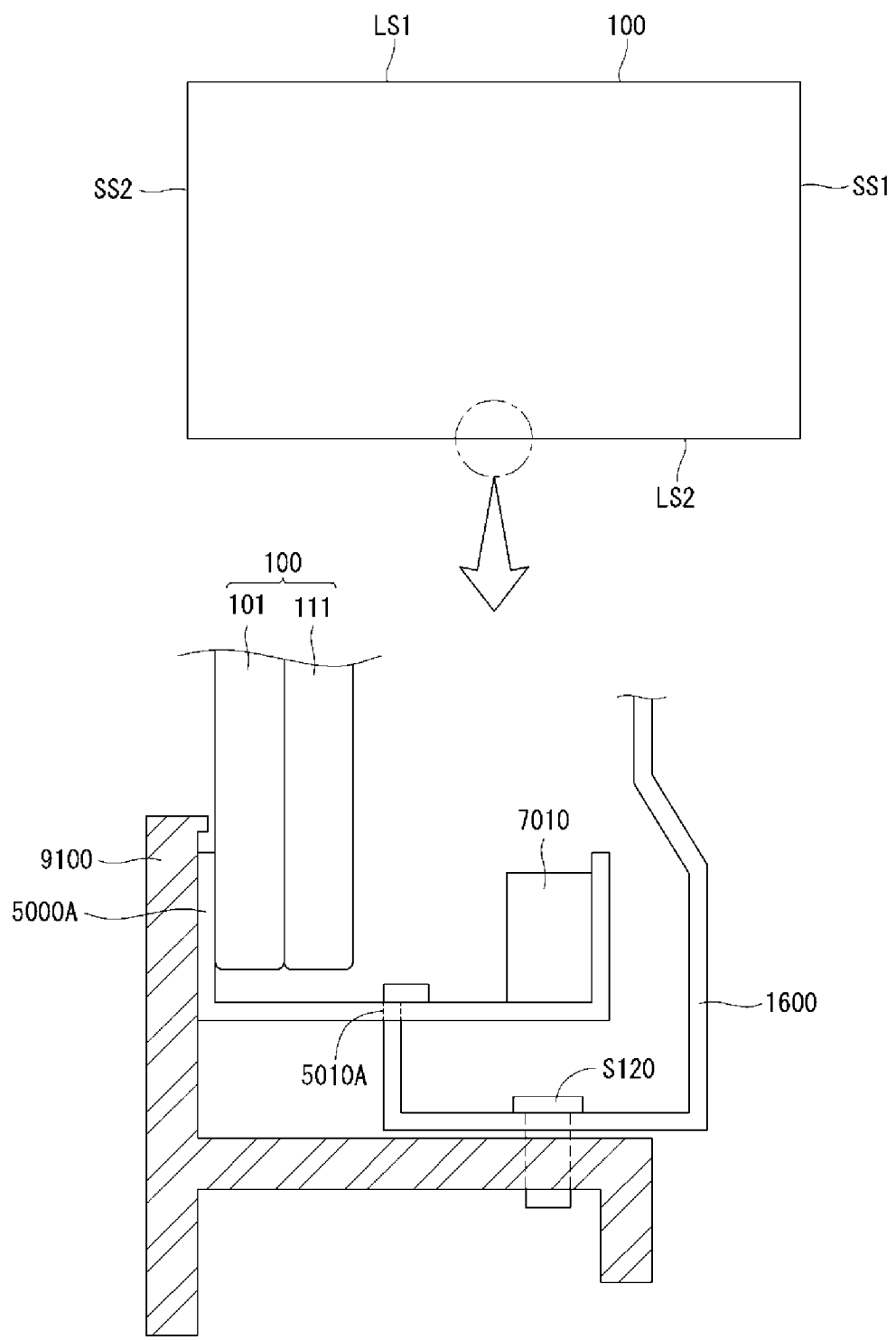

As shown in FIG. 57, a bottom cover 9100 may be disposed on the second long side LS2 of the display panel 100. The bottom cover 9100 may cover a portion of the front surface of the front substrate 101 on the second long side LS2 of the display panel 100.

It is assumed that the front substrate 101 has a first area, a second area opposite the first area, a third area adjacent to the first and second areas, and a fourth area opposite the third area. Edges of front surfaces of the first, third, and fourth areas may be exposed, and a portion of a front surface of the second area may be covered by the bottom cover 9100. In the embodiment of the invention, the first area, the second area, the third area, and the fourth area may correspond to the first long side LS1, the second long side LS2, the first short side SS1, and the second short side SS2, respectively.

A bottom connection frame 5000A may be disposed on the second long side LS2 of the display panel 100.

The bottom connection frame 5000A may include a portion positioned on the side of the display panel 100. The bottom connection frame 5000A may include a portion positioned between the bottom cover 9100 and the front substrate 101. The edge type backlight unit 7010 may be disposed on the bottom connection frame 5000A.

The frame 1600 may be connected to the bottom connection frame 5000A on the lower side (i.e., the second long side LS2) of the display panel 100. For example, the bottom connection frame 5000A may have a hole 5010A, and the end of the frame 1600 may be inserted into the hole 5010A of the bottom connection frame 5000A. Hence, the frame 1600 may be connected to the bottom connection frame 5000A.

The frame 1600 may be connected to the bottom cover 9100. For example, a predetermined fastening member S120 may fasten the frame 1600 to the bottom cover 9100 on the second long side LS2 of the display panel 100.

Figure 58:
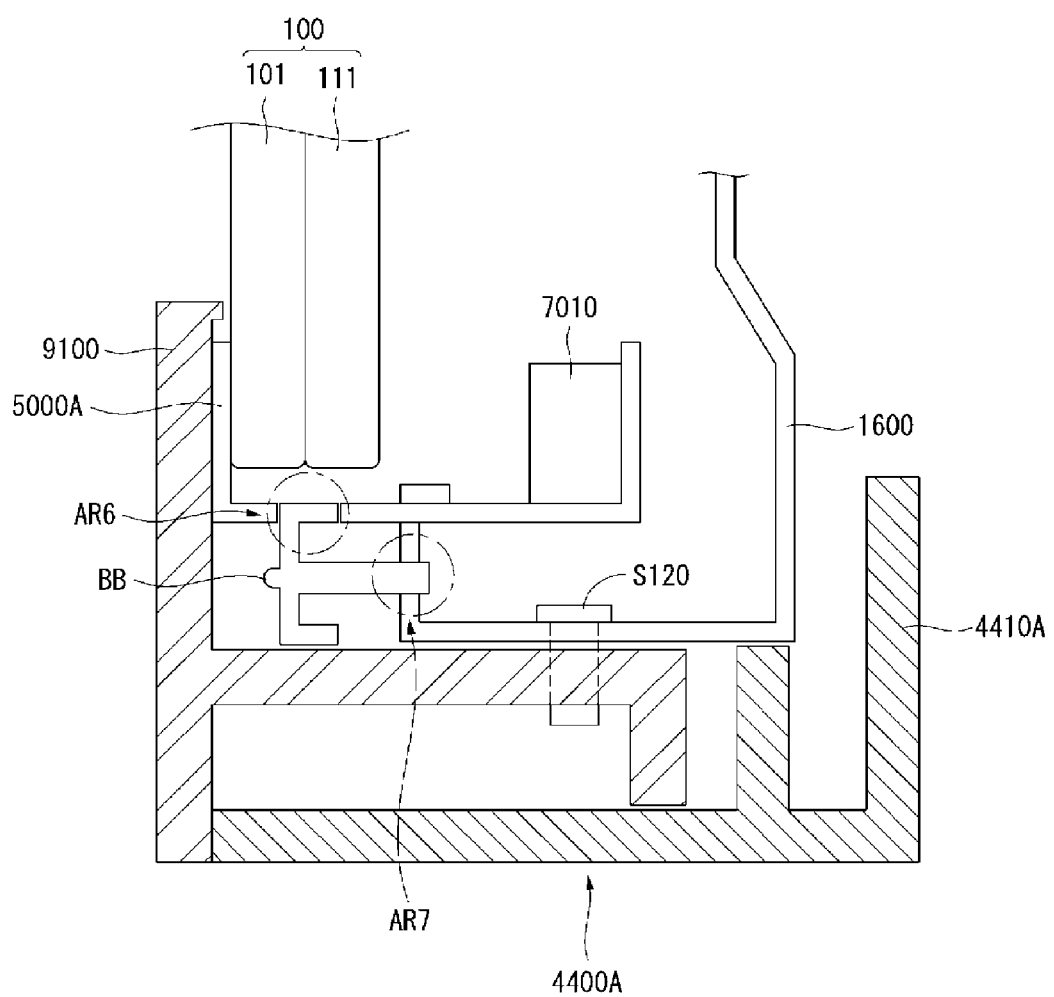

As shown in FIG. 58, a bottom supporter BB for enhancing a support strength for the display panel 100 may be disposed between the bottom cover 9100 and the bottom connection frame 5000A.

The bottom supporter BB may be coupled with the bottom connection frame 5000A as indicated in a sixth area AR6. Further, the bottom supporter BB may be coupled with the frame 1600 as indicated in a seventh area AR7.

The auxiliary side cover 4400A may be connected to the bottom cover 9100 on the lower side of the display panel 100.

Figure 59:
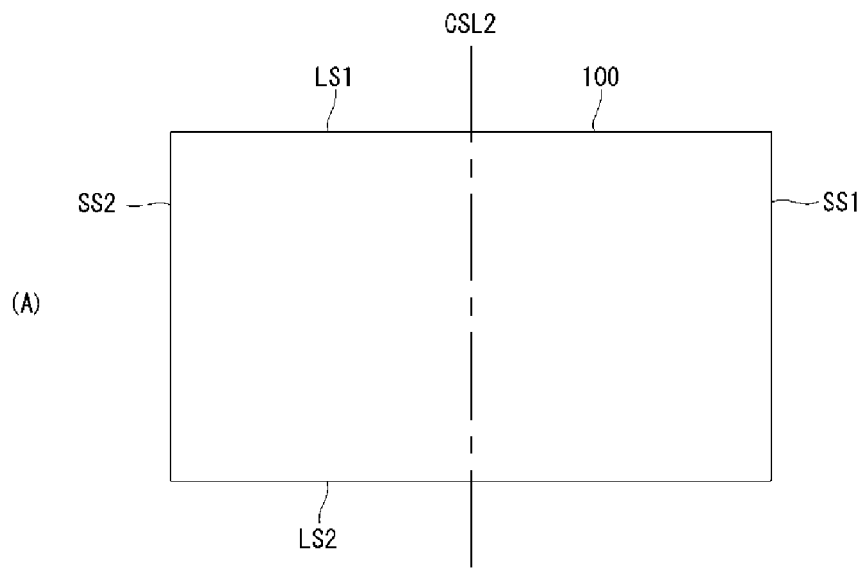
Figure 59:
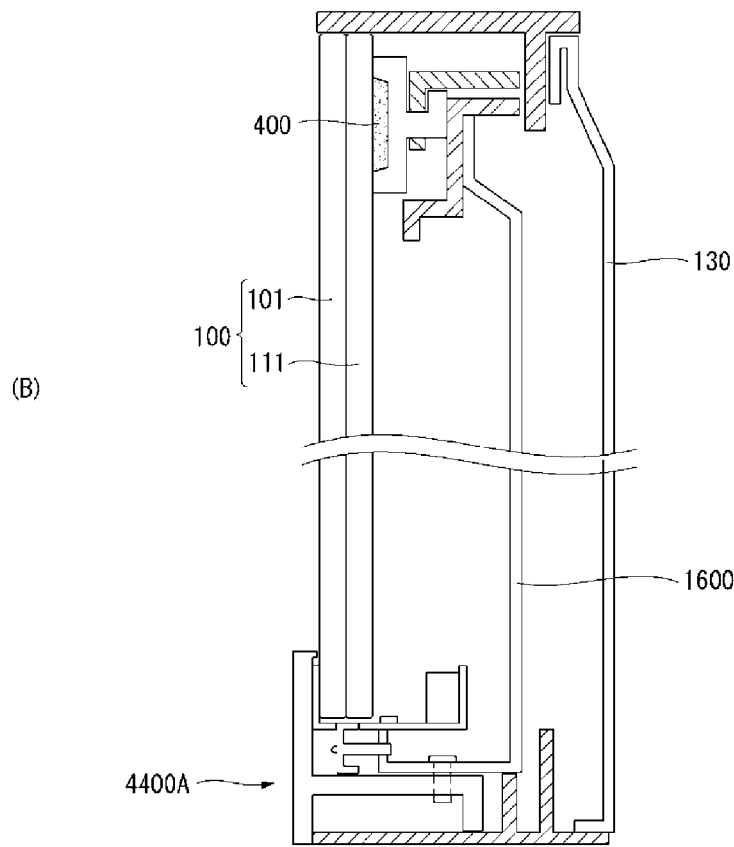

FIG. 59 is a schematic cross-sectional view of the display apparatus according to the embodiment of the invention in the vertical direction.

As shown in FIG. 59, the auxiliary side cover 4400A may be connected to the back cover 130 on the lower side of the display panel 100.

Figure 60:
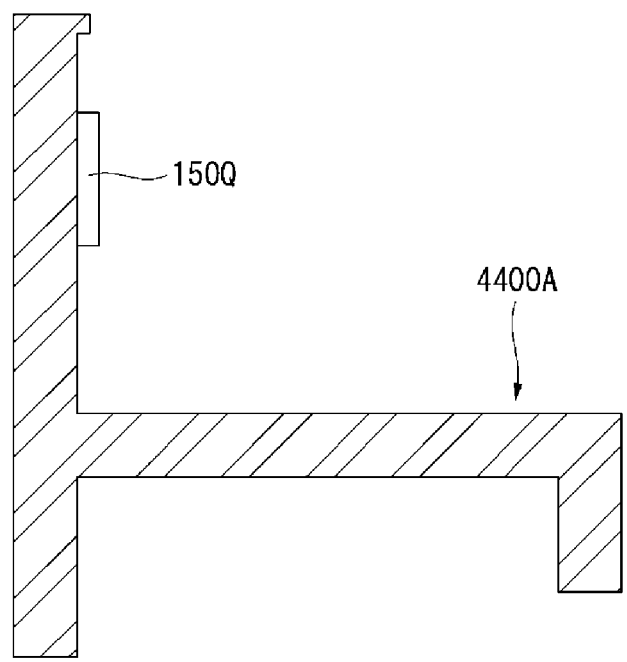

As shown in FIG. 60, a user input interface 150Q may be disposed on a back surface of the bottom cover 9100. The user input interface 150Q may receive a control signal for performing various operations such as a channel change and a volume control input from the outside.

In this instance, the bottom cover 9100 may include a light transmission part capable of transmitting light, so that a user command, which the user inputs using a remote controller, transmits the bottom cover 9100 and reaches the user input interface 150Q.

As above, when the user input interface 150Q is disposed on the back surface of the bottom cover 9100, the user may perceive that the user input interface 150Q is hidden by the bottom cover 9100. Further, because a space for the user input interface 150Q is not necessary, the attractive appearance of the display apparatus may be provided.

Alternatively, a hole may be formed in the bottom cover 9100, and the user input interface 150Q may be disposed in the hole of the bottom cover 9100.

Figure 61:
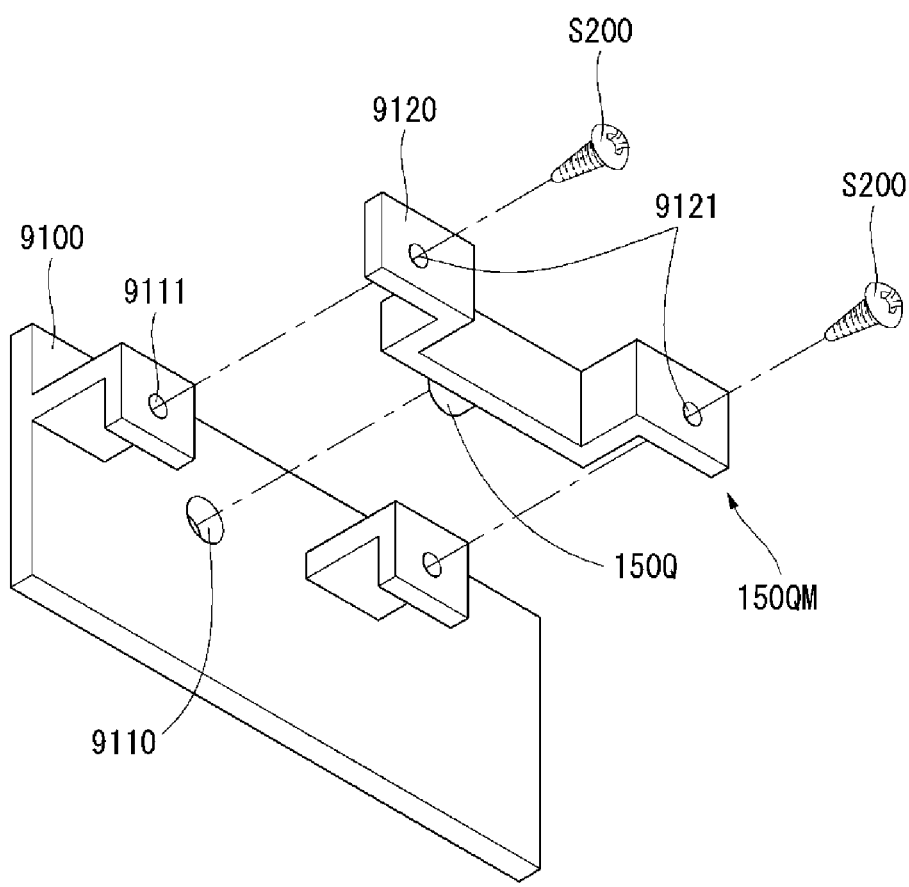

For example, as shown in FIG. 61, the bottom cover 9100 may include a hole 9110 toward the front surface of the display panel 100. Further, the bottom cover 9100 may include a coupling hole 9111 for assembling an interface module 150QM.

The interface module 150QM including the user input interface 150Q may have a coupling hole 9120 used to couple the interface module 150QM with the bottom cover 9100.

Predetermined fastening members S200 may pass through the coupling hole 9120 of the interface module 150QM and the coupling hole 9111 of the bottom cover 9100, thereby coupling the interface module 150QM to the bottom cover 9100.

Figure 62:
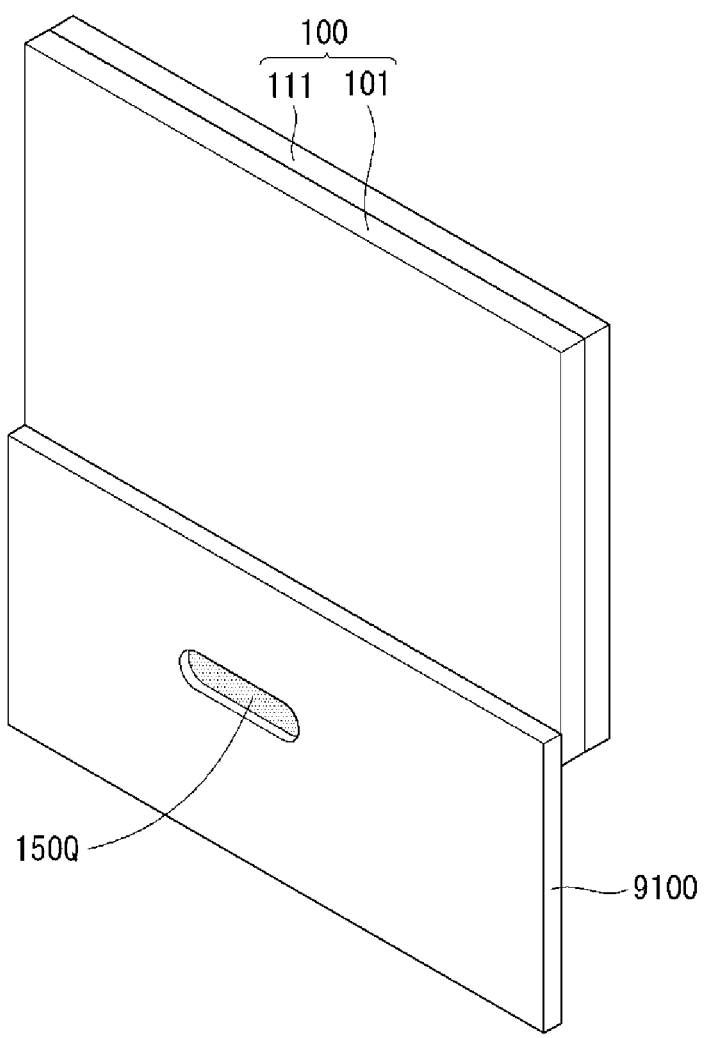

It may be preferable that the interface module 150QM is coupled with the bottom cover 9100, so that the user input interface 150Q of the interface module 150QM corresponds to the hole 9110 of the bottom cover 9100. In this instance, as shown in FIG. 62, the user input interface 150Q may be exposed through the front surface the display panel 100.

A command input unit for inputting various commands, such as turn-on and turn-off operations of the display apparatus, the channel change, and the volume control, may be configured as a touch sensor.

Figure 63:
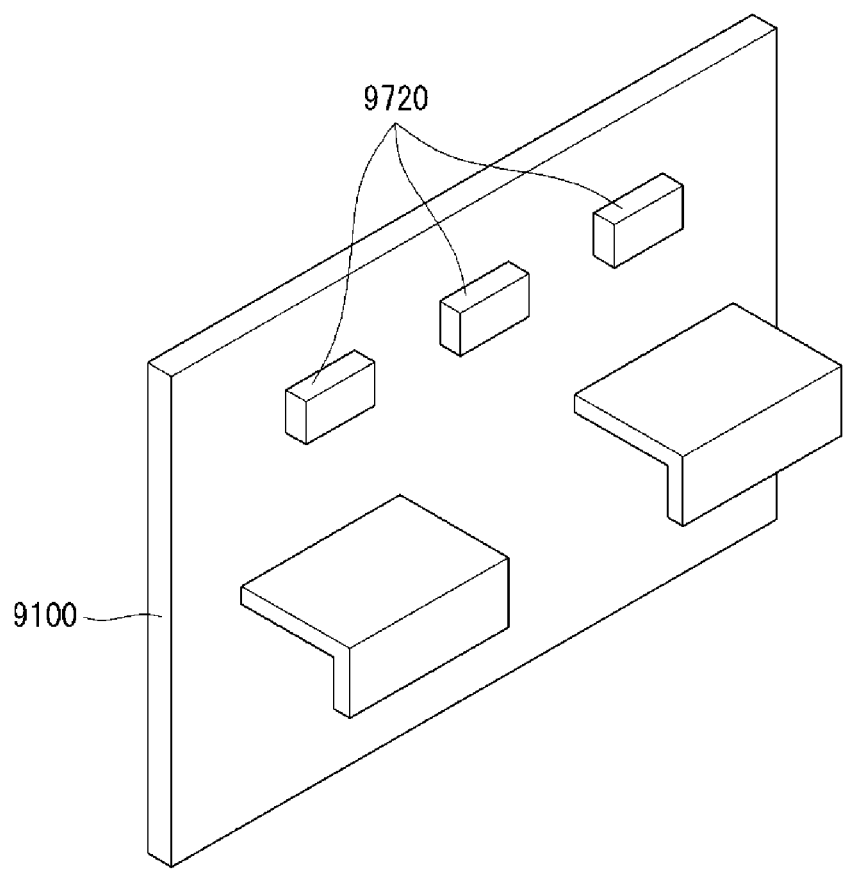

For example, as shown in FIG. 63, touch sensors 9720 may be disposed on the back surface of the bottom cover 9100.

When the user touches the bottom cover 9100 and inputs the user command, the touch sensors 9720 may recognize and perform the user command.

The touch sensor 9720 may be a sensor capable of sensing the user's body or a small capacitance a specific object has. In this instance, when the user performs a touch operation using his or her body or a specific object having the capacitance, the touch sensor 9720 may recognize the touch operation and operate.

Figure 64:
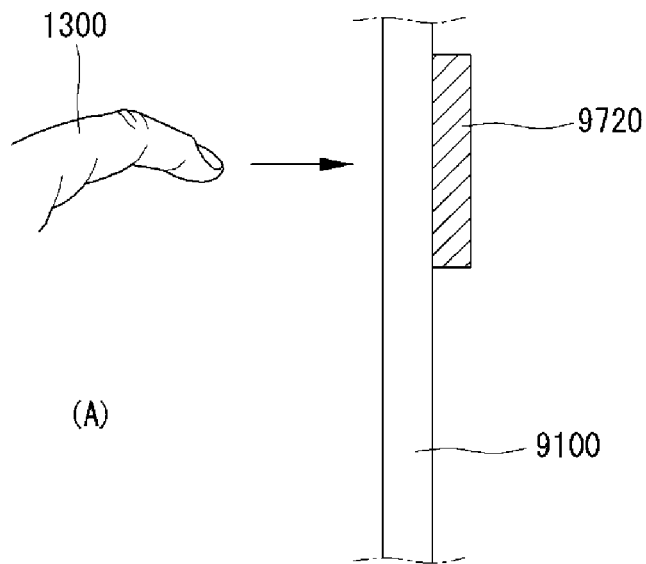
Figure 64:
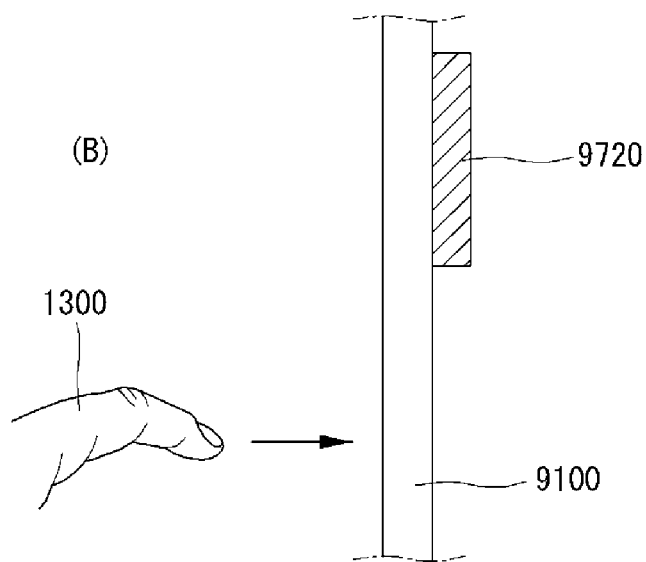

For example, as shown in FIG. 64(A), when the user touches a formation area of the touch sensor 9720 in the bottom cover 9100, the touch sensor 9720 may sense small changes in the capacitance generated by the user's touch operation and may recognize the user's touch operation. Hence, the touch sensor 9720 may perform various operations according to the user's touch operation.

On the other hand, as shown in FIG. 64(B), when the user touches a non-formation area of the touch sensor 9720 in the bottom cover 9100, the touch sensor 9720 may not operate.

As above, when the touch sensors 9720 are disposed on the back surface of the bottom cover 9100, a portion of the bottom cover 9100 may be used as a switch.

The touch sensor 9720 may directly contact the bottom cover 9100. Alternatively, a non-conductive buffer (not shown) may be disposed between the bottom cover 9100 and the touch sensor 9720.

Figure 65:
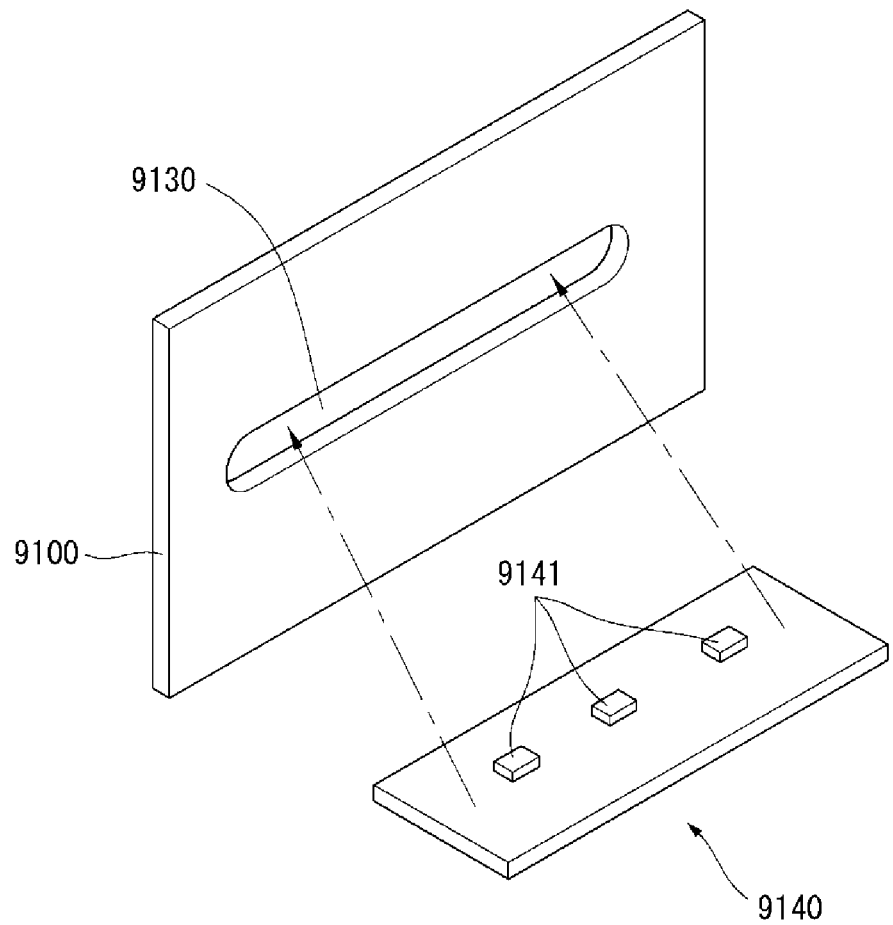

Alternatively, as shown in FIG. 65, the bottom cover 9100 may have an input hole 9130 used as a formation space of input keys 9141 for performing the various user commands.

An input module 9140 including the input keys 9141 may be manufactured, and the input module 9140 may be connected to the bottom cover 9100.

Figure 66:
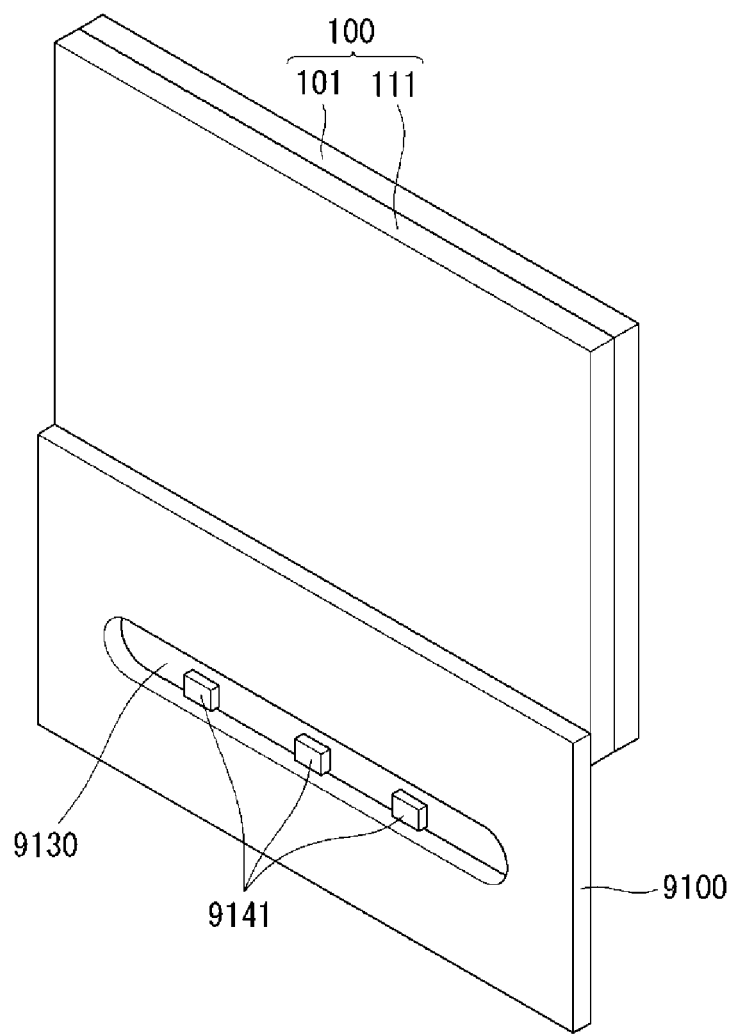

As shown in FIG. 66, the input keys 9141 may be exposed through the front surface of the display panel 100.

Figure 67:
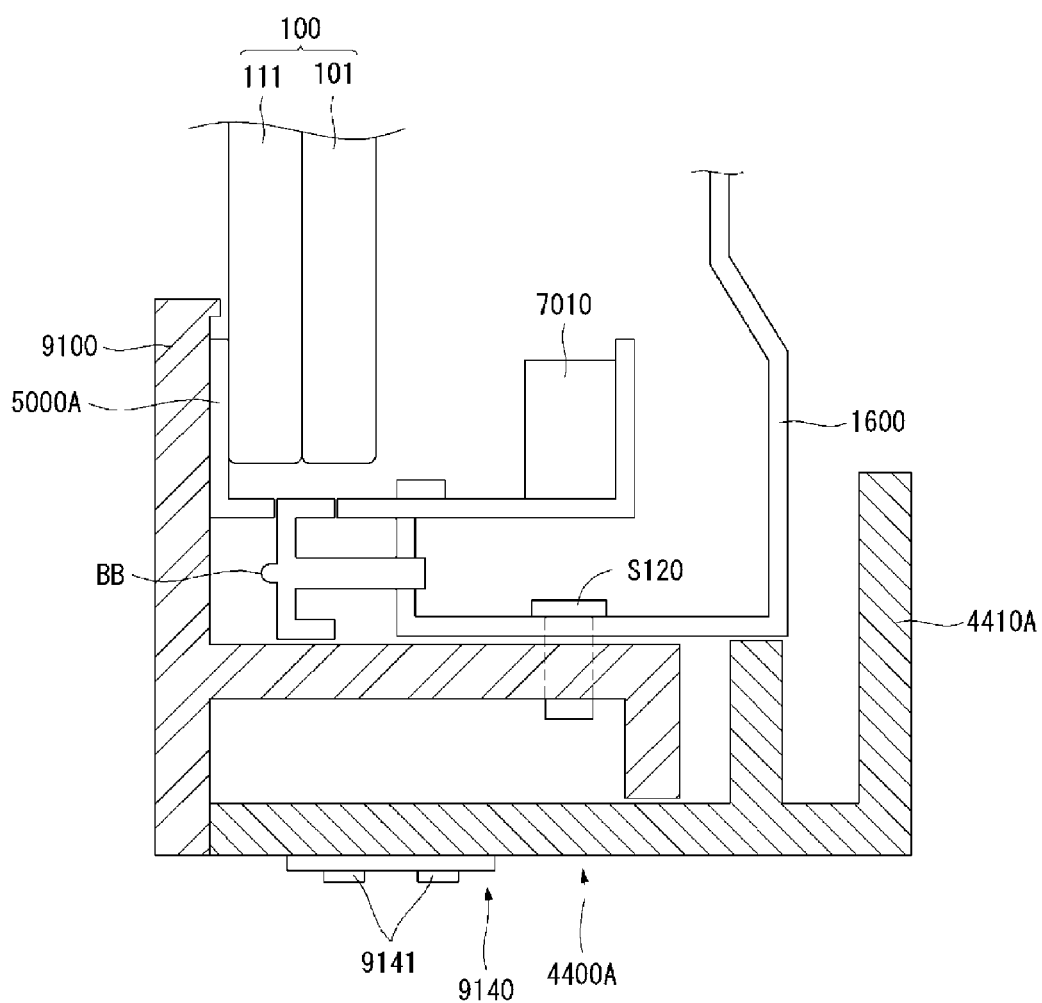
Figure 68:
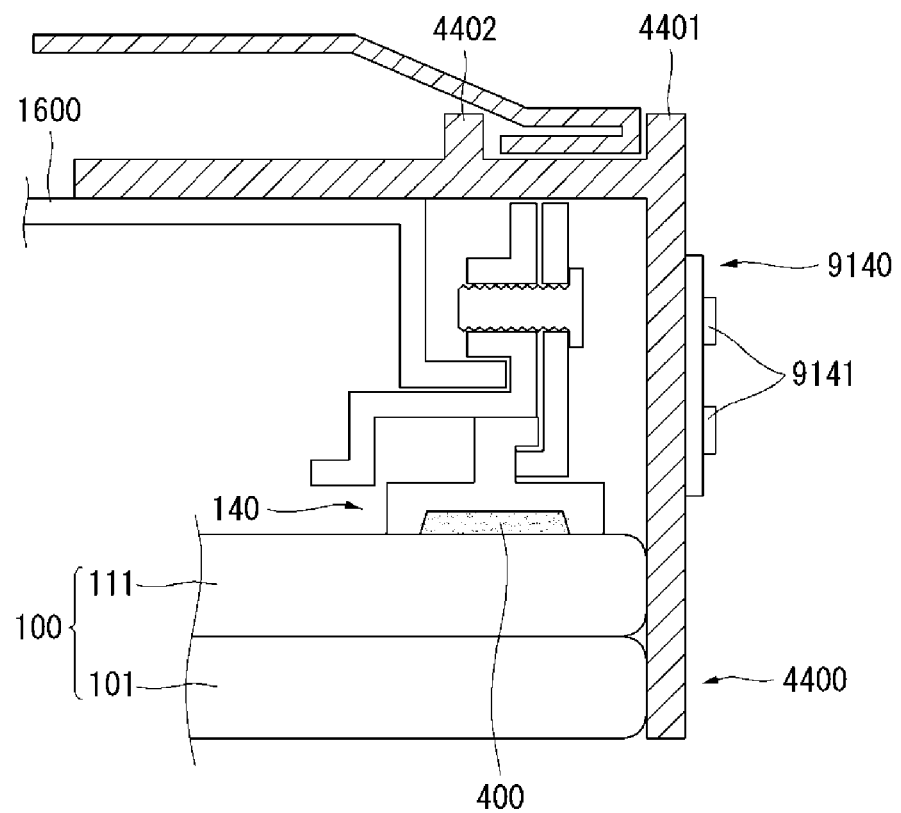

Alternatively, as shown in FIG. 67, the input module 9140 may be disposed under the auxiliary side cover 4400A. Alternatively, as shown in FIG. 68, the input module 9140 may be disposed on the side of the side cover 4400. Alternatively, as shown in FIG. 69 (A), the input module 9140 may be disposed on the back surface of the back cover 130.

Figure 69:
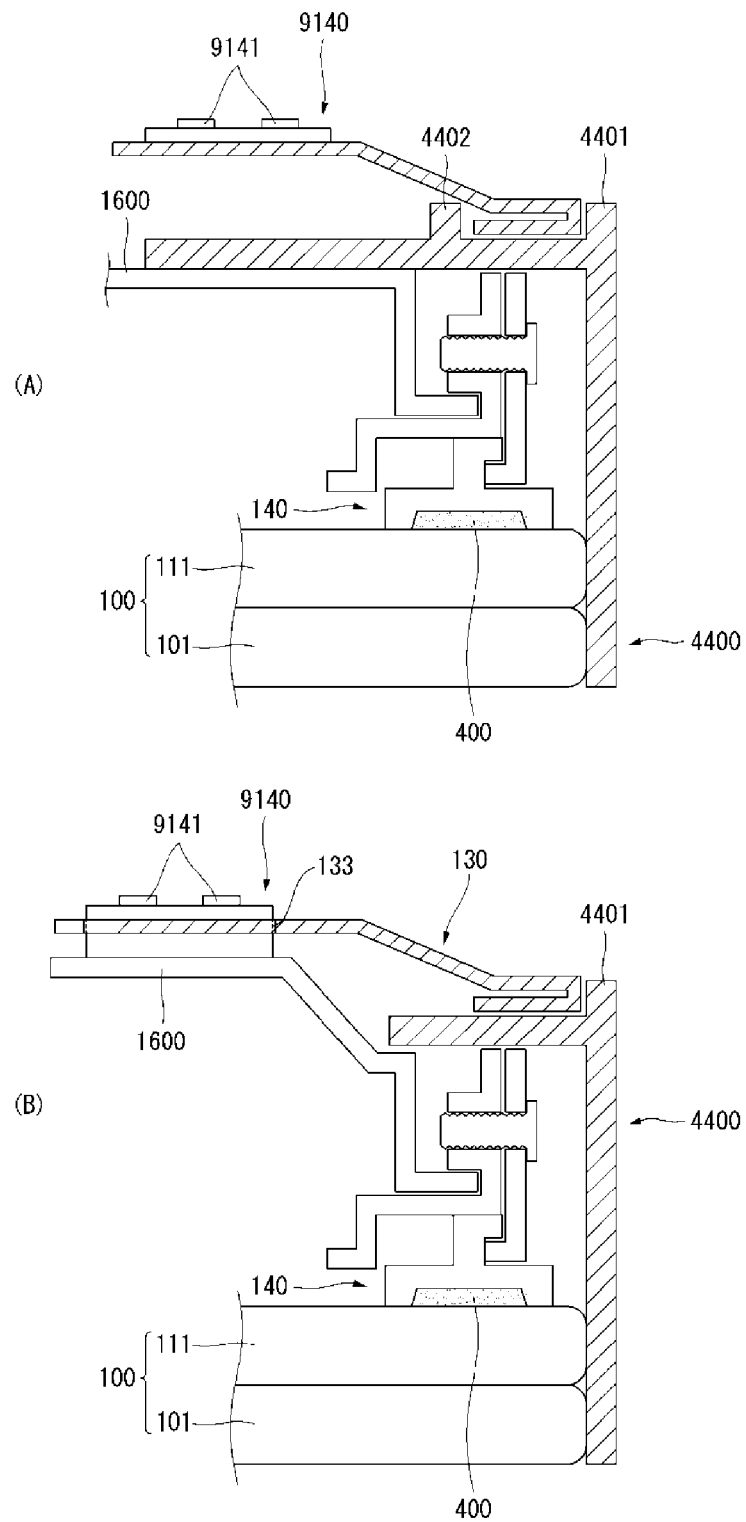

Alternatively, as shown in FIG. 69 (B), the input module 9140 may be disposed on the frame 1600. In this case, hole 133 corresponding to the input module 9140 is form on the back cover 130, and the input module 9140 may exposed through the hole 133.

As above, the input module 9140 may be disposed at any position where the user may conveniently use the input module 9140.

Figure 70:
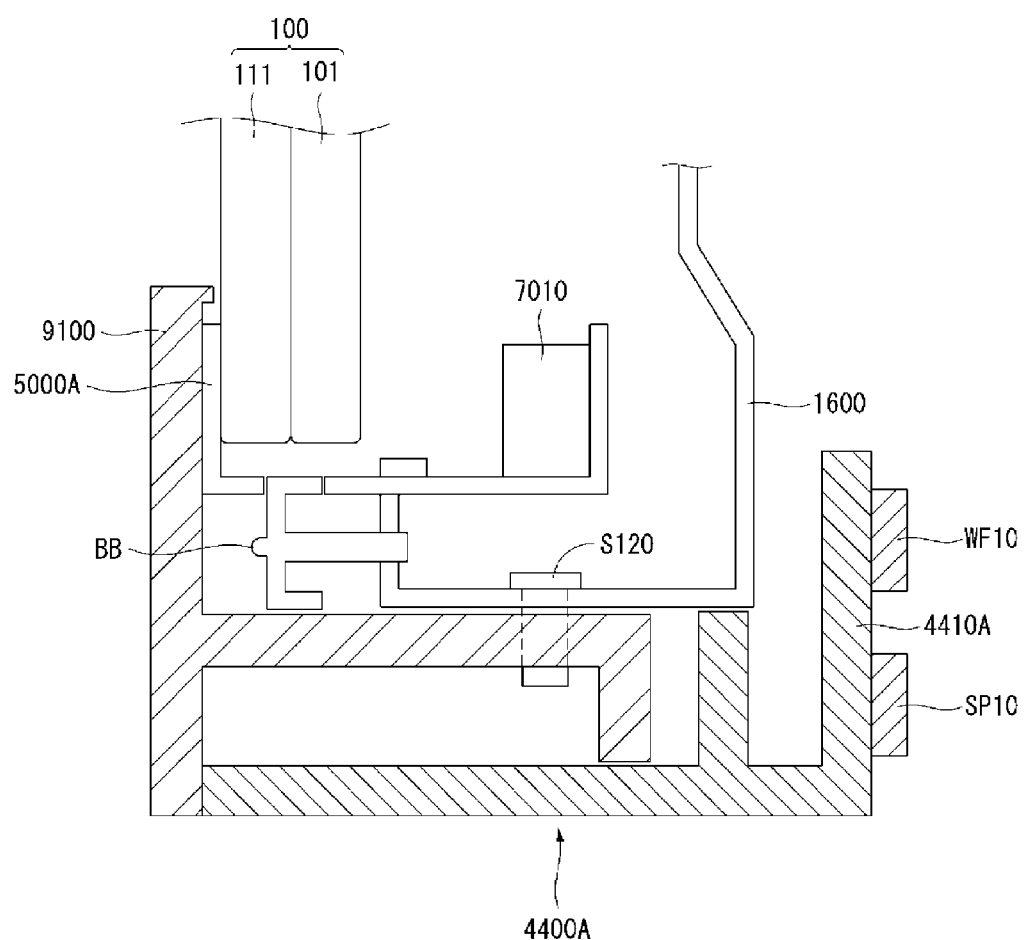

The display apparatus according to the embodiment of the invention may further include a wireless communication unit capable of performing a communication such as wireless internet. For example, as shown in FIG. 70, a wireless communication unit WF10 may be disposed on the additional part 4410A of the auxiliary side cover 4400A. In addition to the wireless communication unit WF10, various devices such as a speak module SP10 may be disposed on the additional part 4410A of the auxiliary side cover 4400A.

The wireless communication unit WF10 may transmit and receive a signal (for example, a signal corresponding to Wireless-Fidelity (Wi-Fi) standard) having various frequency bands. The display apparatus according to the embodiment of the invention may perform the wireless internet communication through the wireless communication unit WF10.

As above, when the wireless communication unit WF10 is disposed on the auxiliary side cover 4400A, the wireless communication unit WF10 may be hidden by the back cover 130. Hence, it may be preferable that the back cover 130 contains a material capable of transmitting a radio wave.

Figure 71:
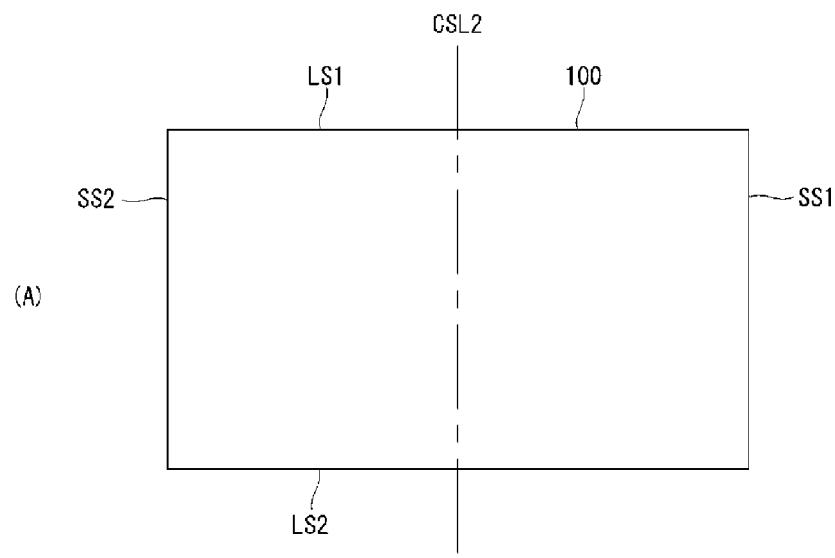
Figure 71:
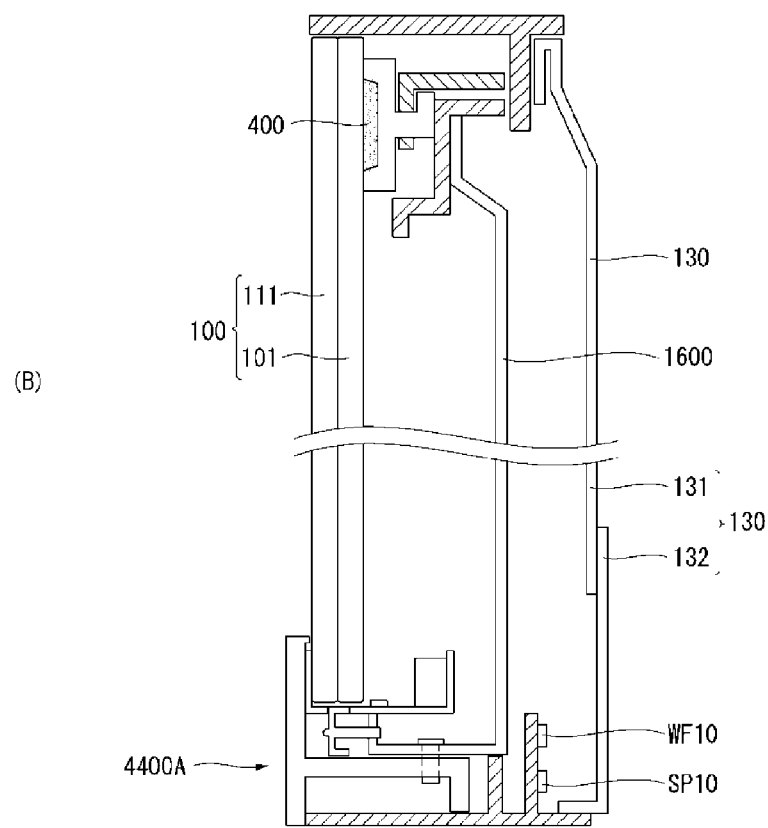

As shown in FIG. 71(A), the back cover 130 may be divided into a first back cover 131 and a second back cover 132 for the efficient wireless communication.

As shown in FIG. 71(B), the second back cover 132 may correspond to the wireless communication unit WF10. In other words, the wireless communication unit WF10 may be disposed inside the second back cover 132. Thus, it may be preferable that the radio transmission of the second back cover 132 is greater than the radio transmission of the first back cover 131 for the more efficient wireless communication.

Preferably, the first back cover 131 may contain a metal material such as aluminum (Al), and the second back cover 132 may contain a plastic material. The first back cover 131 containing aluminum may be used as a ground.

In other words, the first back cover 131 and the second back cover 132 may be formed of different materials and may be connected to each other.

Figure 72:
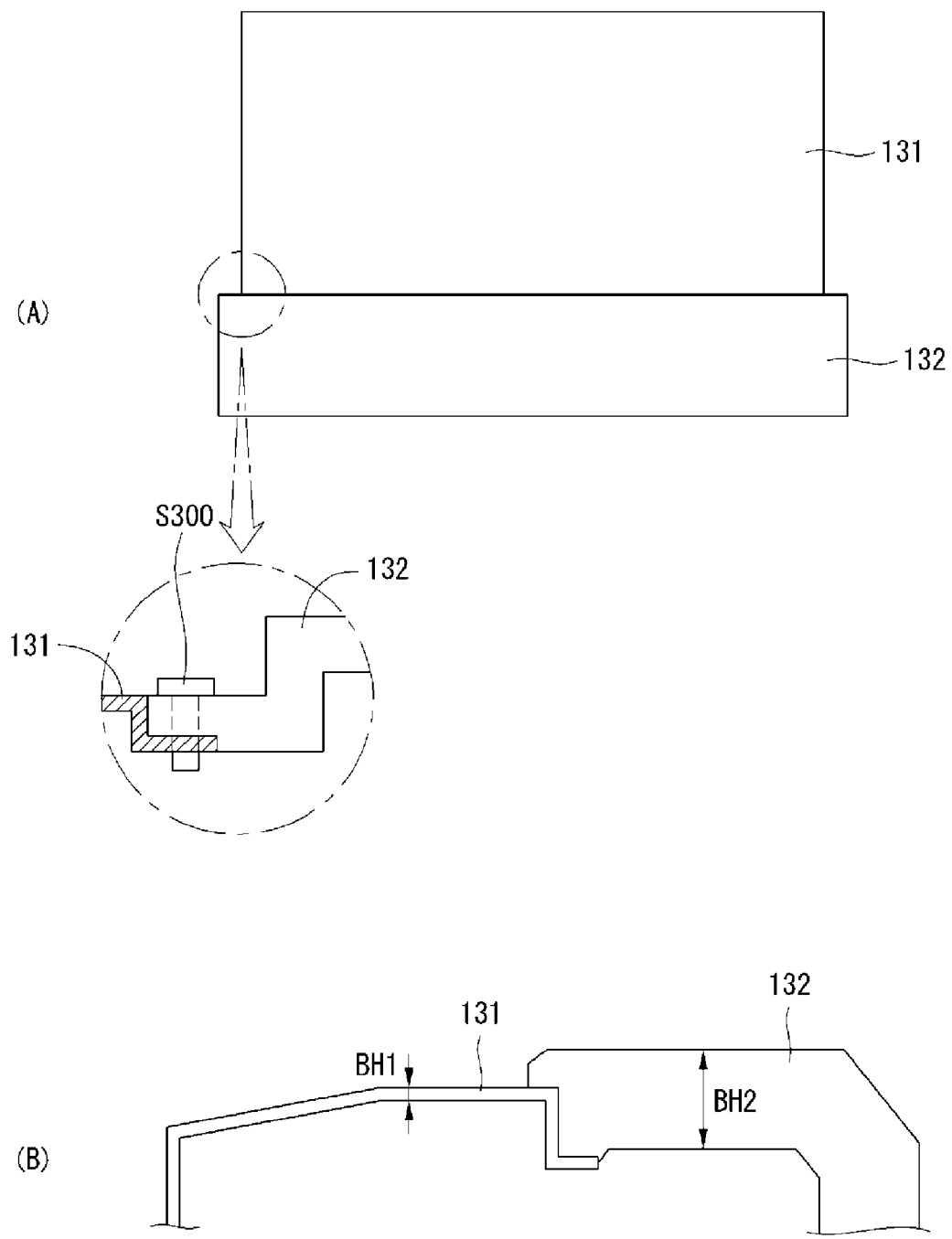

For example, as shown in FIG. 72(A), a predetermined fastening member S300 may fasten the first back cover 131 to the second back cover 132.

Further, because the first back cover 131 containing aluminum may serve as the ground, an area of the first back cover 131 may be greater than an area of the second back cover 132.

On the other hand, as shown in FIG. 72(B), because aluminum forming the first back cover 131 is heavier than the plastic material forming the second back cover 132, a thickness BH1 of the first back cover 131 formed of aluminum may be less than a thickness BH2 of the second back cover 132 formed of the plastic material. Hence, the rigidity of the second back cover 132 may be sufficiently improved.

Figure 73:
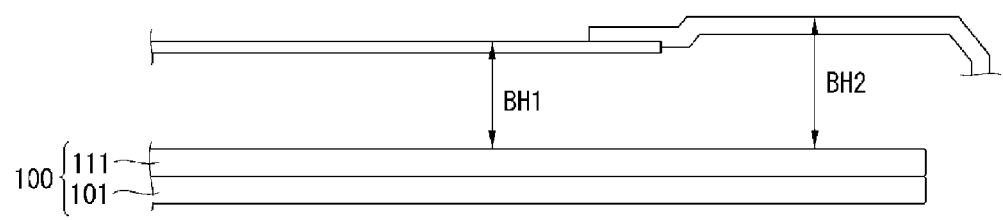

As shown in FIG. 73, when a height is measured based on the back substrate 111 of the display panel 100, a maximum height BH2 of the second back cover 132 may be greater than a maximum height BH1 of the first back cover 131. In this instance, the inside of the second back cover 132 may secure a sufficient space capable of receiving various devices such as the wireless communication unit WF10 and the speaker module SP10.

Figure 74:
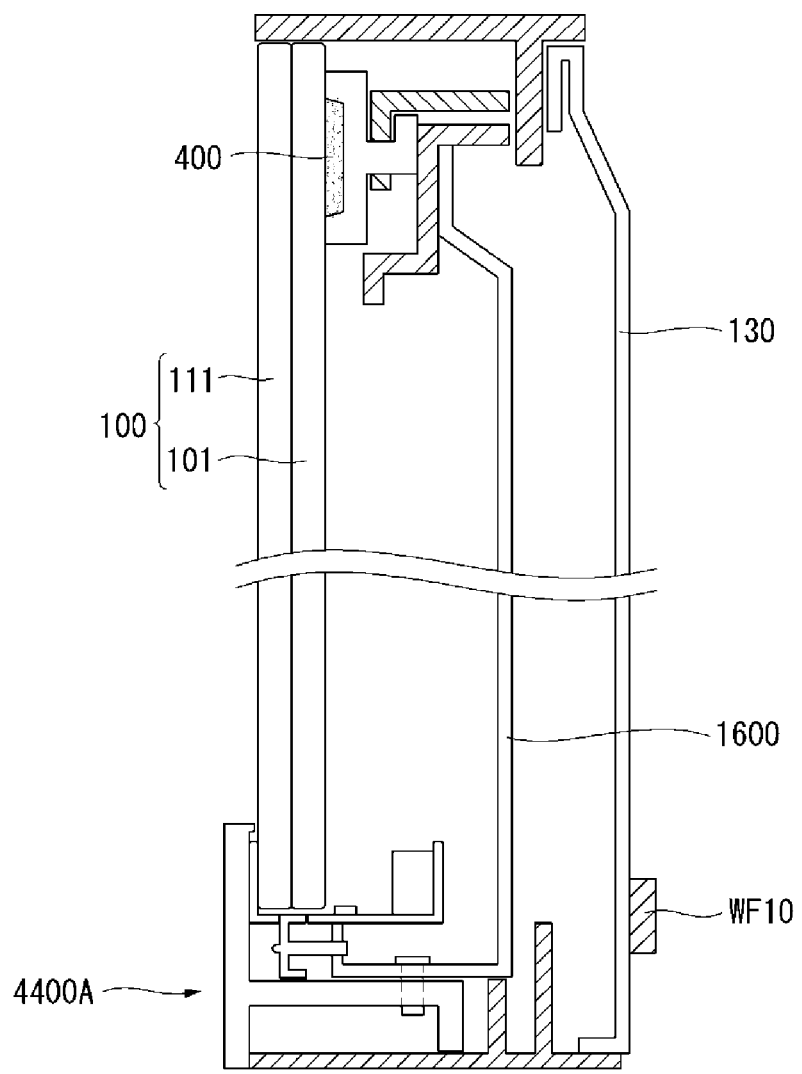

Alternatively, as shown in FIG. 74, the wireless communication unit WF10 may be disposed on the back surface of the back cover 130 so that the wireless communication unit WF10 is exposed through the back surface of the back cover 130.

Figure 75:
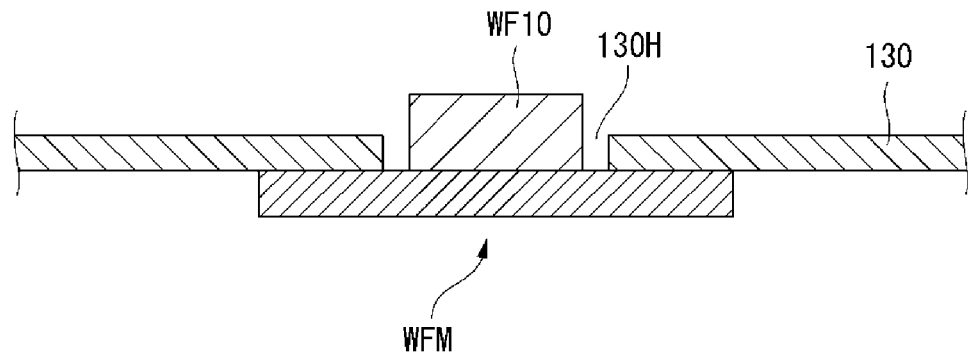

Alternatively, as shown in FIG. 75, a hole 130H may be formed in the back cover 130, and a wireless communication module WFM including the wireless communication unit WF10 may be installed inside the back cover 130. In this instance, the wireless communication unit WF10 of the wireless communication module WFM may be exposed through the hole 130H of the back cover 130.

In the structure illustrated in FIGS. 74 and 75, it does not matter that the back cover 130 does not contain the material capable of transmitting the radio wave.

Figure 76:
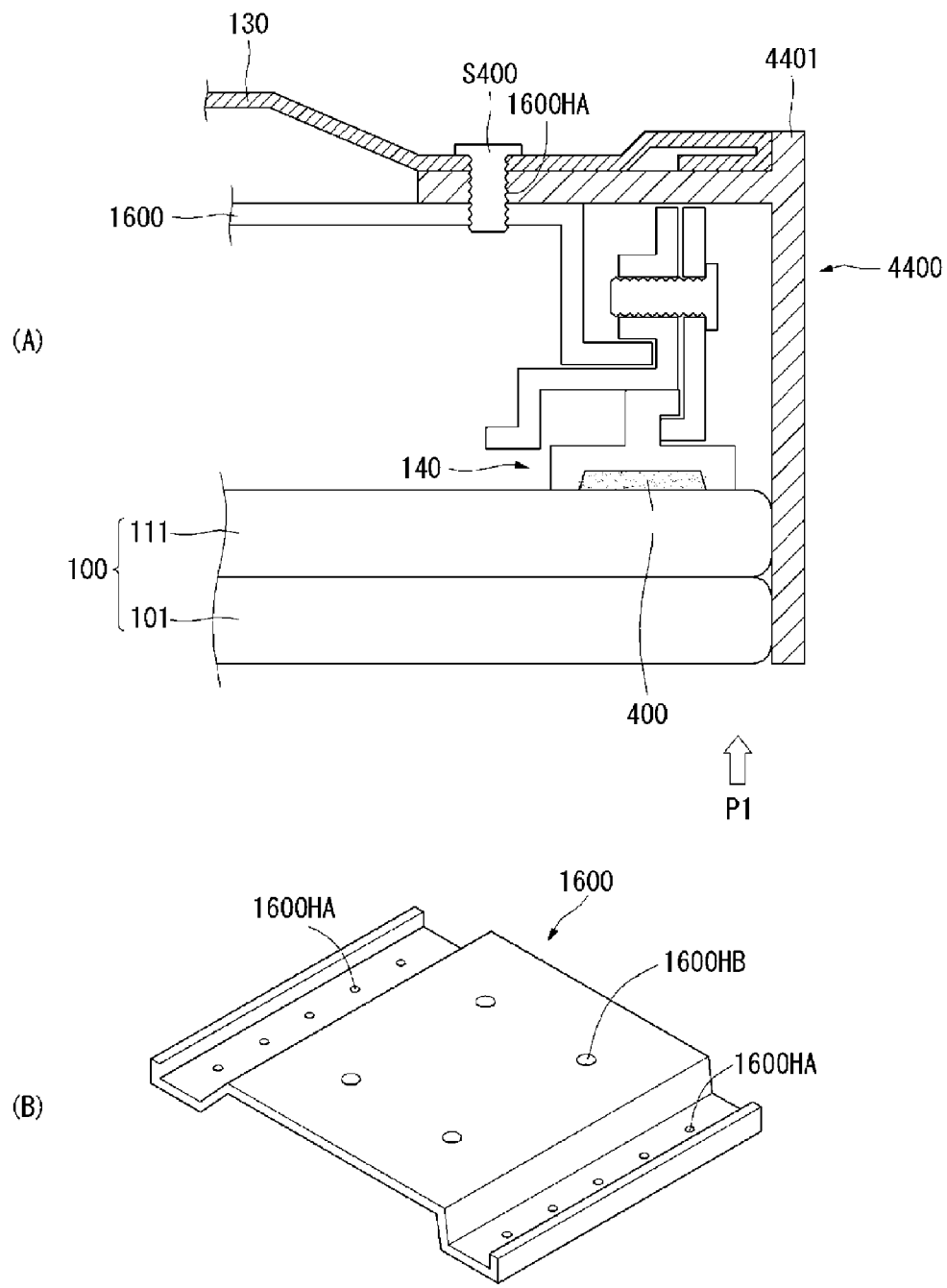

As shown in FIG. 76(A), the back cover 130, the side cover 4400, and the frame 1600 may be fastened to one another using a fastening member S400. In this instance, the back cover 130, the side cover 4400, and the frame 1600 may be electrically connected to one another using the fastening member S400. Hence, electromagnetic interference (EMI) may be reduced.

As shown in FIG. 76(B), the frame 1600 may have at least one hole. For example, the frame 1600 may have at least one first hole 1600HA and at least one second hole 1600HB.

As shown in FIG. 76(A), the first hole 1600HA may correspond to the fastening member S400 for fastening the frame 1600 to the back cover 130 and the side cover 4400. The second hole 1600HB may be used to fasten the frame 1600 to a predetermined structure, for example, the back cover 130 or may be used as a hole through which another structure passes.

Figure 77:
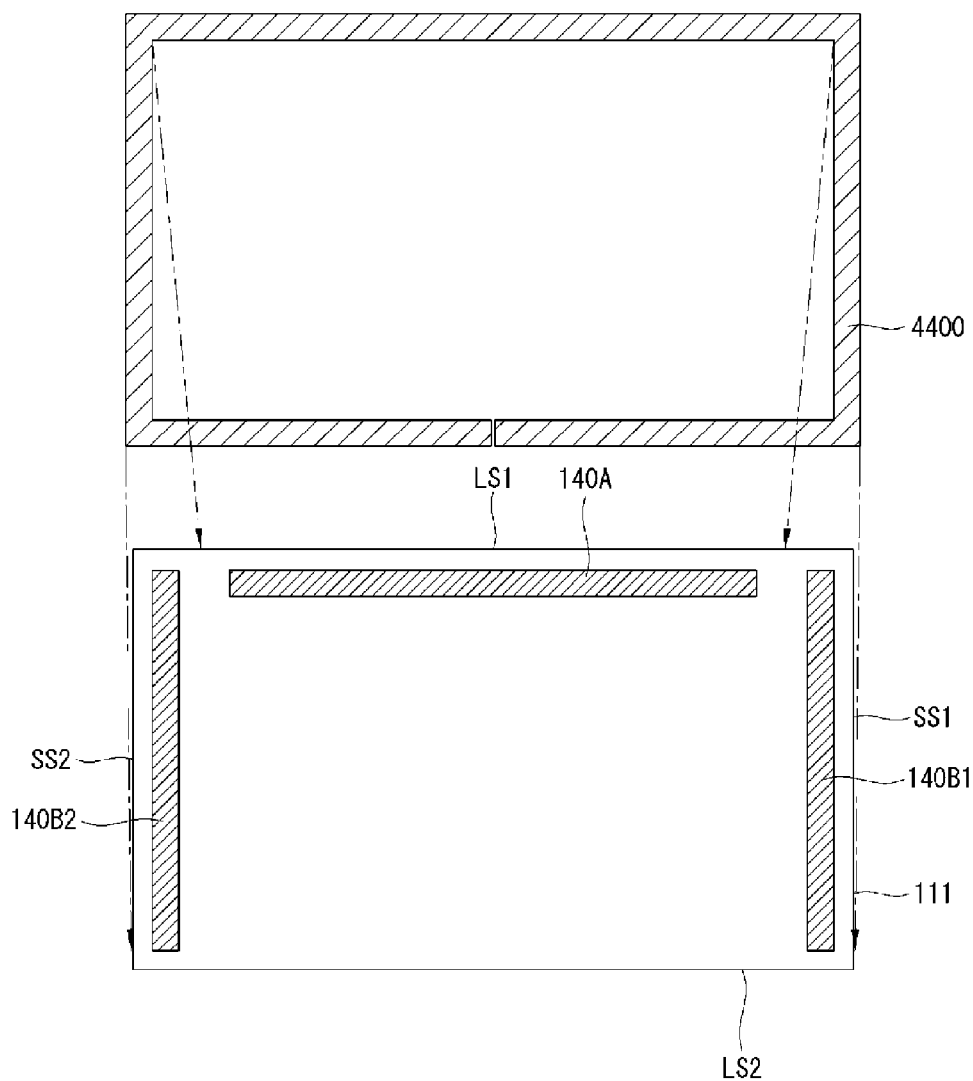

As shown in FIG. 77, the side cover 4400 may have the form wrapping the display panel 100. The side cover 4400 shown in FIG. 77 may be an assembly of the auxiliary side cover 4400A and the side cover 4400 shown in FIG. 77.

The side cover 4400 may be manufactured through extrusion and bending processes.

Figure 78:
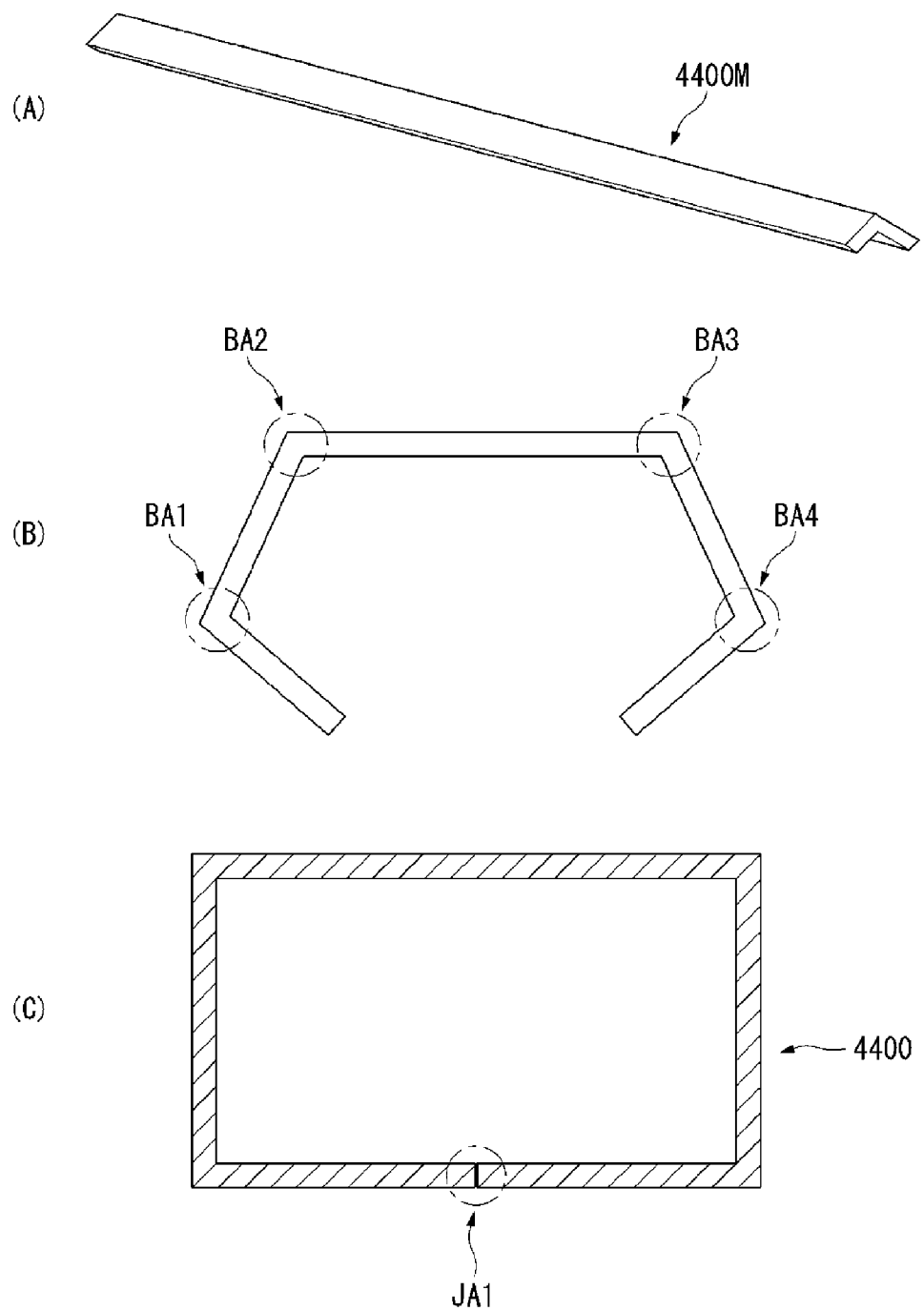

For example, as shown in FIG. 78(A), an extrusion bar 4400M may be manufactured through the extrusion process.

Next, as shown in FIG. 78(B), the extrusion bar 4400M may be bent through the bending processes.

For example, first to fourth areas BA1, BA2, BA3, and BA4 of the extrusion bar 4400M may be bent. As a result, as shown in FIG. 78(C), the side cover 4400 of a frame form may be manufactured Both ends of the side cover 4400 thus manufactured may be opposite to each other as indicated by a circle JA1 shown in FIG. 78(C).

Figure 79:
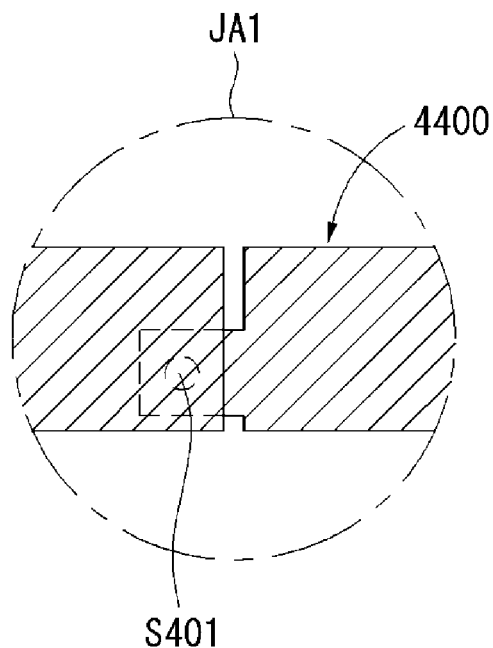

Preferably, one end of the side cover 4400 may be connected to the other end thereof. For example, as indicated by the circle JA1 shown in FIG. 79, one end of the side cover 4400 may be fastened to the other end thereof using a predetermined fastening member S401.

Alternatively, a medium for connecting one end of the side cover 4400 to the other end may be disposed between both ends of the side cover 4400.

Figure 80:
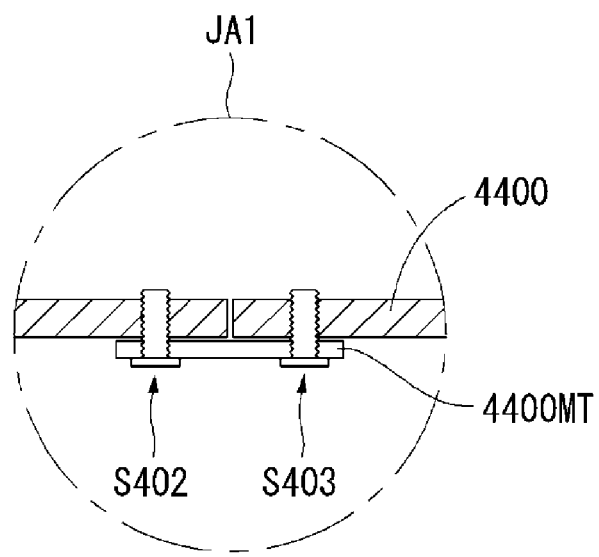

For example, as shown in FIG. 80, a medium 4400MT may be disposed between both ends of the side cover 4400, and one end and the other end of the side cover 4400 may be connected to the medium 4400MT using predetermined fastening members S402 and S403. Hence, one end of the side cover 4400 may be connected to the other end thereof.

A portion of a bending area of the extrusion bar 4400M may be cut, so as to more efficiently bend the extrusion bar 4400M.

For example, as shown in FIG. 81(A), a portion CA of a horizontal part 4400H (corresponding to a horizontal part 4400H of the side cover 4400) of the extrusion bar 4400M may be cut and removed.

Figure 81:
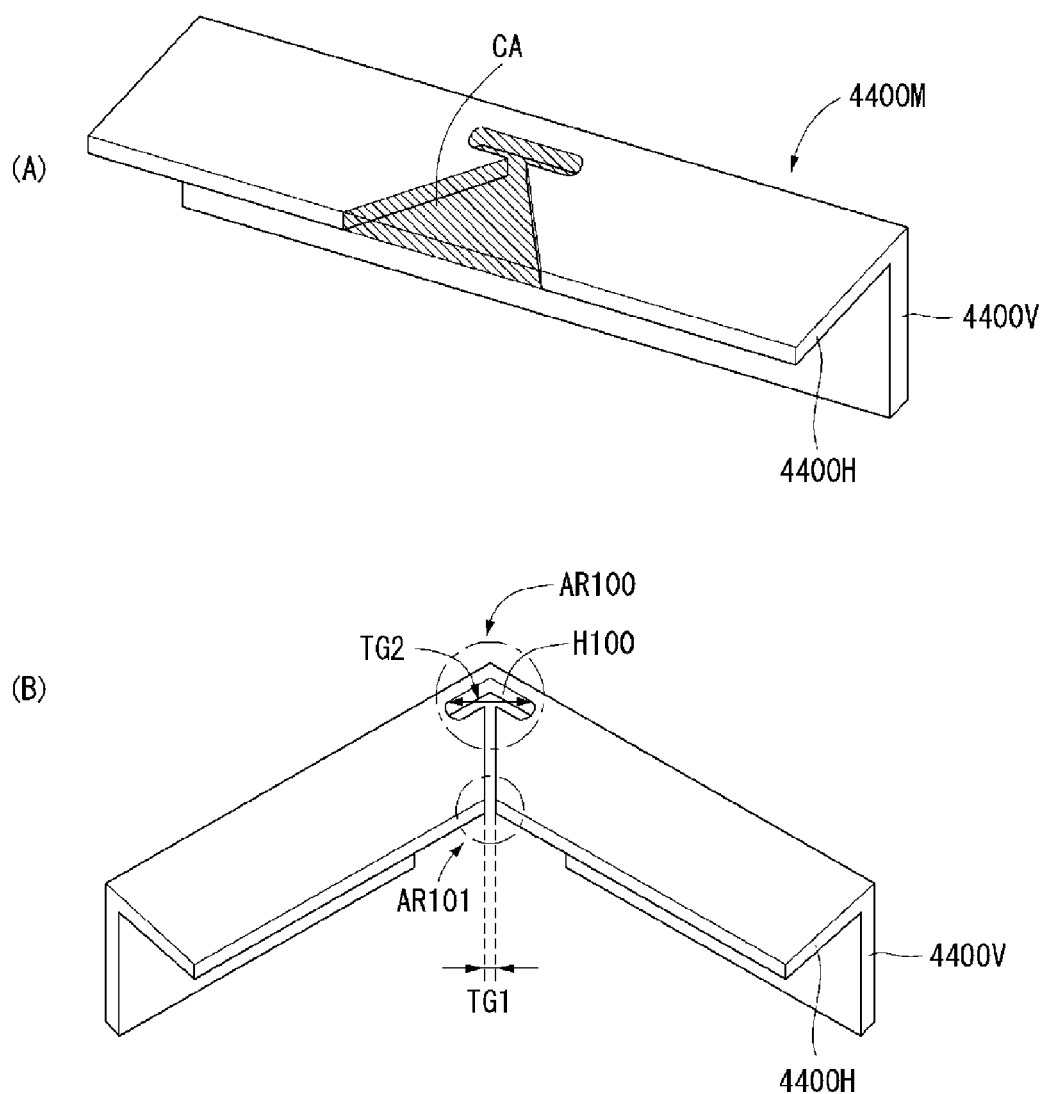

Next, as shown in FIG. 81 (B), the side cover 4400 may be manufactured by bending a cutting area of the extrusion bar 4400M. In this instance, a wrinkle may be prevented from being generated in a bending area of the side cover 4400, and the bending process may be more easily performed.

A bending area of the extrusion bar 4400M may correspond to the corner of the display panel 100. In other words, the bending area of the side cover 4400 may correspond to the corner of the display panel 100.

Further, a vertical part 4400V of the side cover 4400 may be bent in the bending area, and both portions of the cutting area of the horizontal part 4400H of the side cover 4400 may be close to each other. Hence, as indicated by a circle AR101 shown in FIG. 81(B), both portions of the cutting area of the horizontal part 4400H of the side cover 4400 may be separated from each other by a predetermined distance TG1. In other words, the horizontal part 4400H of the side cover 4400 may be divided into two parts in the bending area, i.e., a bending portion of the vertical part 4400V of the side cover 4400.

Further, as indicated by a circle AR100 shown in FIG. 81(B), the horizontal part 4400H of the side cover 4400 may have a hole H100 in the bending area.

The distance TG1 between both horizontal parts 4400H of the side cover 4400 in the area AR101 of the bending portion of the vertical part 4400V of the side cover 4400 may be less than a distance TG2 between both horizontal parts 4400H in the area AR100 positioned between the area AR101 and the vertical part 4400V.

Figure 82:
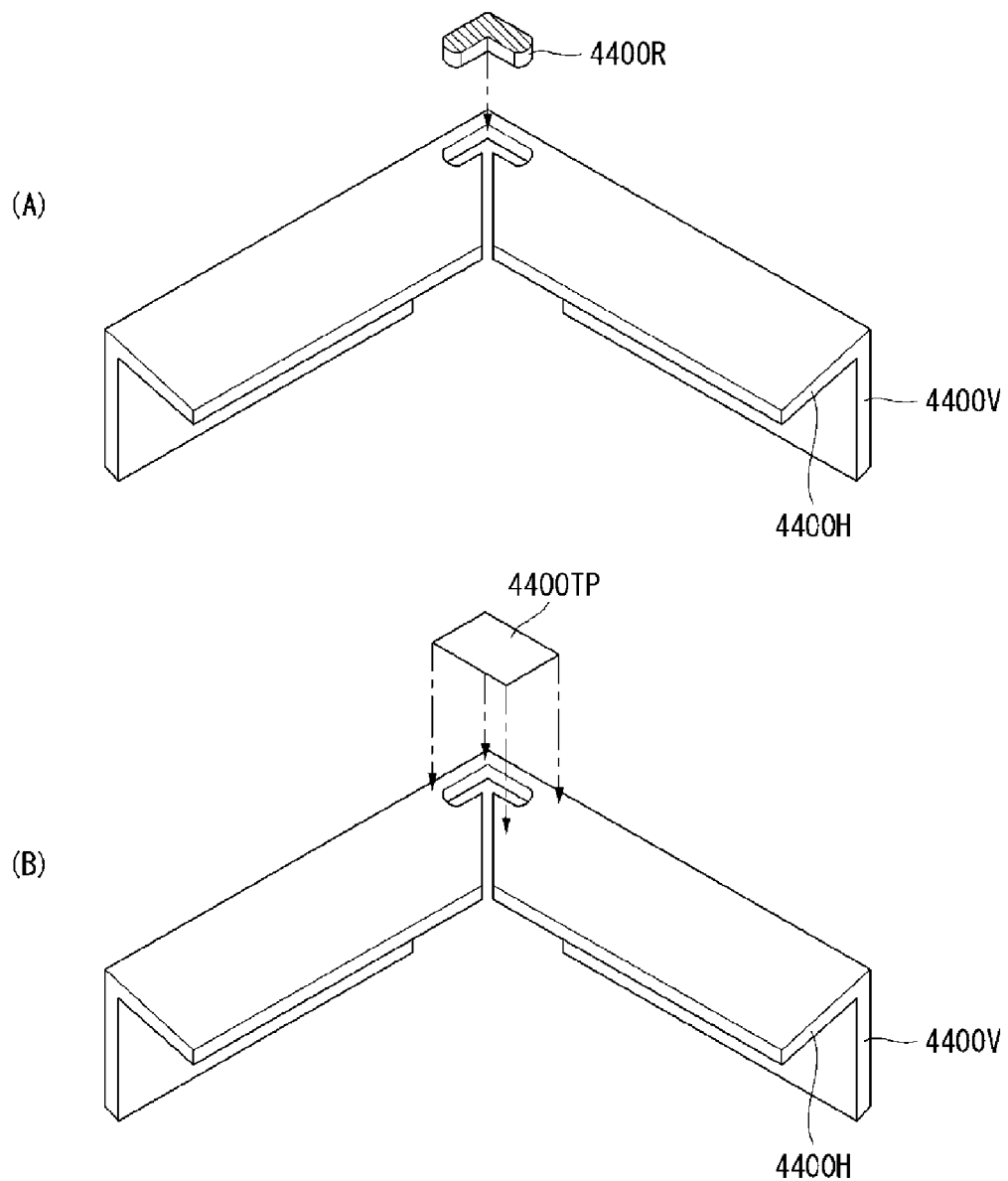

As shown in FIG. 82(A), a cover 4400R may be disposed in the hole H100 of the horizontal part 4400H of the side cover 4400. The cover 4400R may be formed of a resin material, a silicon material, etc. Other materials may be used for the cover 4400R. The cover 4400R may be inserted into the hole H100.

Alternatively, as shown in FIG. 82(B), a tape type cover 4400TP may be disposed in the bending area of the side cover 4400. In this instance, the black tape type cover 4400TP may be attached to the bending area of the side cover 4400, thereby covering the hole H100.

Figure 83:
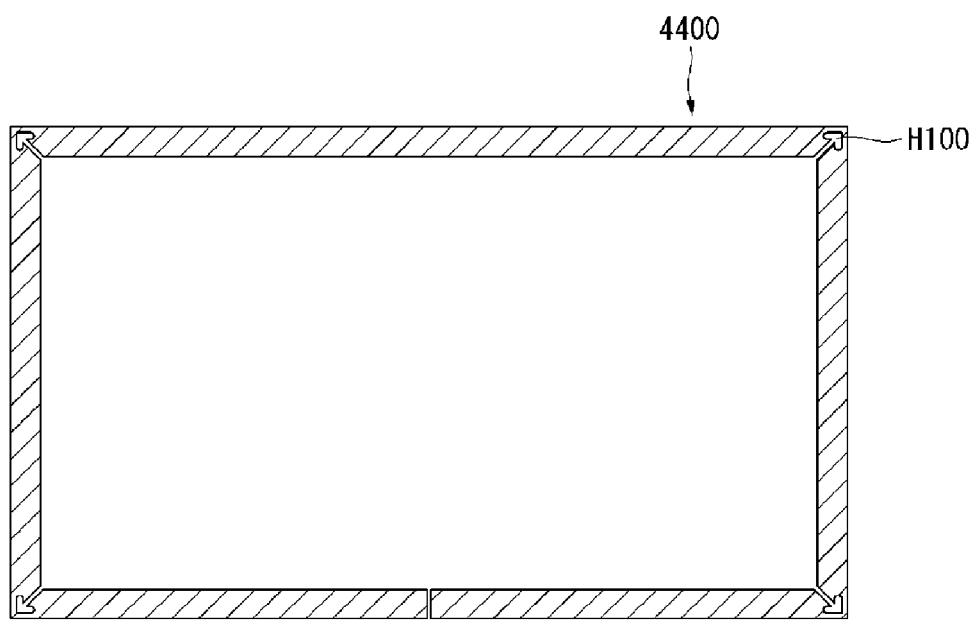

As shown in FIG. 83, the hole H100 of the horizontal part 4400H of the side cover 4400 may correspond to the corner of the display panel 100.

The vertical part 4400V of the side cover 4400 may include a portion having different widths.

Figure 84:
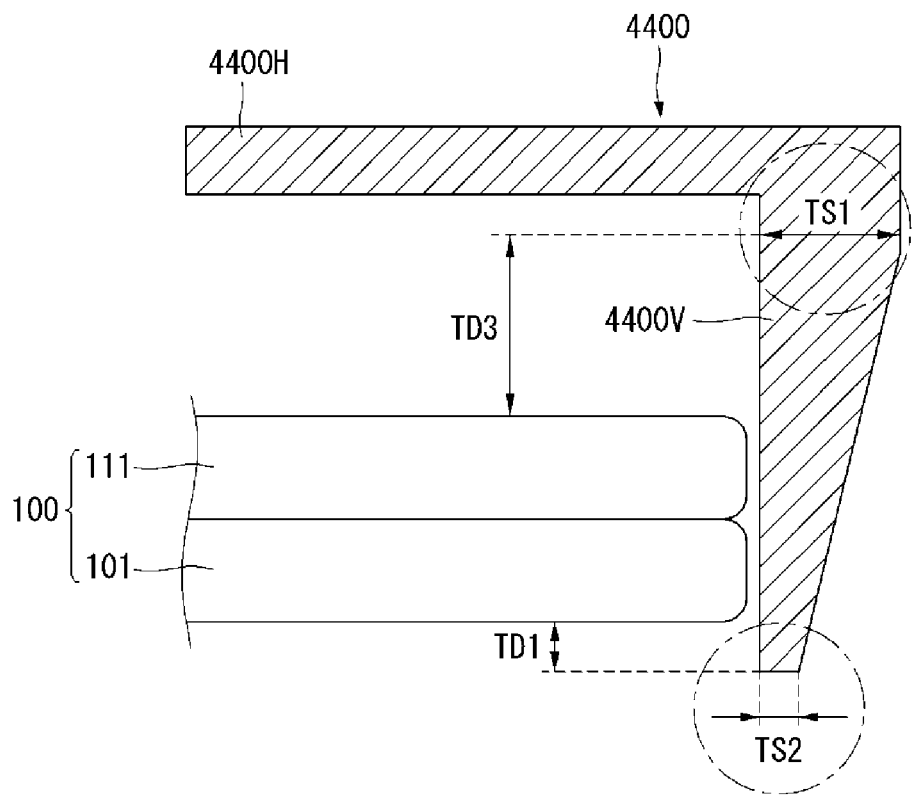

For example, as shown in FIG. 84, the vertical part 4400V of the side cover 4400 may include a portion having a gradually decreasing width as it goes to the rear of the display panel 100.

More specifically, in the vertical part 4400V of the side cover 4400, a width TS2 of a portion extending further than the front substrate 101 to the front of the front substrate 101 may be less than a width TS1 of a portion extending further than the back substrate 111 to the rear of the back substrate 111. In other words, in the vertical part 4400V of the side cover 4400, the width TS2 of the portion protruding further than the front substrate 101 to the front of the front substrate 101 by a predetermined distance TD1 may be less than the width TS1 of the portion protruding further than the back substrate 111 to the rear of the back substrate 111 by a predetermined distance TD3.

In this instance, a visual effect, in which the viewer in the front of the display panel 100 may feel that the size of the edge of the display panel 100 is less than the real size of the edge of the display panel 100, may be obtained. Further, the strength of the side cover 4400 may be further improved.

Figure 85:
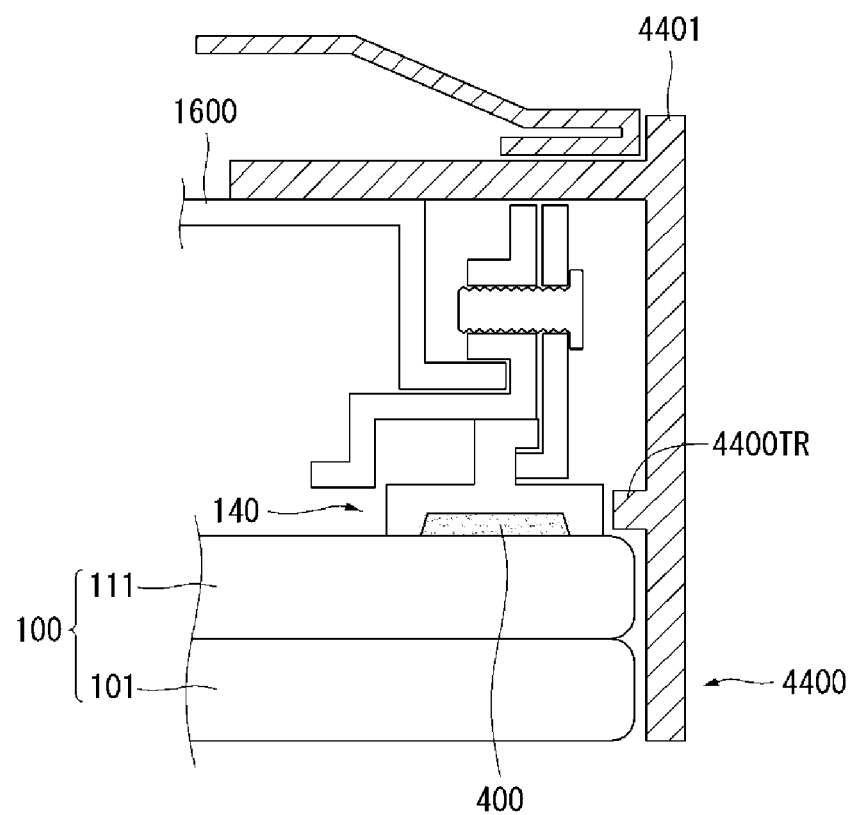

As shown in FIG. 85, the vertical part 4400V of the side cover 4400 may include a protrusion 4400TR protruding to the middle of the display panel 100. The protrusion 4400TR may prevent light from leaking in a space between the display panel 100 and the side cover 400.

The protrusion 4400TR may be positioned between the display panel 100 and the horizontal parts 4400H of the side cover 4400. Preferably, the protrusion 4400TR may be positioned at a location overlapping the bracket 140 in the longitudinal direction of the display panel 100.

Figure 86:
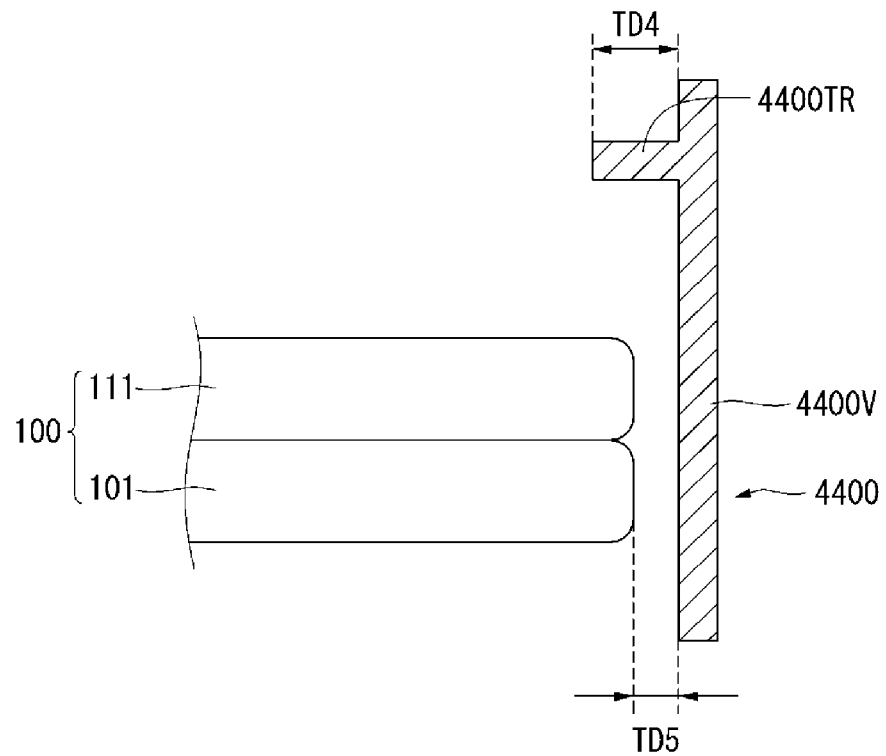

As shown in FIG. 86, a length TD4 of the protrusion 4400TR may be greater than a distance TD5 between the display panel 100 and the side cover 4400.

Figure 87:
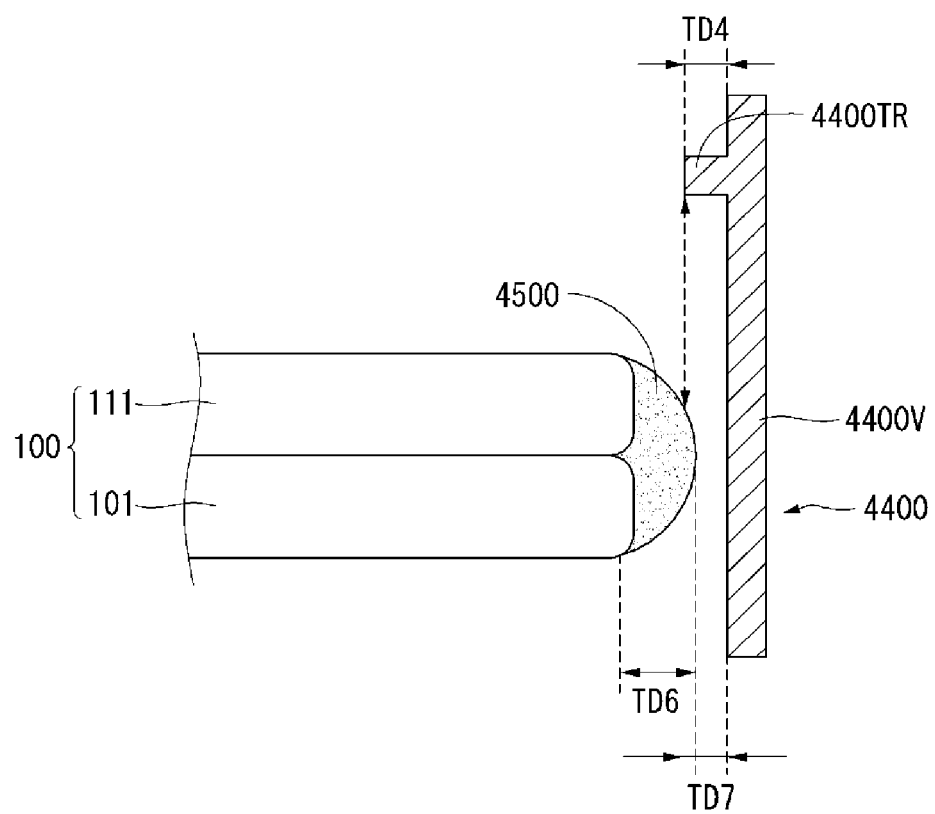

Alternatively, as shown in FIG. 87, the length TD4 of the protrusion 4400TR may be greater than a distance TD7 between the protective layer 4500 positioned on the side of the display panel 100 and the side cover 4400. Further, the length TD4 of the protrusion 4400TR may be less than a length TD6 of the protective layer 4500 in the longitudinal direction of the display panel 100. In this instance, an end of the protrusion 4400TR may overlap the protective layer 4500 in the width direction of the display panel 100.

Figure 88:
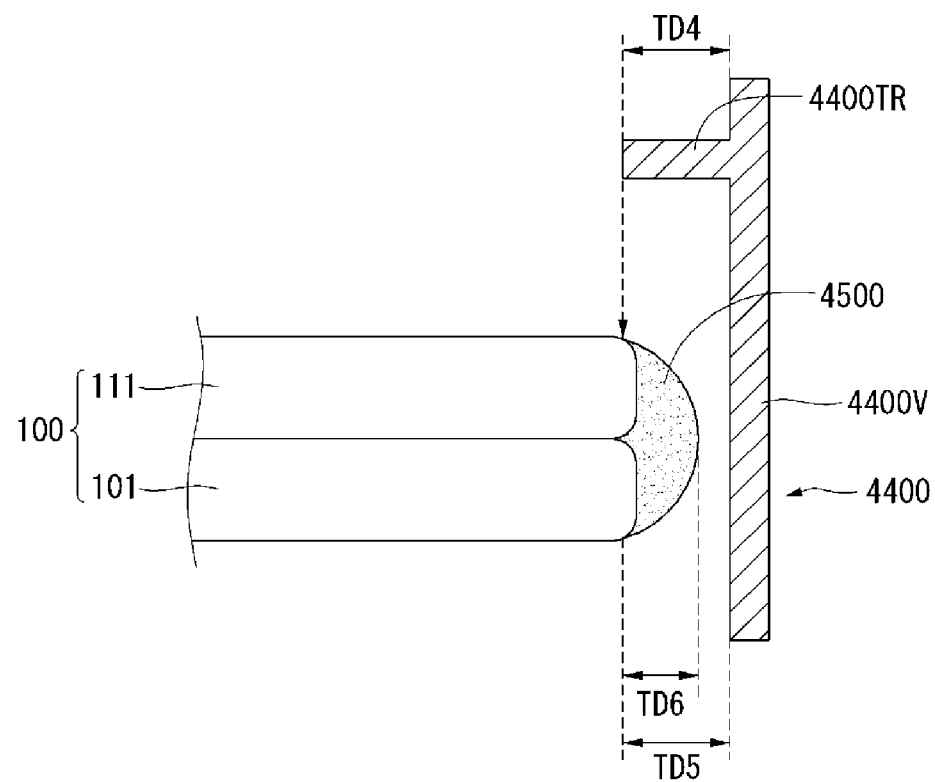

Alternatively, as shown in FIG. 88, the length TD4 of the protrusion 4400TR may be greater than the length TD6 of the protective layer 4500 in the longitudinal direction of the display panel 100. Further, the length TD4 of the protrusion 4400TR may be greater than a sum (TD7+TD6) of a distance TD7 between the protective layer 4500 and the side cover 4400 and the length TD6 of the protective layer 4500 in the longitudinal direction of the display panel 100. In this instance, an end of the protrusion 4400TR may overlap the display panel 100 in the width direction of the display panel 100.

Figure 89:
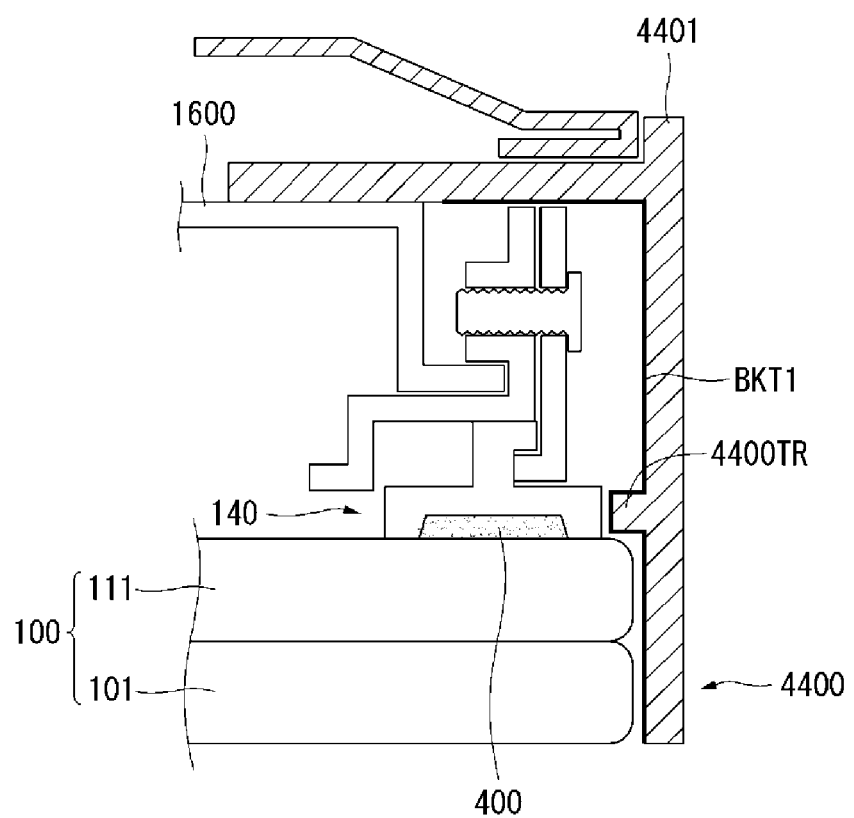

As shown in FIG. 89, a first black layer BKT1 may be formed on the inner surface of the side cover 4400. The first black layer BKT1 may be formed of a black tape or a black paint. In this instance, the first black layer BKT1 may further prevent light from leaking in the space between the display panel 100 and the side cover 400.

Figure 90:
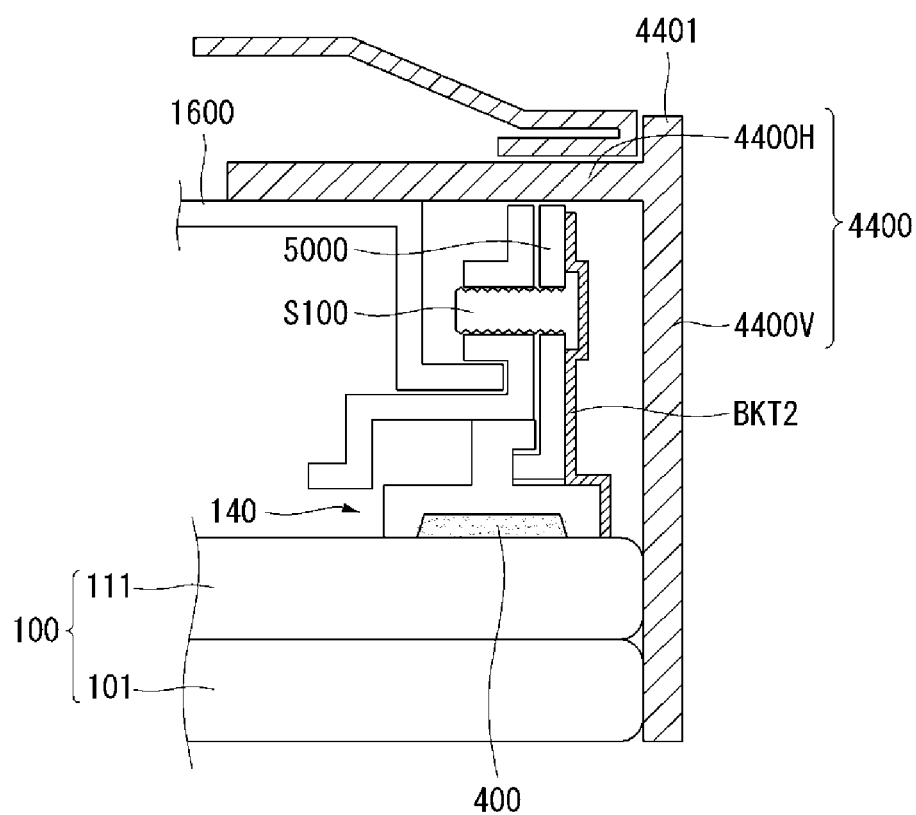

Alternatively, as shown in FIG. 90, a second black layer BKT2 may be formed on the bracket 140 and/or the connection frame 5000. Preferably, the second black layer BKT2 may be a black tape attached to the bracket 140 and the connection frame 5000. The second black layer BKT2 may cover a space between the bracket 140 and the connection frame 5000. Hence, the second black layer BKT2 may prevent light generated in the light source from leaking in the space between the display panel 100 and the side cover 400.

Further, the second black layer BKT2 may include a portion attached to the back substrate 111. In this instance, the second black layer BKT2 may cover a space between the connection frame 5000 and the back substrate 111 and a space between the bracket 140 and the back substrate 111. Hence, the second black layer BKT2 may prevent light generated in the light source from leaking in the space between the display panel 100 and the side cover 400.

The second black layer BKT2 may include a portion contacting a fastening member S100 for connecting the connection frame 5000 to the auxiliary bracket 4800.

In the embodiment of the invention, the side cover 400 may be divided into a plurality of parts. In other words, the plurality of parts may be combined with one another to manufacture the side cover 400.

Figure 91:
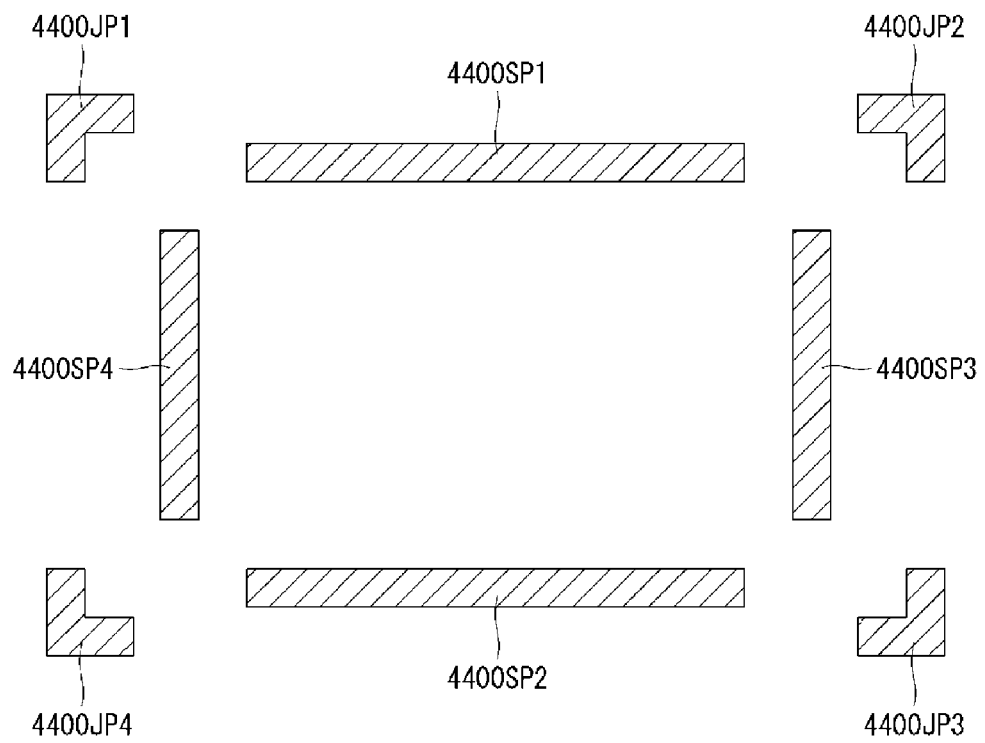

For example, as shown in FIG. 91, a first side cover part 4400SP1, a second side cover part 4400SP2, a third side cover part 4400SP3, and a fourth side cover part 4400SP4 may be manufactured through the extrusion process. The first to fourth side cover parts 4400SP1, 4400SP2, 4400SP3, and 4400SP4 may be connected to one another using first to fourth connection parts 4400JP1, 4400JP2, 4400JP3, and 4400JP4.

Figure 92:
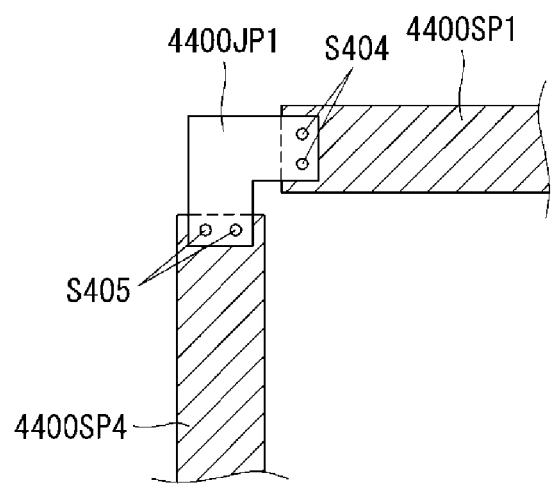

More specifically, as shown in FIG. 92, the first side cover part 4400SP1 may be connected to the first connection part 4400JP1 using a predetermined fastening member S404, and the fourth side cover part 4400SP4 may be connected to the first connection part 4400JP1 using a predetermined fastening member S405. Hence, the first side cover part 4400SP1 may be connected to the fourth side cover part 4400SP4.

In addition to the extrusion method, any method may be used to manufacture the side cover 4400 as long as the thickness of the side cover 4400 is sufficiently reduced. For example, a die casting method may be used.

It may be preferable that the side cover 4400 is manufactured using the extrusion method in consideration of the simple manufacturing process, the manufacturing cost, etc.

Figure 93:
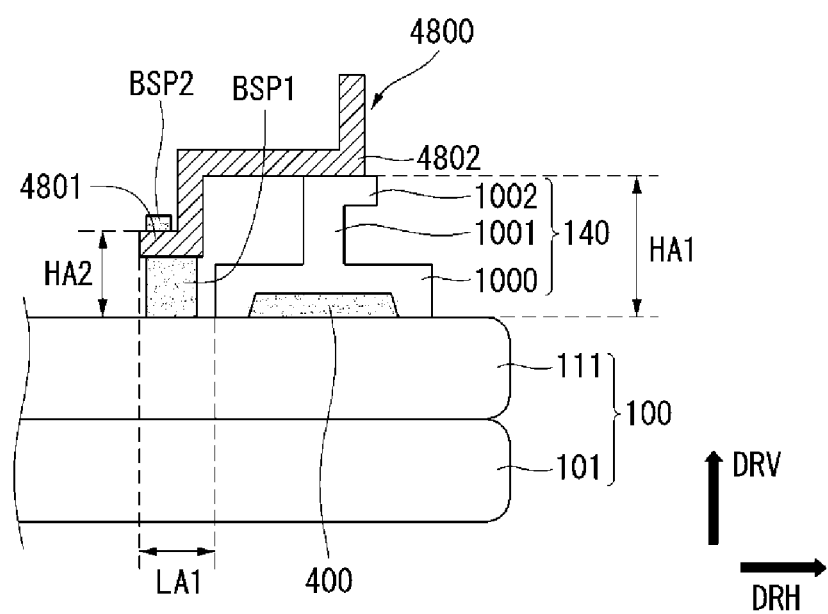

As shown in FIG. 93, a first buffer BSP1 may be disposed between the auxiliary bracket 4800 and the back substrate 111. The first buffer BSP1 may contain a material having the elasticity such as a resin material and a silicon material. The first buffer BSP1 may prevent a foreign material such as dust from being penetrated into the display panel 100. Another example material for the buffer is a foam like material.

The first buffer BSP1 may contact each of the auxiliary bracket 4800 and the back substrate 111.

Further, a second buffer BSP2 may be disposed on the auxiliary bracket 4800. The second buffer BSP2 may be disposed on the low altitude part 4801 of the auxiliary bracket 4800.

Figure 94:
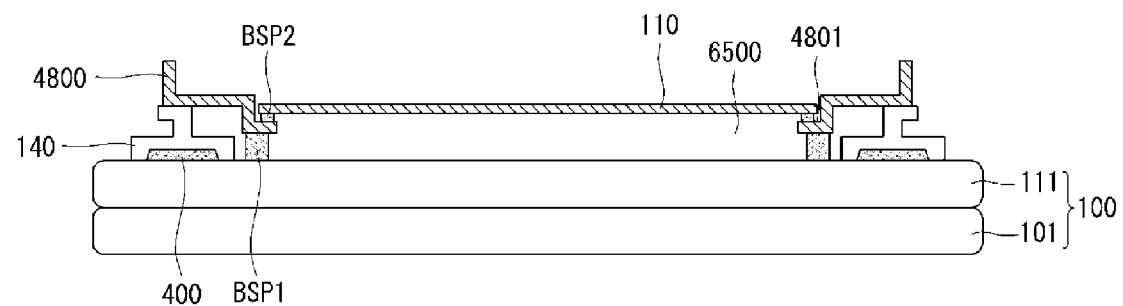

As shown in FIG. 94, the second buffer BSP2 may be disposed between the auxiliary bracket 4800 and the optical layer 110. Namely, the optical layer 110 may be positioned on the second buffer BSP2. In this instance, the movement of the optical layer 110 may be efficiently controlled.

In other words, the first buffer BSP1 may be disposed under the low altitude part 4801 of the auxiliary bracket 4800, and the second buffer BSP2 may be disposed on the low altitude part 4801 of the auxiliary bracket 4800.

Figure 95:
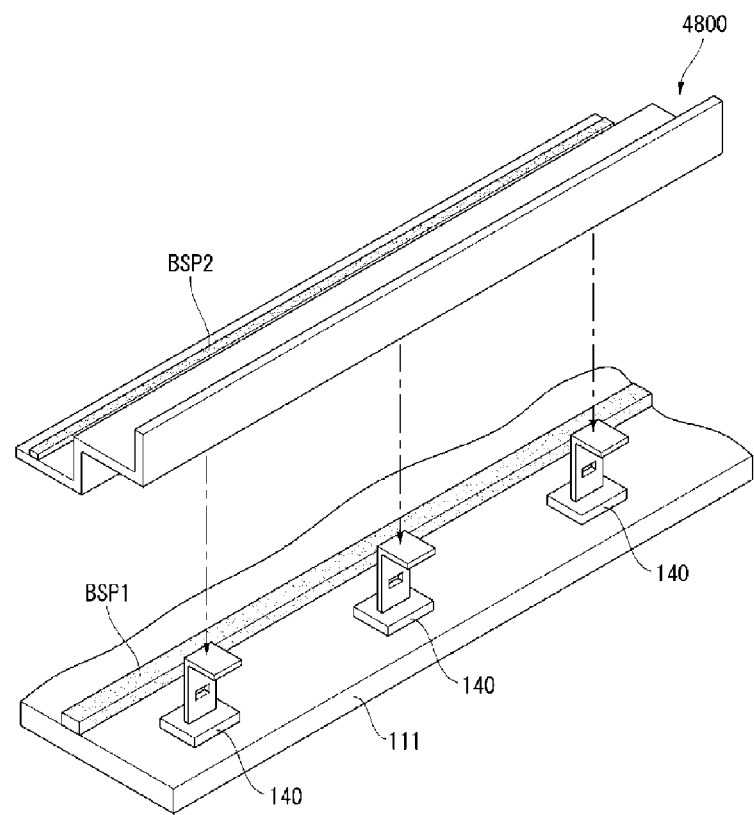

The disposition of the first and second buffers BSP1 and BSP2 is schematically shown in FIG. 95.

Figure 96:
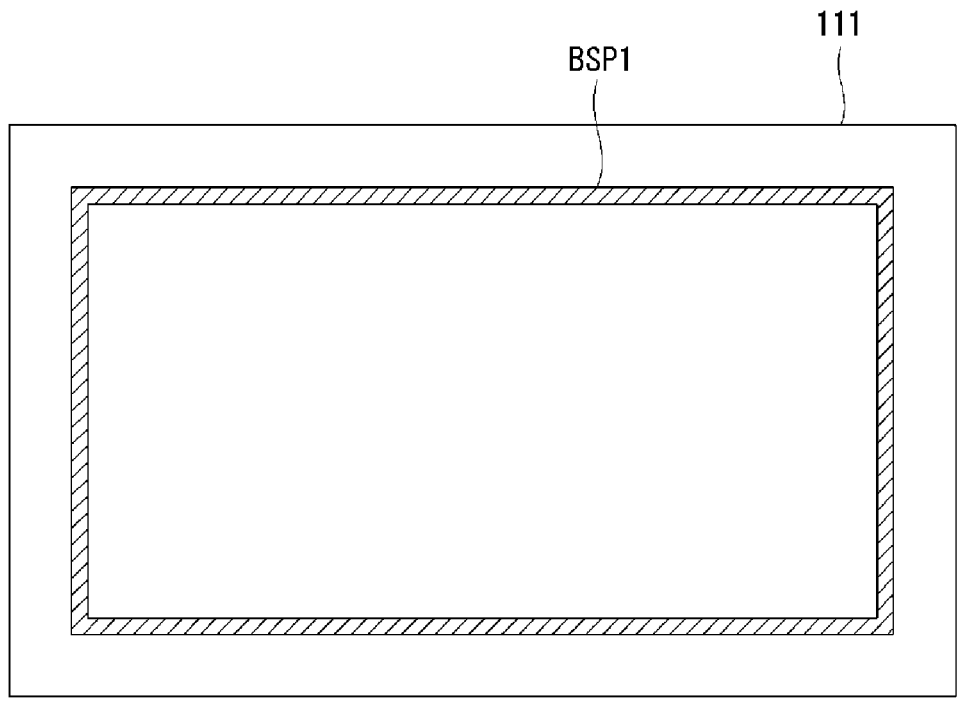

As shown in FIG. 96, the first buffer BSP1 may have a rectangular frame shape. In this instance, the first buffer BSP1 may more efficiently prevent the foreign material such as dust from being penetrated into the display panel 100.

Figure 97:
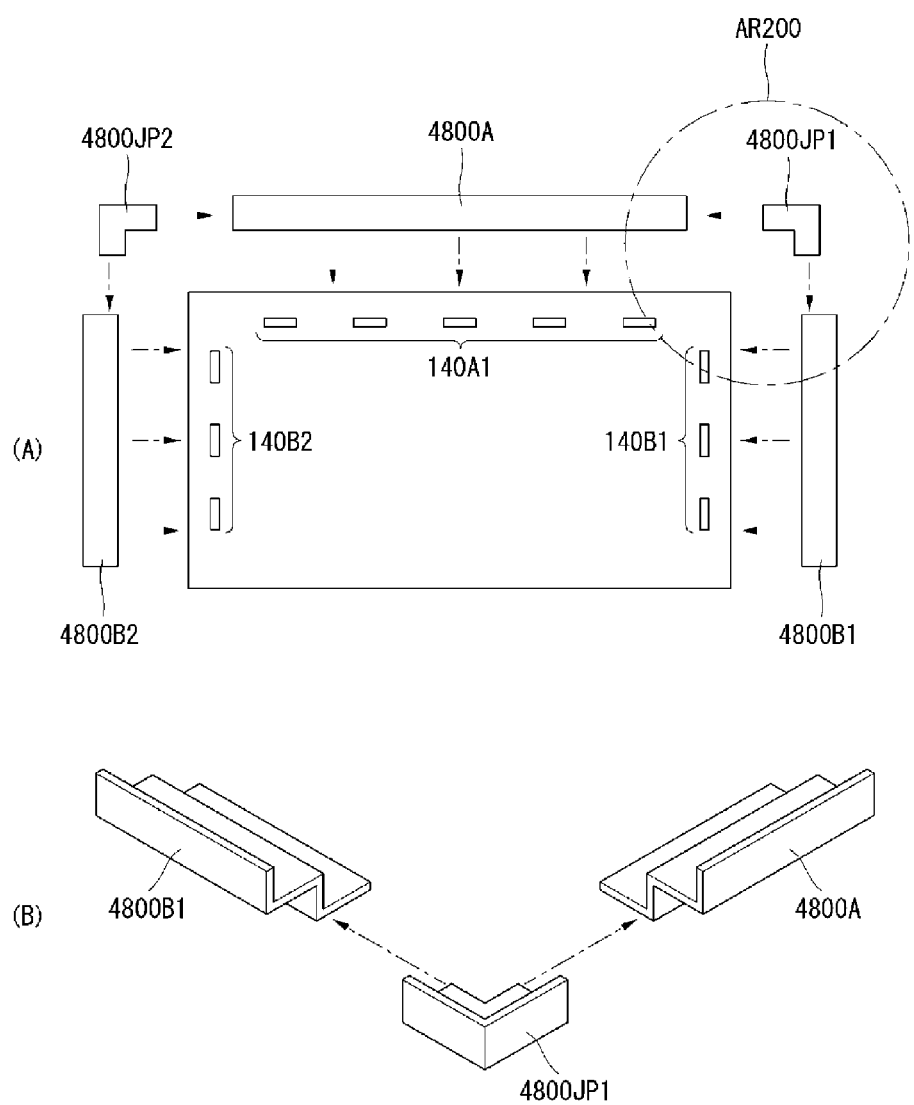

As shown in FIG. 97(A), the auxiliary bracket 4800 may be divided into a plurality of parts.

For example, a transverse auxiliary bracket 4800A corresponding to the transverse brackets 140A1 and 140A2 may be formed, a first longitudinal auxiliary bracket 4800B1 corresponding to the first longitudinal bracket 140B1 may be formed, and a second longitudinal auxiliary bracket 4800B2 corresponding to the second longitudinal bracket 140B2 may be formed.

Further, the connection parts 4800JP1 and 4800JP2 may be disposed between the two auxiliary brackets 4800. For example, the first connection part 4800JP1 may be disposed between the transverse auxiliary bracket 4800A and the first longitudinal auxiliary bracket 4800B1, and the second connection part 4800JP2 may be disposed between the transverse auxiliary bracket 4800A and the second longitudinal auxiliary bracket 4800B2.

For example, as shown in FIG. 97(B), the first connection part 4800JP1 may be connected to the transverse auxiliary bracket 4800A and the first longitudinal auxiliary bracket 4800B1, thereby preventing light from leaking in a space between the transverse auxiliary bracket 4800A and the first longitudinal auxiliary bracket 4800B1.

The shapes of the connection parts 4800JP1 and 4800JP2 may be variously changed. For example, the connection parts 4800JP1 and 4800JP2 may be formed of plastic.

Alternatively, although not shown, the connection parts 4800JP1 and 4800JP2 may be a black tape. In this instance, the black connection tapes 4800JP1 and 4800JP2 may be attached to the two auxiliary brackets 4800, thereby preventing light from leaking in a space between the two auxiliary brackets 4800.

Figure 98:
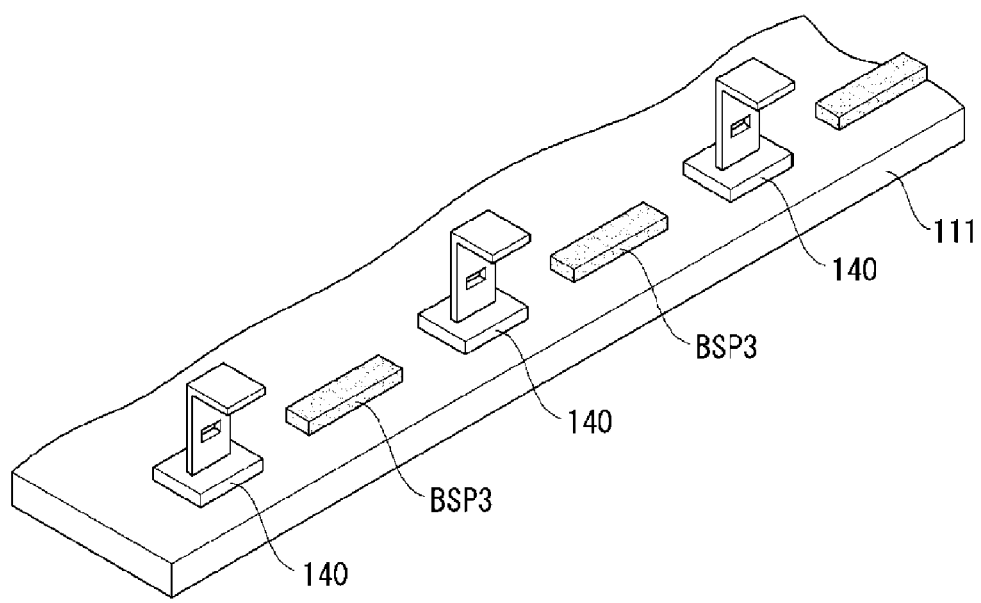

As shown in FIG. 98, a third buffer BSP3 may be disposed between the two adjacent brackets 140. The third buffer BSP3 may contain a material having the elasticity such as a resin material and a silicon material. The third buffer BSP3 may prevent light from leaking in a space between the two adjacent brackets 140.

Figure 99:
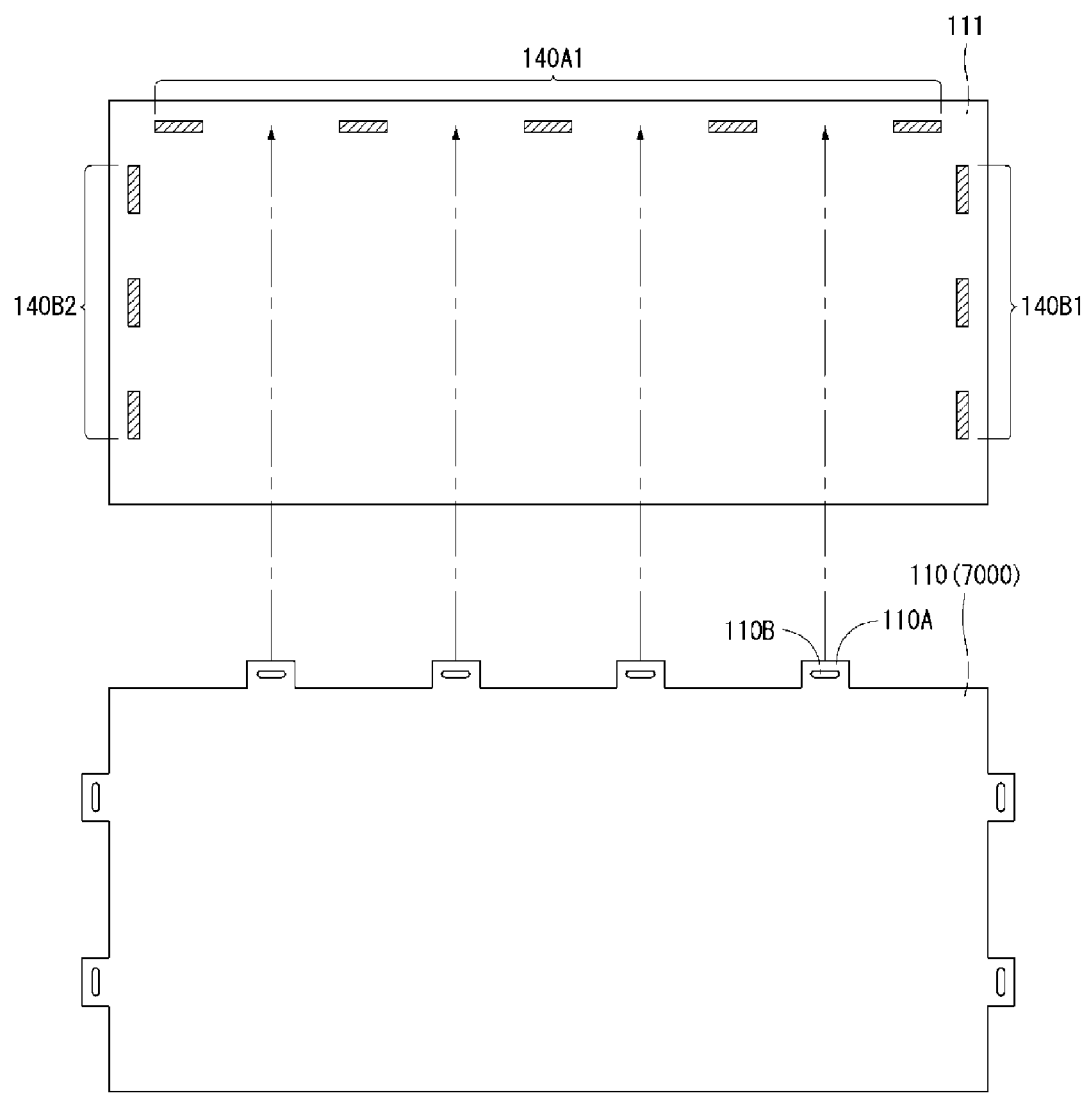

The optical layer 110 and/or the light guide plate 7000 may have at least one hole. FIG. 99 shows that the optical layer 110 has at least one hole 1108. Although not shown, the light guide plate 7000 may have at least one hole 1108.

For example, as shown in FIG. 99, the optical layer 110 and/or the light guide plate 7000 may have the plurality of holes 1108. Each of the plurality of holes 1108 may correspond to an area between the two adjacent brackets 140.

Preferably, the optical layer 110 and/or the light guide plate 7000 may have a protrusion 110A protruding to the outside, and the hole 1108 may be formed in the protrusion 110A. In other words, a formation area of the hole 1108 may extend further than other areas of the optical layer 110 and/or the light guide plate 7000 to the outside.

Figure 100:
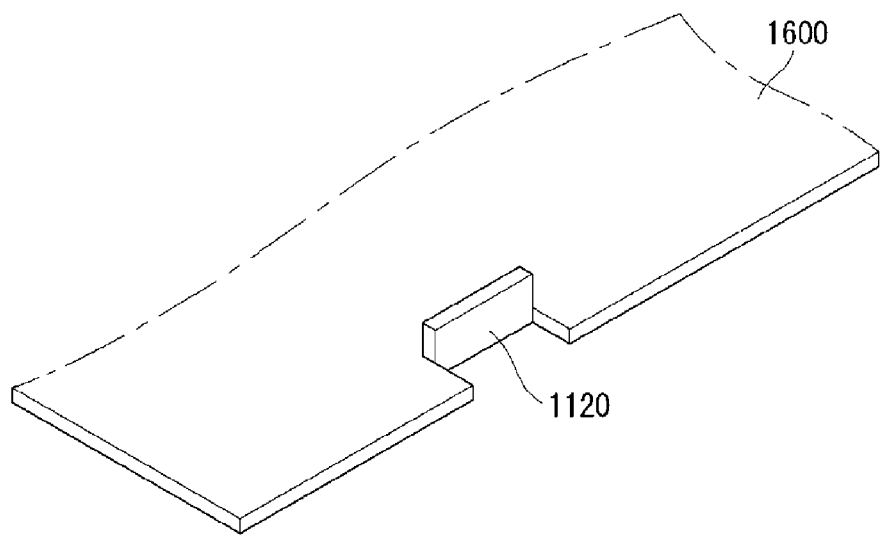

As shown in FIG. 100, the frame 1600 may include a protrusion 1120 corresponding to the hole 1108 of the optical layer 110 and/or the light guide plate 7000. More specifically, the frame 1600 may include the protrusion 1120, which corresponds to the hole 1108 of the optical layer 110 and/or the light guide plate 7000 and protrudes to the display panel 100.

Figure 101:
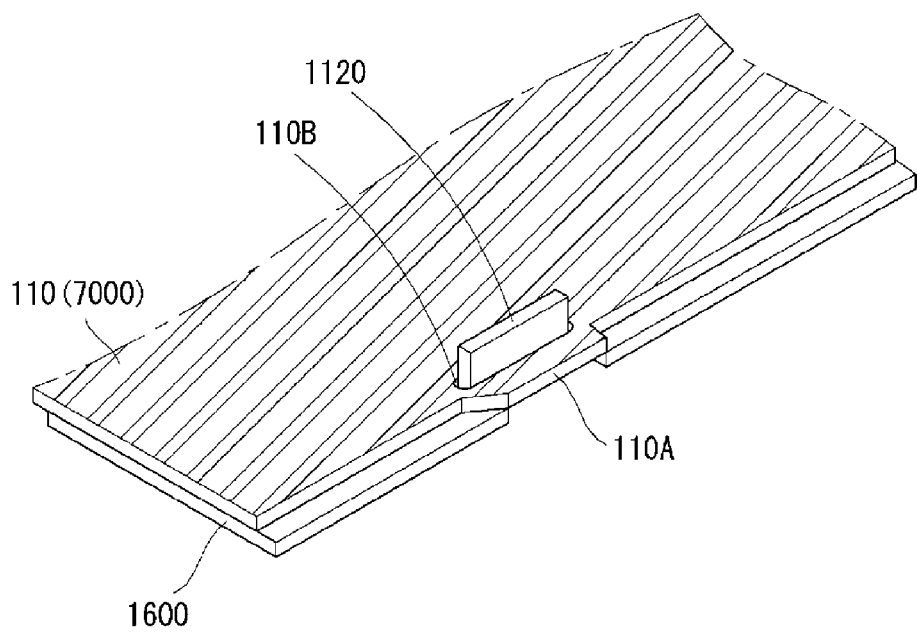

As shown in FIG. 101, the optical layer 110 and/or the light guide plate 7000 may be disposed on the frame 1600, so that the hole 1108 corresponds to the protrusion 1120 of the frame 1600. Hence, the protrusion 1120 of the frame 1600 may pass through the hole 1108 of the optical layer 110 and/or the light guide plate 7000.

As above, when the hole 1108 is disposed in the protrusion 110A of the optical layer 110 and/or the light guide plate 7000 at a location corresponding to the protrusion 1120 of the frame 1600, the entire size of the optical layer 110 and/or the light guide plate 7000 may be prevented from excessively increasing and the separation of the optical layer 110 and/or the light guide plate 7000 from the frame 1600 may be prevented.

In this instance, the protrusion 110A of the optical layer 110 and/or the light guide plate 7000 may be exposed through the side of the frame 1600. In other words, when the user sees the side of the frame 1600 in a state where the display panel 100, the optical layer 110 and/or the light guide plate 7000, and the frame 1600 are combined with one another, the user may see the protrusion 110A of the optical layer 110 and/or the light guide plate 7000.

Figure 102:
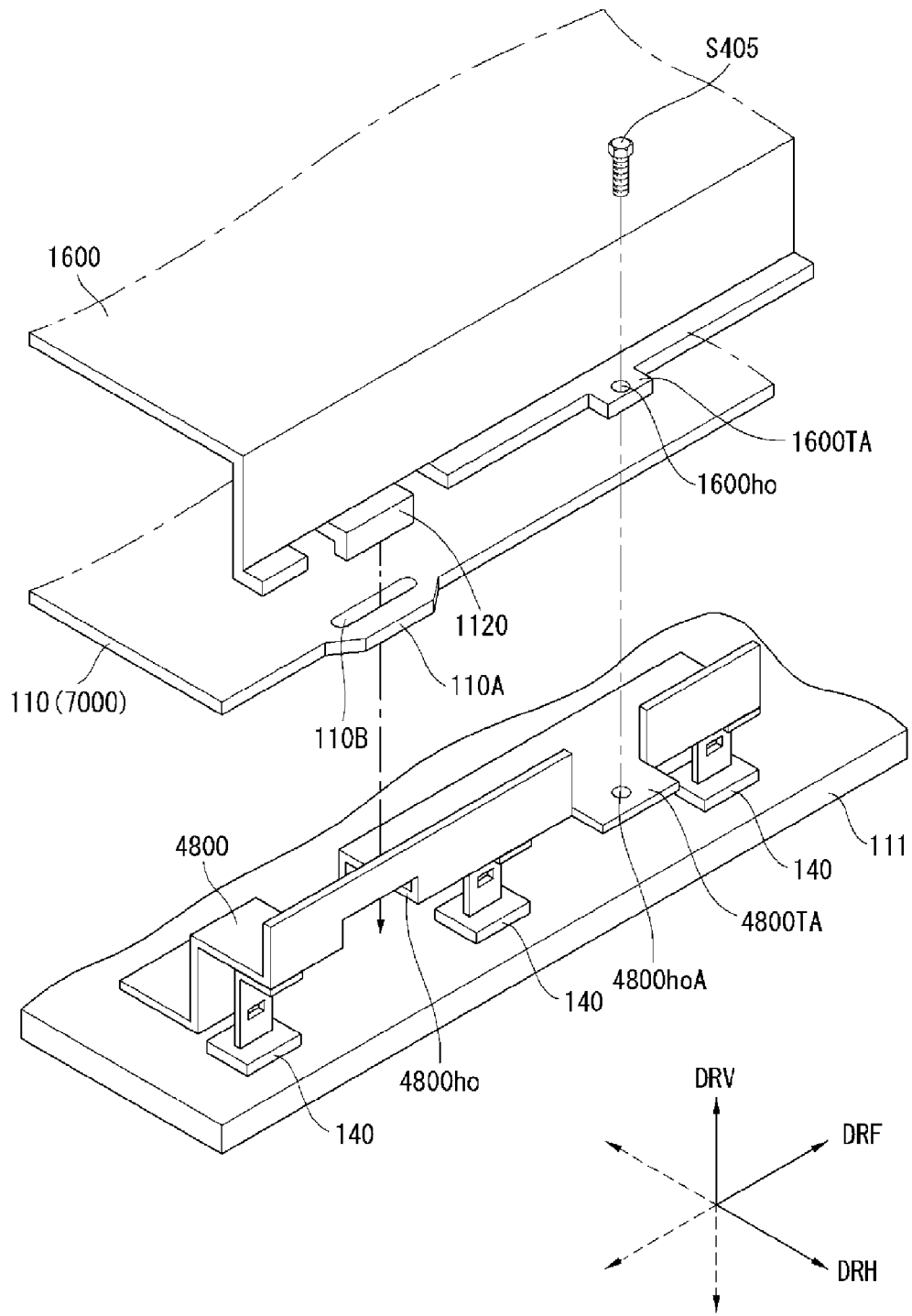

As shown in FIG. 102, the auxiliary bracket 4800 may have at least one hole 4800ho corresponding to a combined part between the optical layer 110 and/or the light guide plate 7000 and the frame 1600 (i.e., the protrusion 110A of the optical layer 110 and/or the light guide plate 7000). The protrusion 110A of the optical layer 110 and/or the light guide plate 7000 may mean a formation portion of the hole 110B.

The at least one auxiliary bracket 4800 includes a side wall 4800SW which extends in a first direction DRF. And, the at least one auxiliary bracket 4800 includes a plurality of second tab portions 4800TA with openings 4800hoA.

The frame 1600 includes a plurality of third tab portions 1600TA with openings 1600ho. And, the second and third tab portions 4800TA, 1600TA being aligned with each other such that the holes 4800hoA, 1600ho are configured to receive screws S405 to fasten the at least one auxiliary bracket 4800 and the frame 1600 to each other.

More detail, the frame 1600 includes a flange FLA at the periphery of the frame 1600, and flange FLA extend in the first direction DRF.

The first directions DRF and the second directions DRH being perpendicular to each other, and the first directions DRF and the third directions DRV being perpendicular to each other. In other word, the first directions DRF may be referred to as Z-axis direction, the second directions DRH may be referred to as X-axis direction, and the third directions DRV may be referred to as Y-axis directions.

As above, when the auxiliary bracket 4800 has the hole 4800ho corresponding to the protrusion 110A of the optical layer 110 and/or the light guide plate 7000, the size of the non-display area of the display panel 100 may be further reduced.

Figure 103:
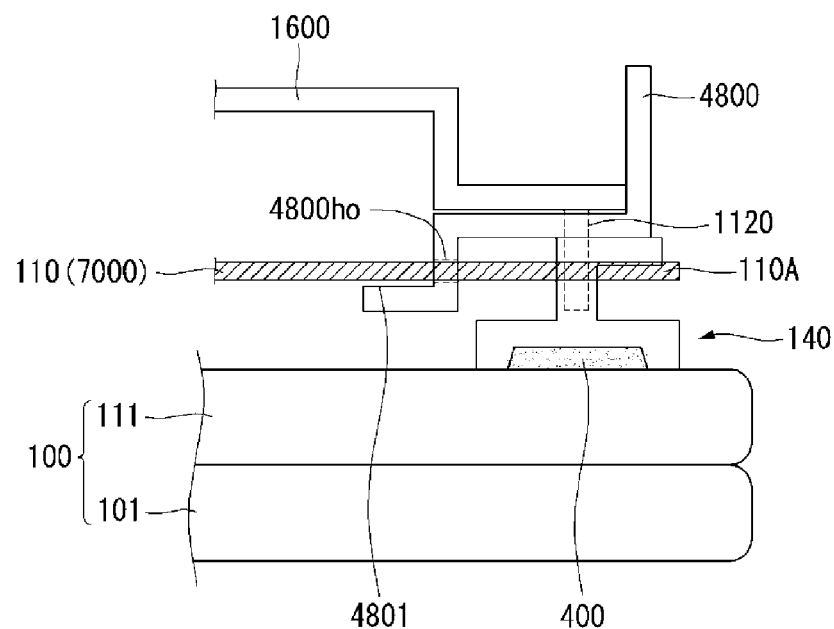

As shown in FIG. 103, the protrusion 110A of the optical layer 110 and/or the light guide plate 7000 may pass through the hole 4800ho of the auxiliary bracket 4800 and may protrude further than the bracket 140 in the direction away from the middle of the display panel 100. In other words, the optical layer 110 and/or the light guide plate 7000 may include a portion protruding further than the bracket 140 in the direction away from the middle of the display panel 100.

Figure 104:
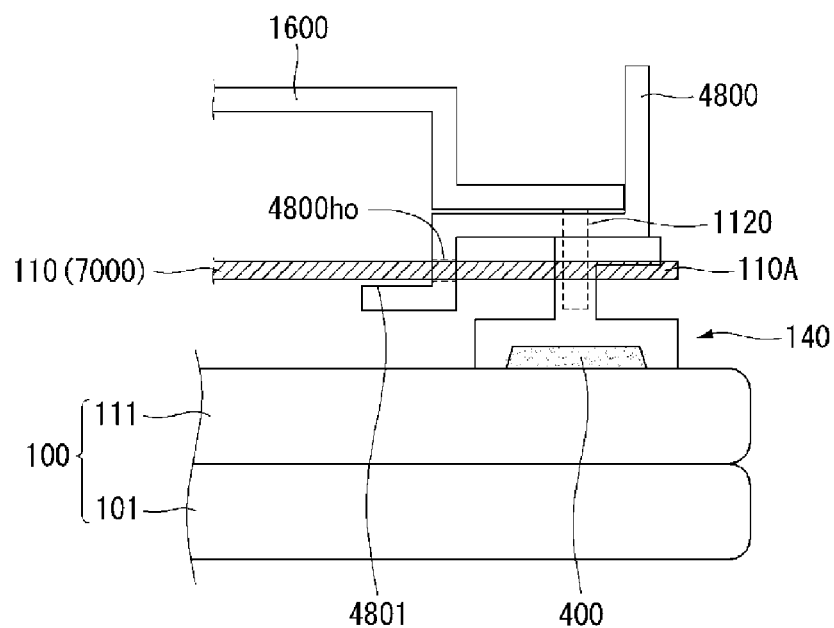

Alternatively, as shown in FIG. 104, an end of the protrusion 110A of the optical layer 110 and/or the light guide plate 7000 may be positioned between the bracket 140 and the auxiliary bracket 4800 in the longitudinal direction of the display panel 100.

Figure 105:
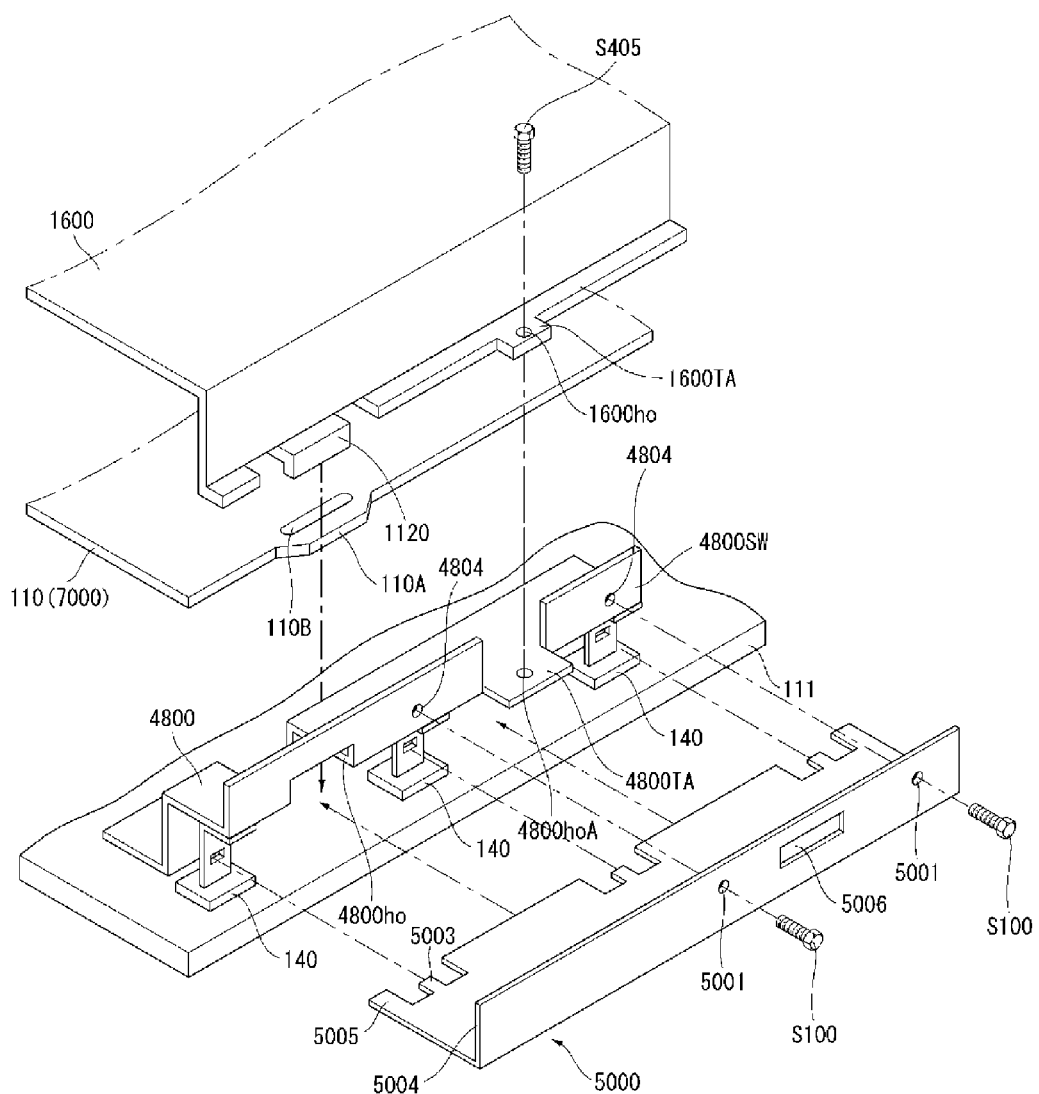

As shown in FIG. 105, the connection frame 5000 may include a plurality of a first portion 5003 inserted into the hole of the bracket 140, a second portion 5004 fastened to the auxiliary bracket 4800 using the fastening member S100, and a third portion 5005 positioned parallel to the first portion 5003 in an area between the two adjacent brackets 140. The first portion 5003 and the third portion 5005 may be parallel to the longitudinal direction of the display panel 100, and the second portion 5004 may be parallel to the width direction of the display panel 100.

The first portion 5003 of the connection frame 5000 may be referred to as a first tab portion, the second portion 5004 of the connection frame 5000 may be referred to as the side wall.

Figure 38:
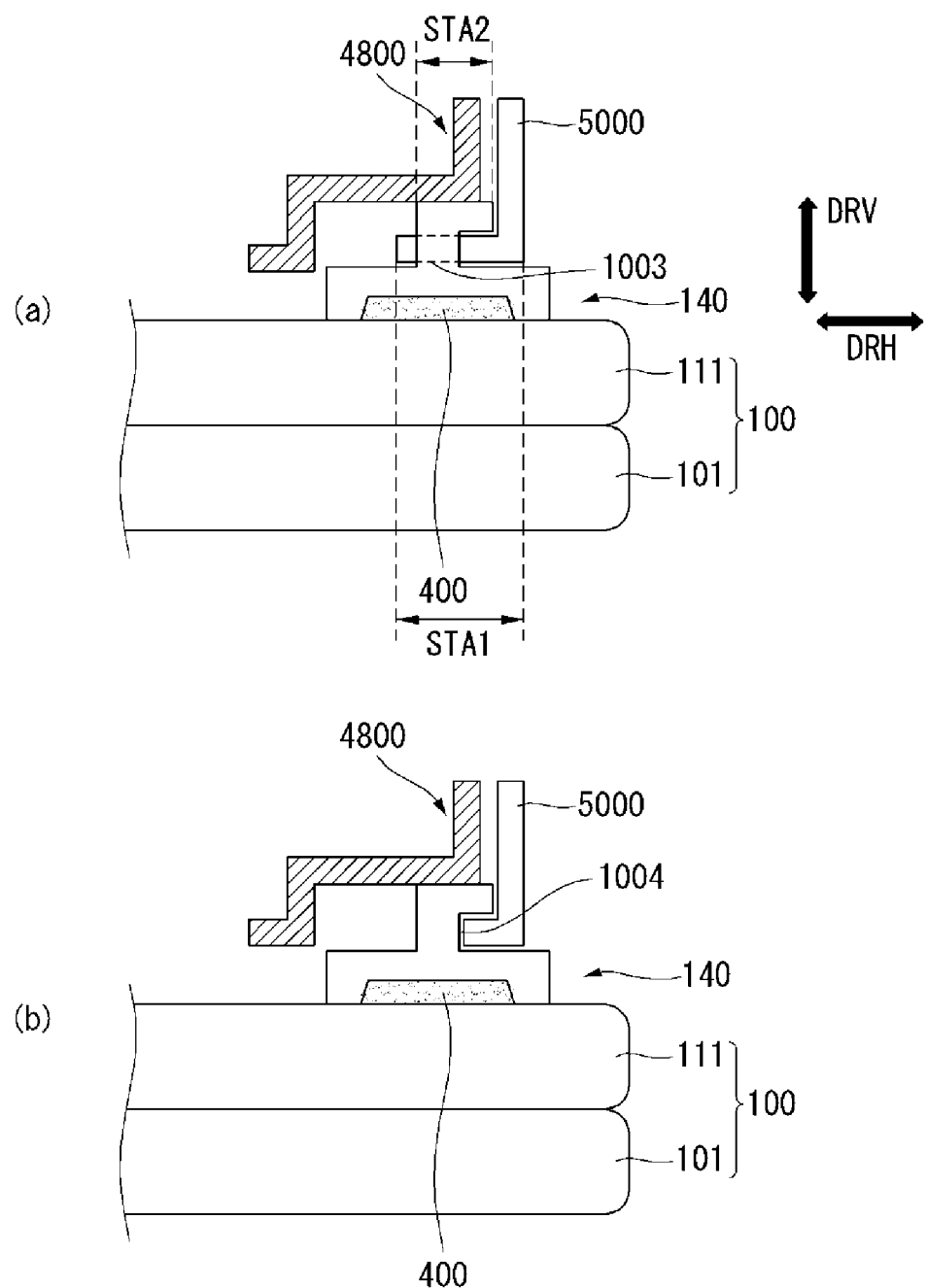

In other word, at least one connection frame 5000 have the side wall 5004 extending in the first direction DRF and a plurality of first tab portions 5003 extending in the second direction DRH, and as shown in FIG. 38 (A) the first tab portion 5003 being provided into the opening of the bracket 140.

The side wall 4800SW of the auxiliary bracket 4800 is extended in parallel with the side wall 5004 of the at least one connection frame 5000.

And, the side walls 4800SW of the at least one auxiliary bracket 4800 and the side walls 5004 of the at least one connection frame 5000 include a plurality of holes 4804, 5006 to receive screws S100 to fasten the at least one auxiliary bracket 4800 and the at least on connection frame 5000 to each other.

The frame 1600 includes a flange FLA at the periphery of the frame 1600, and flange FLA extend in the first direction DRF such that a surfaces of the flange FLA and the first tab portions 5003 of the at least one connection frame 5000 are parallel to each other.

Figure 110:
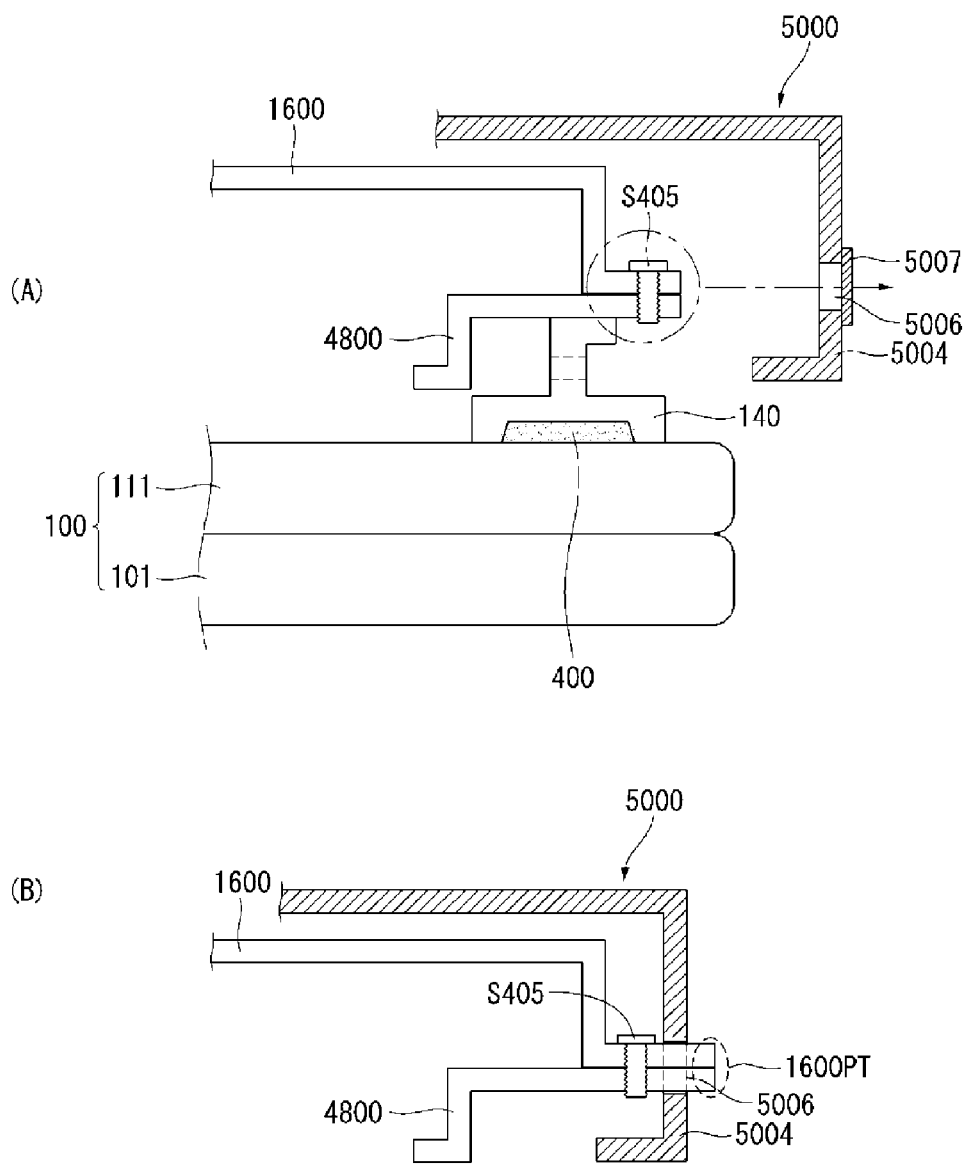

And, as shown in FIGS. 105 and 110 (B), the at least one connection frame 5000 includes a plurality of openings 5006 at locations where the second and third tab portions 1600TA, 4800TA are inserted into the opening 5006 of the second and third tab portions 1600TA, 4800TA such that the second and third tab portions 1600TA, 4800TA protrude through the openings 5006 of the at least one connection frame 5000 (see area 1600PT).

The third portion 5005 may be positioned in the area between the two adjacent brackets 140. Hence, the third portion 5005 may include a portion positioned between the auxiliary bracket 4800 and the back substrate 111.

The third buffer BSP3 shown in FIG. 98 may be disposed between the third portion 5005 of the connection frame 5000 and the back substrate 111.

Figure 106:
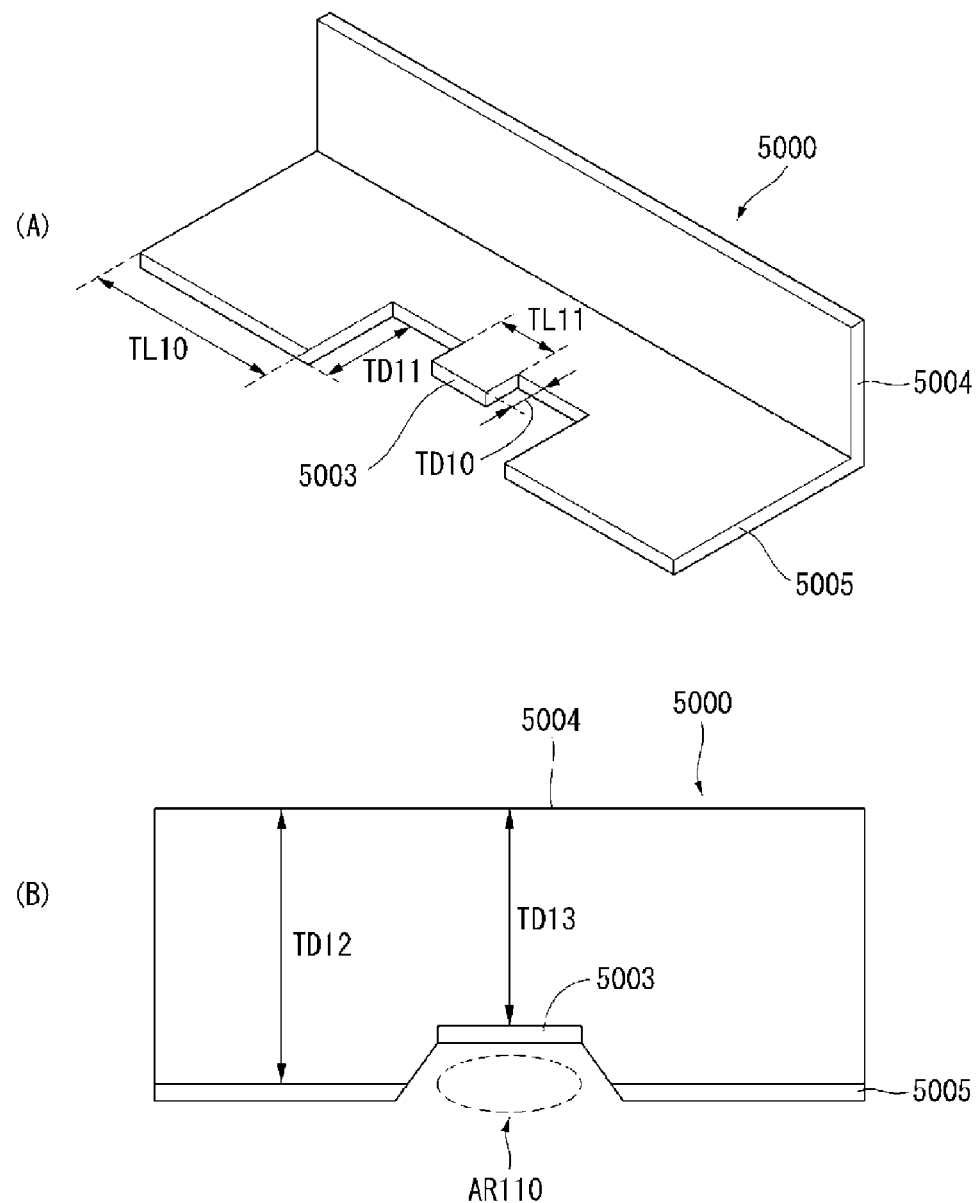

As shown in FIG. 106(A), a length TD11 of the third portion 5005 of the connection frame 5000 may be longer than a length TD10 of the first portion 5003. Further, a width TL10 of the third portion 5005 of the connection frame 5000 may be greater than a width L11 of the first portion 5003.

The third portion 5005 of the connection frame 5000 may be close to or adjacent to the back substrate 111. On the other hand, because the first portion 5003 of the connection frame 5000 is inserted into the hole of the bracket 140, a distance between the first portion 5003 and the back substrate 111 may be relatively large. Hence, as shown in FIG. 106(B), a height TD12 of the second portion 5004 in the area corresponding to the third portion 5005 may be greater than a height TD13 of the second portion 5004 in the area corresponding to the first portion 5003.

In FIG. 106(B), a lower portion AR110 of the first portion 5003 of the connection frame 5000 may a portion corresponding to the bracket 140.

Figure 107:
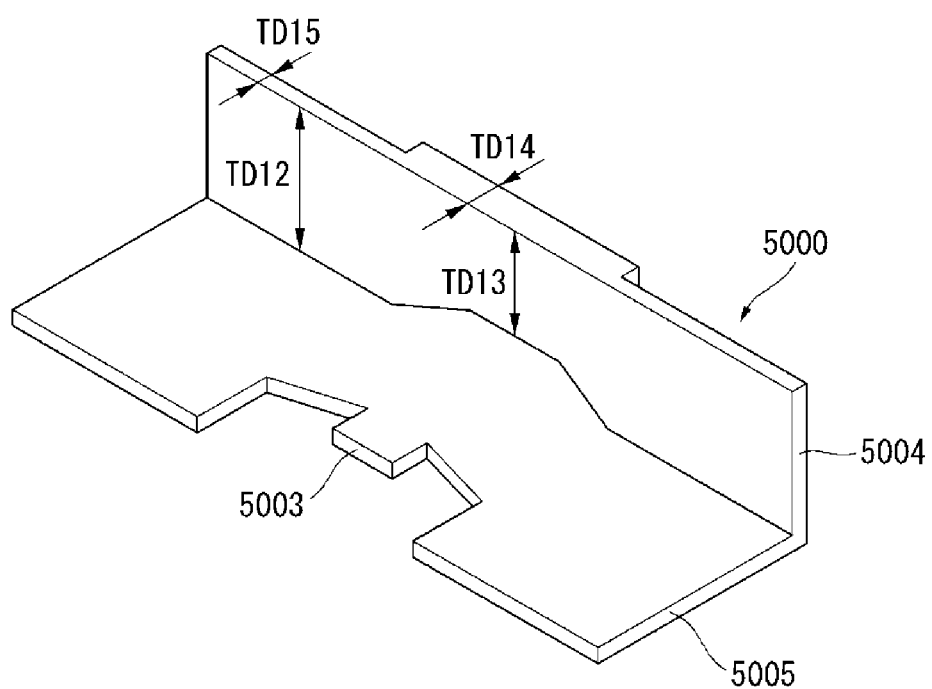

As shown in FIG. 107, the second portion 5004 in the area corresponding to the first portion 5003 may include a portion having a thickness TD14 greater than a thickness TD15 of the second portion 5004 in the area corresponding to the third portion 5005.

In this instance, even if the height TD13 of the second portion 5004 in the area corresponding to the first portion 5003 is relatively smaller than the height of the second portion 5004 in other areas, the strength of the connection frame 5000 may be sufficiently provided.

Figure 108:
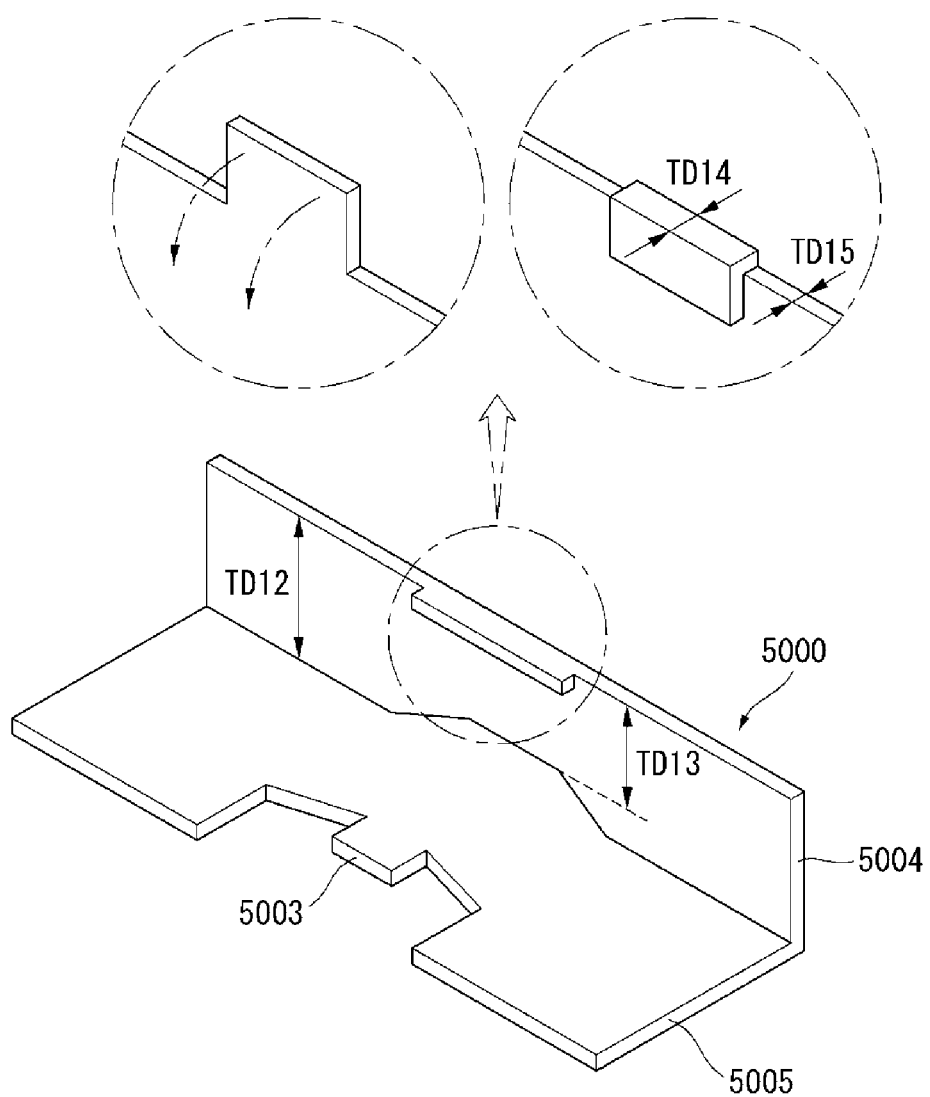

Alternatively, as shown in FIG. 108, the area corresponding to the first portion 5003 may include a double folded portion, so as to improve the strength of the second portion 5004 in the area corresponding to the first portion 5003. In this instance, a thickness TD14 of the double folded portion of the connection frame 5000 may be greater than a thickness TD15 of other portions.

Figure 109:
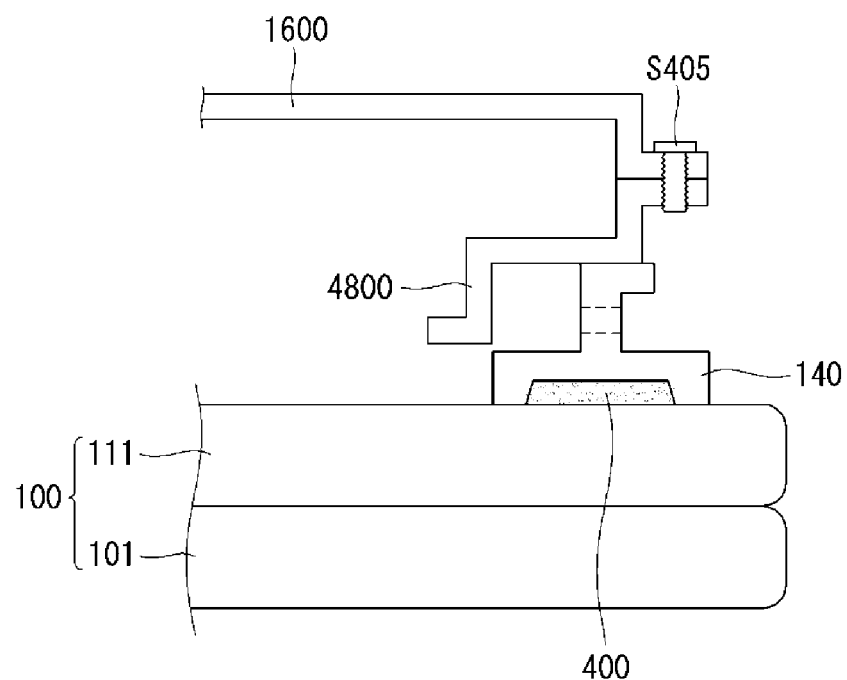

As shown in FIG. 109, the frame 1600 may be fastened to the auxiliary bracket 4800 using a predetermined fastening member S405.

As shown in FIG. 110 (A), the second portion 5004 of the connection frame 5000 may include a hole 5006 corresponding to a fastening portion JP10 between the frame 1600 and the auxiliary bracket 4800. In this instance, the fastening portion JP10 between the frame 1600 and the auxiliary bracket 4800 may pass through the hole 5006 of the connection frame 5000.

The hole 5006 of the connection frame 5000 corresponding to the fastening portion JP10 between the frame 1600 and the auxiliary bracket 4800 may be hidden by an adhesive sheet 5006. In this instance, light may be prevented from leaking through the hole 5006 of the connection frame 5000.

Figure 111:
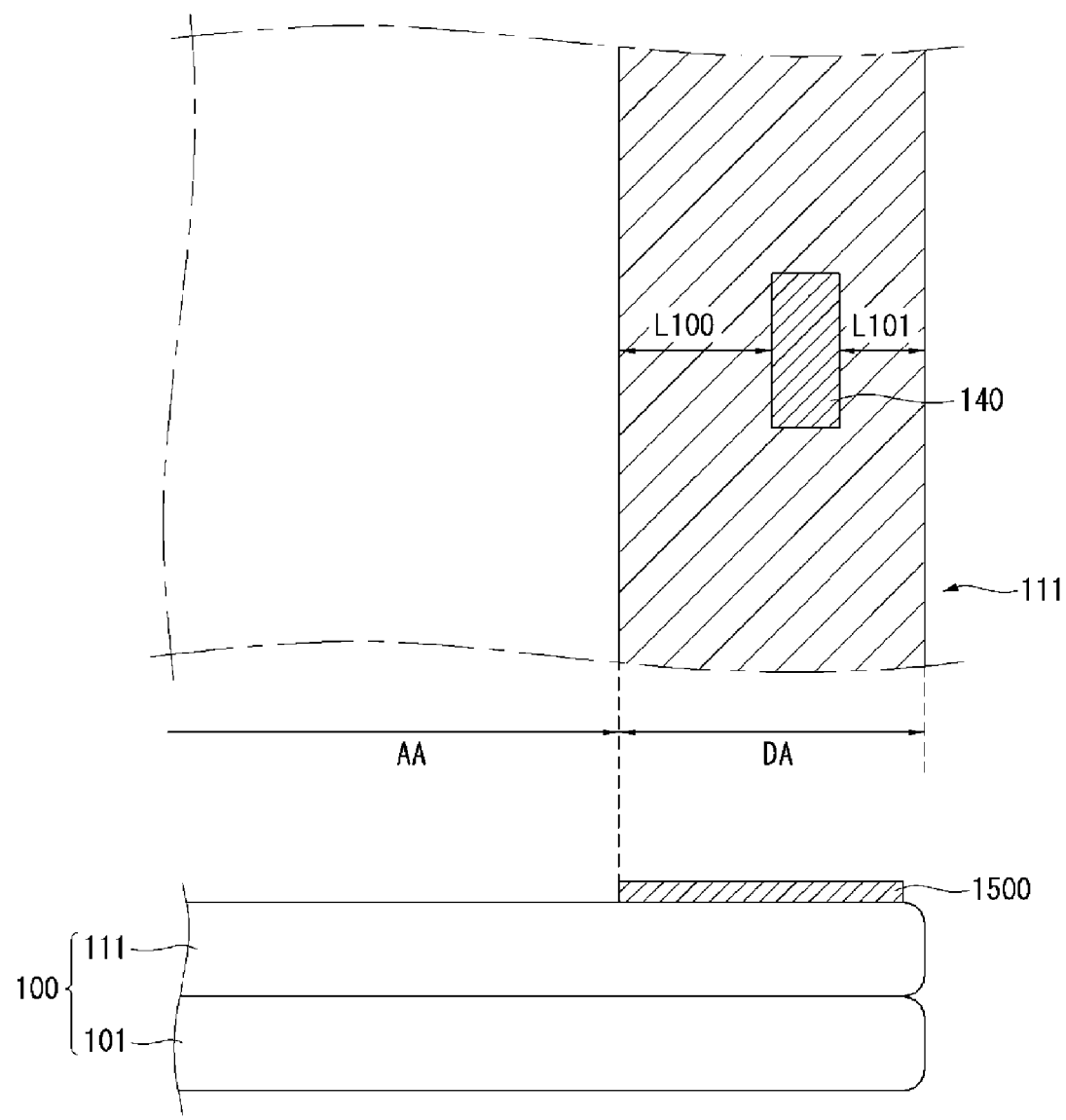

As shown in FIG. 111, the bracket 140 may be disposed in the dummy area DA positioned outside the display area AA of the back substrate 111. Further, the bracket 140 may be inclined to the end of the back substrate 111 in the dummy area DA of the back substrate 111.

Preferably, a distance L100 between the display area AA of the back substrate 111 and the bracket 140 may be greater than a distance L101 between the end of the back substrate 111 and the bracket 140. In this instance, because the space for the optical layer 110 may be sufficiently secured between the display area AA of the back substrate 111 and the bracket 140, an excessive increase in the size of the dummy area DA may be prevented.

There are various methods for dividing the display panel 100 into the display area AA and the dummy area DA. For example, the display panel 100 may be divided into the display area AA and the dummy area DA based on a transistor formed on the display panel 100. More specifically, the display panel 100 may be divided into the display area AA and the dummy area DA based on an outermost transistor to which image data is supplied.

Alternatively, the display panel 100 may be divided into the display area AA and the dummy area DA based on the blocking member 1500.

For example, as shown in FIG. 111, the dummy area DA may range from an end of the blocking member 1500 on the front substrate 101 to an end of the display panel 100, and the display area AA may occupy an area excluding the dummy area DA from the display panel 100. Other methods may be used to divide the display panel 100 into the active area AA and the dummy area DA. The method for dividing the display panel 100 into the active area AA and the dummy area DA based on the blocking member 1500 is described below.

When the display panel 100 is divided into the active area AA and the dummy area DA based on the blocking member 1500, the distance L100 between the end of the blocking member 1500 and the bracket 140 may be greater than the distance L100 between the bracket 140 and the end of the back substrate 111.

Figure 112:
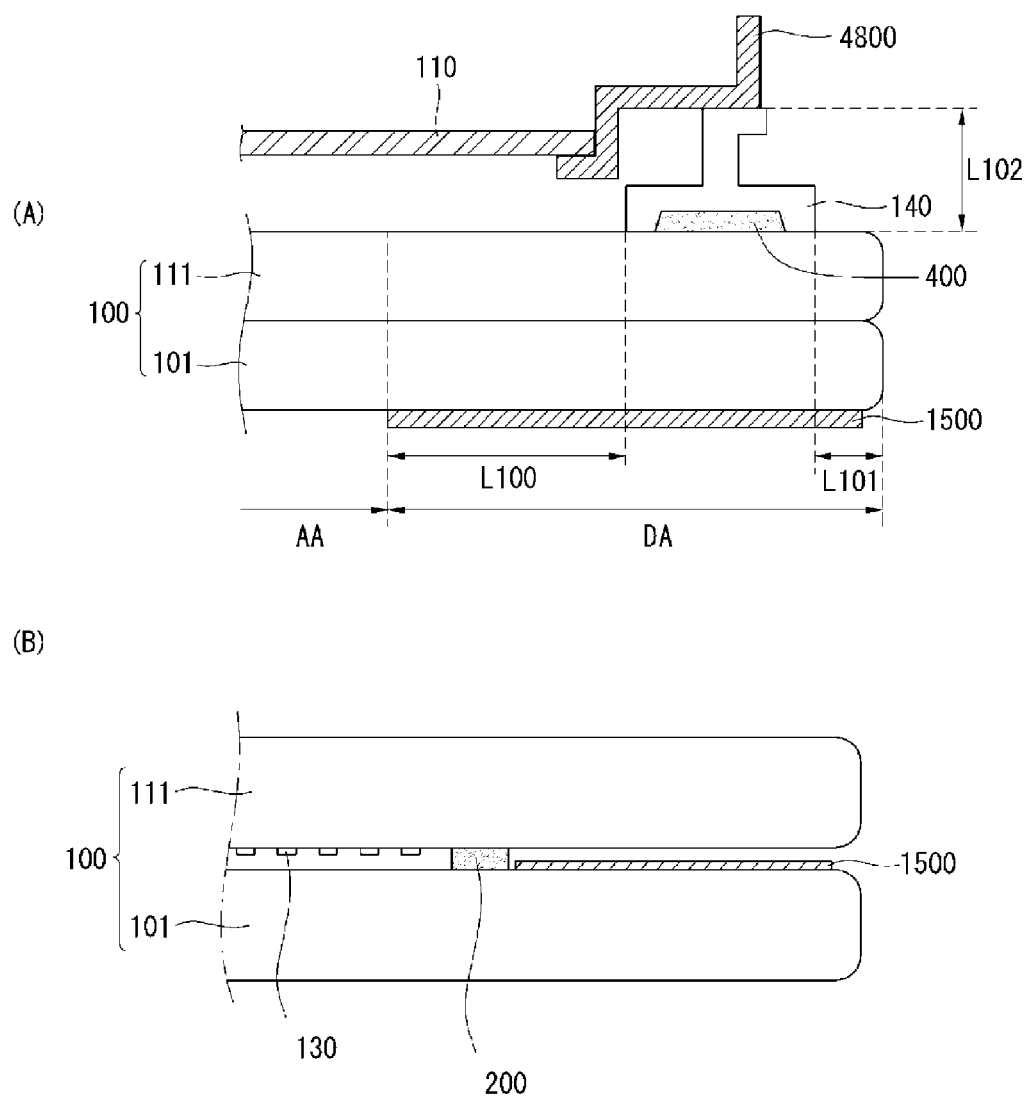

As shown in FIG. 112 (A), a width of the dummy area DA (i.e., a width of the blocking member 1500) may be greater than a height L102 of the bracket 140.

Alternatively, the distance L100 between a boundary between the active area AA and the dummy area DA and the bracket 140 may be greater than the height L102 of the bracket 140. In other words, the distance L100 between one end of the blocking member 1500, which is adjacent to the middle of the display panel 100, and the bracket 140 may be greater than the height L102 of the bracket 140.

In this instance, a travelling path of light generated in the light source may be sufficiently prevented from being blocked by a structure such as the bracket 140 and the auxiliary bracket 4800.

Further, the distance L101 between the bracket 140 and the end of the back substrate 111 may be less than the height L102 of the bracket 140. In this instance, the excessive increase in the size of the dummy area DA may be prevented.

Alternatively, as shown in FIG. 112 (B), the blocking member 1500 may be positioned between the front substrate 101 and the rear substrate 111. For example, the blocking member 1500 may be positioned on the front substrate in an area between the front substrate 101 and the rear substrate 111.

Figure 113:
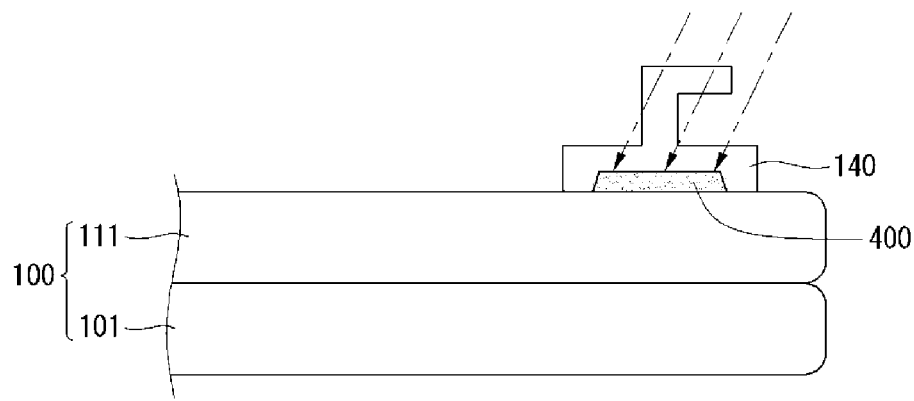

As shown in FIG. 113, the bracket 140 may include a light transmission material.

Further, it may be preferable that an adhesive used to attach the bracket 140 to the back surface of the back substrate 111 includes a photocurable material. In other words, the adhesive layer 400 may include a photocurable material.

In this instance, when light such as ultraviolet rays is incident on the bracket 140 in a state where the bracket 140 is attached to the back substrate 111, light may pass through the bracket 140 and may reach the adhesive layer 400. Then, the adhesive layer 400 may be cured. Therefore, time required to cure the adhesive layer 400 may be reduced.

Figure 114:
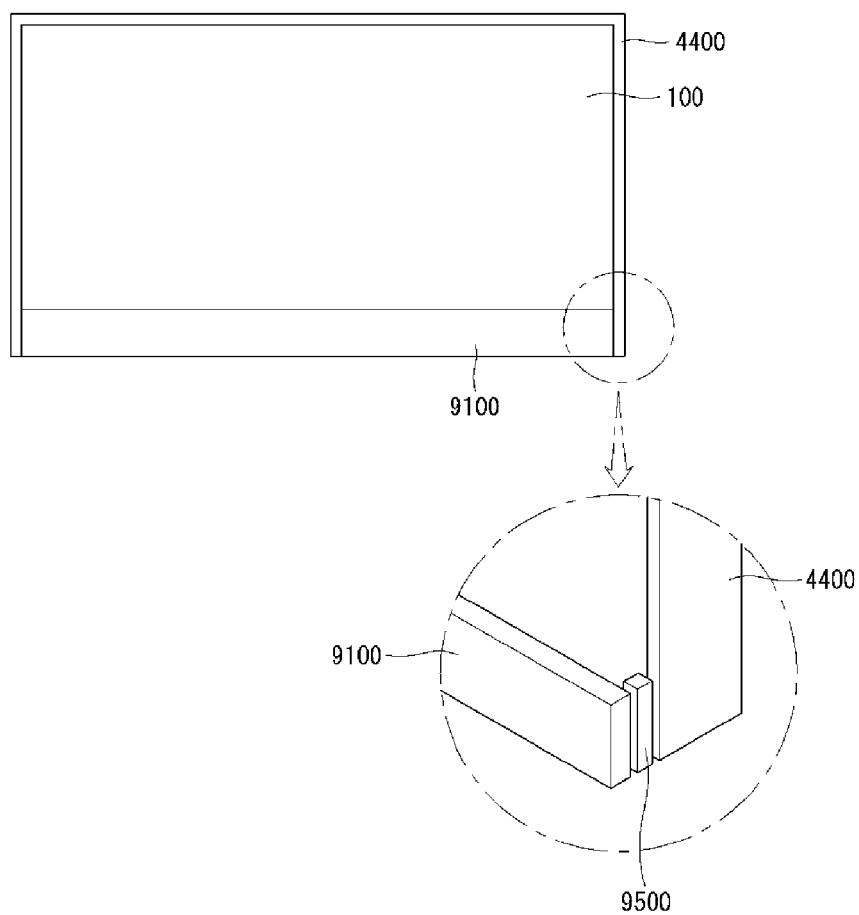

As shown in FIG. 114, a bottom structure 9500 may be disposed on the side of the bottom cover 9100 disposed under the display panel 100. The bottom structure 9500 may prevent light from leaking into a space between the bottom cover 9100 and the display panel 100. Further, the bottom structure 9500 may prevent the viewer from visually perceiving the display panel 100 or another structure in the space between the bottom cover 9100 and the display panel 100.

Figure 115:
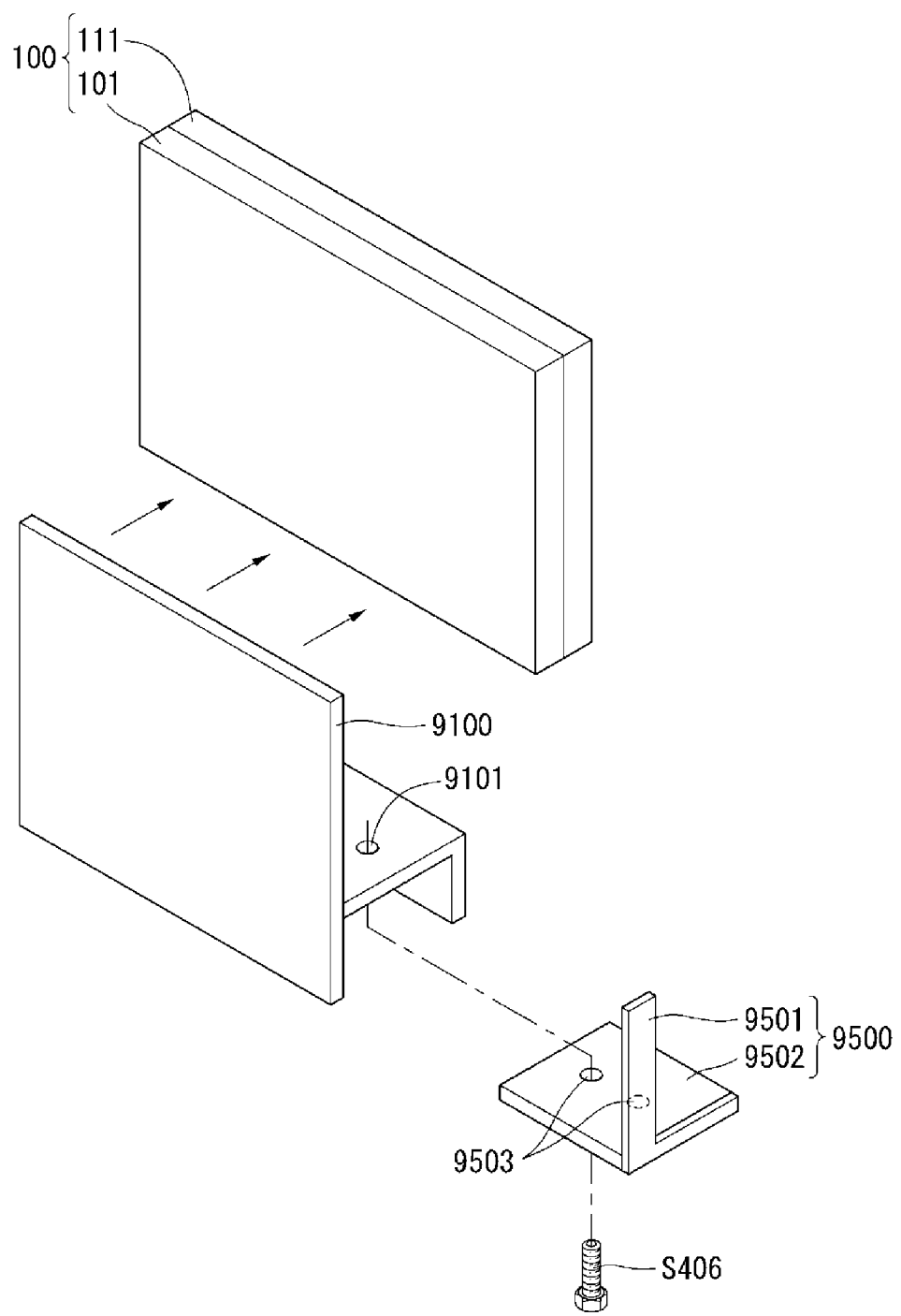

As shown in FIG. 115, the bottom structure 9500 may include a base structure 9502 and a cover structure 9501 connected to the base structure 9502.

The base structure 9502 may have a hole 9503, and the bottom cover 9100 may have a hole 9101 corresponding to the hole 9503 of the base structure 9502.

A predetermined fastening member S406 may pass through the hole 9503 of the base structure 9502 and the hole 9101 of the bottom cover 9100, thereby fasting the base structure 9502 to the bottom cover 9100.

As above, the base structure 9502 may be fastened to the bottom cover 9100, and the cover structure 9501 may be positioned on the side of the bottom cover 9100. Hence, the cover structure 9501 of the bottom structure 9500 may prevent light from leaking into a space between the bottom cover 9100 and the display panel 100.

Figure 116:
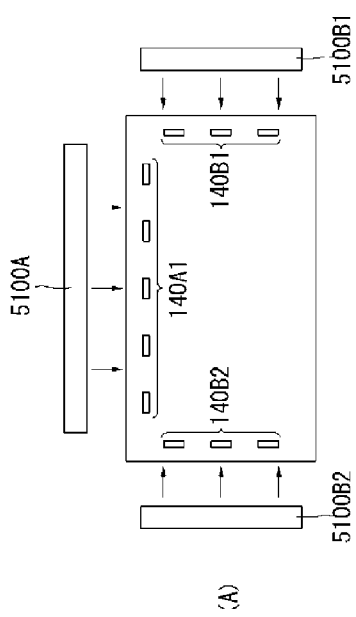
Figure 116:
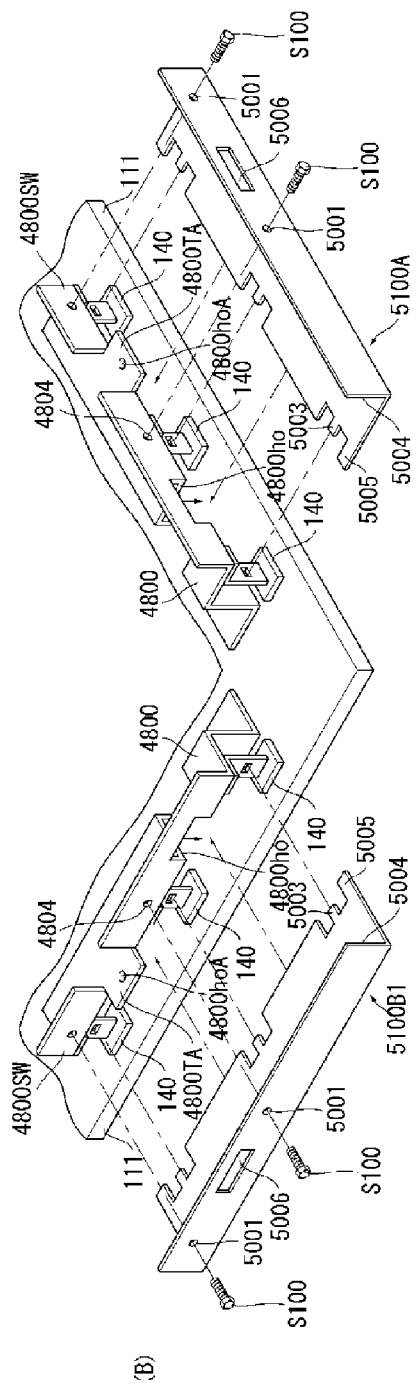

As shown in FIG. 116(A), the connection frame 5000 may be divided into a plurality of parts.

For example, a transverse connection frame 5100A may be disposed at a location corresponding to the transverse brackets 140A1 and 140A2; a first longitudinal connection frame 5100B1 may be disposed at a location corresponding to the first longitudinal bracket 140B1; and a second longitudinal connection frame 5100B2 may be disposed at a location corresponding to the second longitudinal bracket 140B2.

Each of the connection frames may correspond to the plurality of brackets 140.

For example, as shown in FIG. 116(B), each of the transverse connection frame 5100A and the first longitudinal connection frame 5100B1 may correspond to the plurality of brackets 140.

Figure 117:
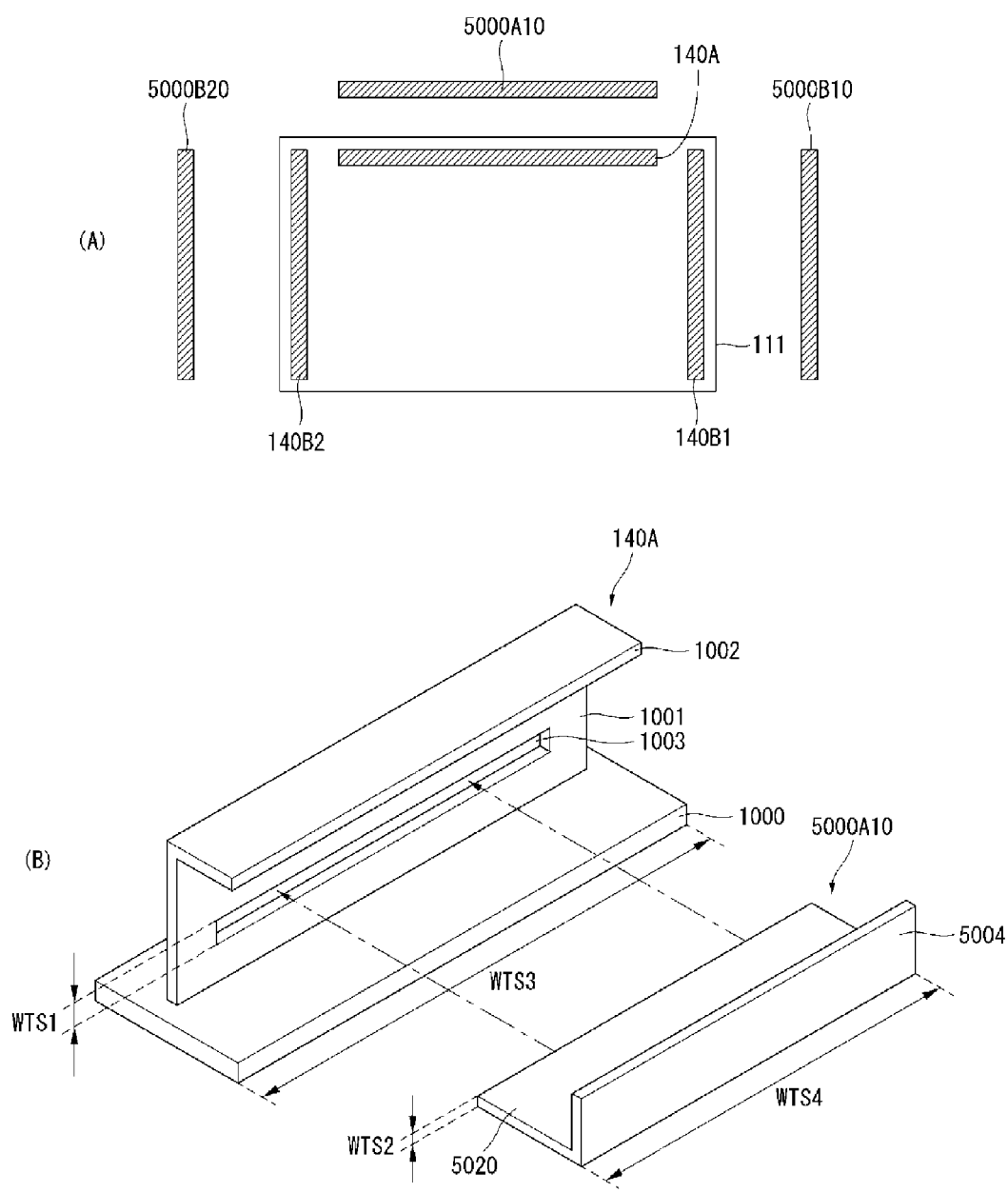

Alternatively, as shown in FIG. 117, one connection frame 5000 may correspond to one bracket 140. In this instance, the connection frame 5000 may be inserted into the hole 1003 of the bracket 140.

For example, as shown in FIG. 117 (A) a transverse connection frame 5000A10 corresponding to the transverse brackets 140A may be formed, a first longitudinal connection frame 5000B10 corresponding to the first longitudinal bracket 140B1 may be formed, and a second longitudinal connection frame 5000B20 corresponding to the second longitudinal bracket 140B2 may be formed.

In this instance, as shown in FIG. 117 (B) the connection frame 5000A10 may include a horizontal portion 5020 parallel to the longitudinal direction of the display panel 100 and a vertical portion 5004 (i.e., the second portion 5004 of the connection frame 5000A10) parallel to the width direction of the display panel 100. The horizontal portion 5020 may be inserted into the hole 1003 formed in the pillar 1001 of the bracket 140. In this instance, a thickness WTS2 of the horizontal portion 5020 of the connection frame 5000 may be less than a height WTS1 of the hole 1003 formed in the pillar 1001. In other word, the opening 1003 of the bracket 140A has a larger dimension than the first tab portion 5020 of the at least one connection frame 5000A10. Hence, the horizontal portion 5020 of the connection frame 5000 may move up and down inside the hole 1003.

Further, a length WTS4 of the connection frame 5000 may be less than a length WTS3 of the bracket 140.

Figure 118:
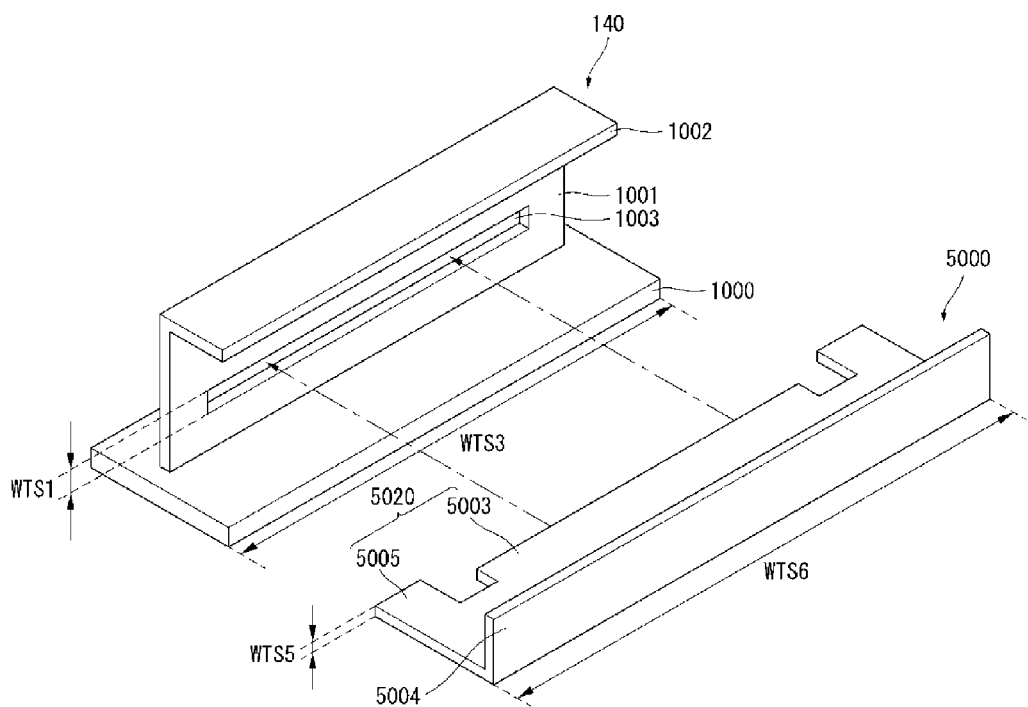

Alternatively, as shown in FIG. 118, a length WTS6 of the connection frame 5000 may be greater than the length WTS3 of the bracket 140. In this instance, the connection frame 5000 may include a portion inserted into the hole 1003 of the bracket 140.

More specifically, the horizontal portion 5020 of the connection frame 5000 may include a first portion 5003 inserted into the hole 1003 of the bracket 140 and a third portion 5005 positioned between the two adjacent brackets 140. In this instance, a thickness WTS5 of the first portion 5003 of the horizontal portion 5020 of the connection frame 5000 may be less than the height WTS1 of the hole 1003 formed in the pillar 1001.

As shown in FIG. 119, the frame 1600 may be separated from the bracket 140 by a predetermined distance WTS10. More specifically, the frame 1600 may be separated from the bracket 140 by the predetermined distance WTS10 in the width direction (i.e., the vertical direction) of the display panel 100. This may be implemented when the frame 1600 is fastened to the auxiliary bracket 4800 as shown in FIGS. 109 and 110.

Alternatively, the frame 1600 may contact the bracket 140.

Figure 120:
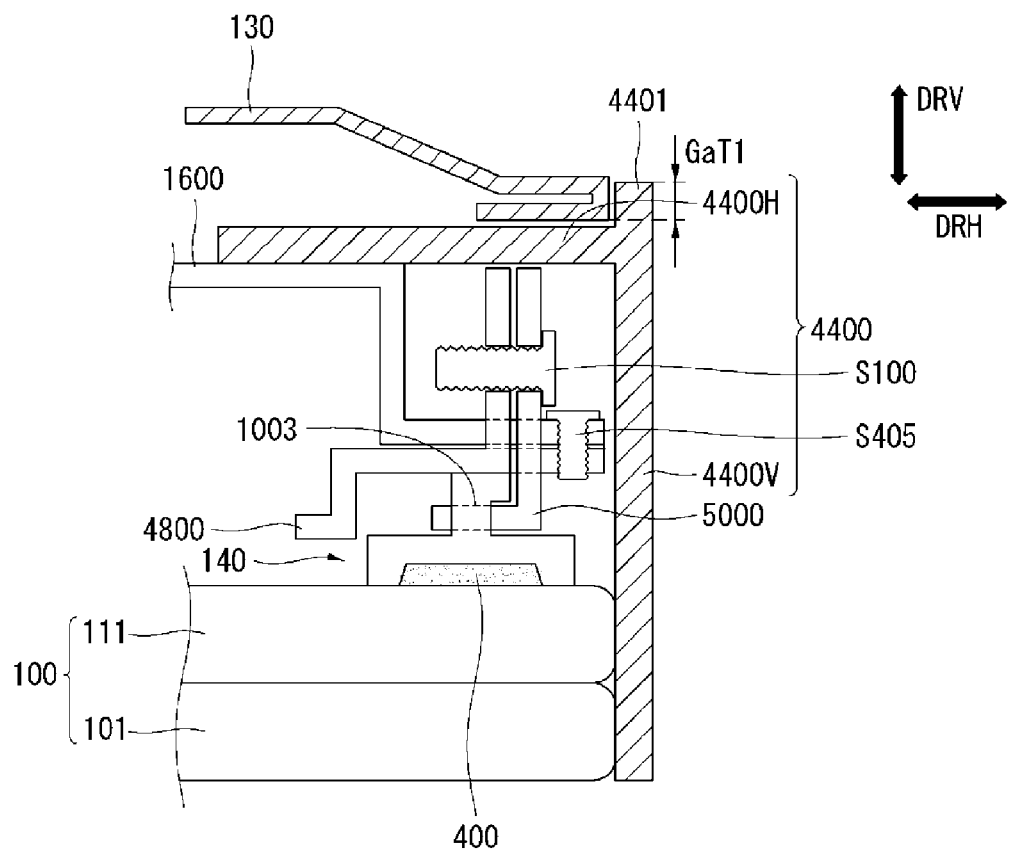

As shown in FIG. 120, the side wall 4400V of the side cover 4400 is extended in a third direction (DRV), and the overhang portion 4400H being space from the end of the sidewall 4400V by a prescribed distance GaT1 in the third direction (DRV) such that the side cover 4400 provides a rim for a back cover 130.

The screws S405 which connects the frame 1600 and auxiliary bracket 4800 may be positioned between the connection frame 5000 and the side cover 4400.

Figure 121:
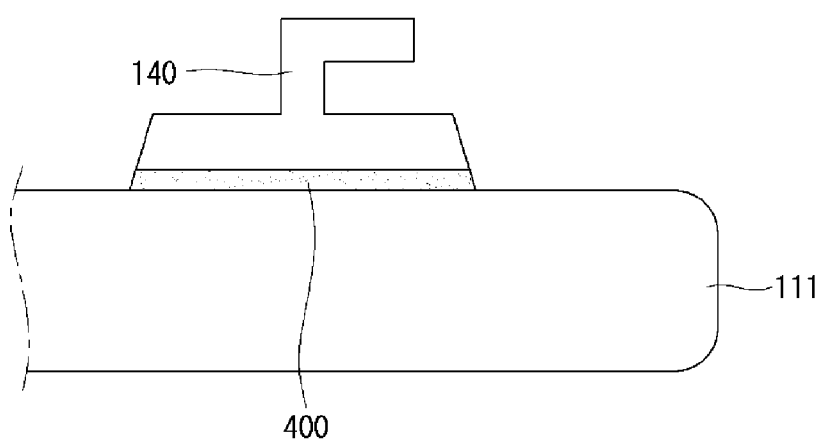

As shown in FIG. 121, the bracket 140 does not have recess. In this case, a side edge of the adhesive layer 400 is exposed.

Figure 122:
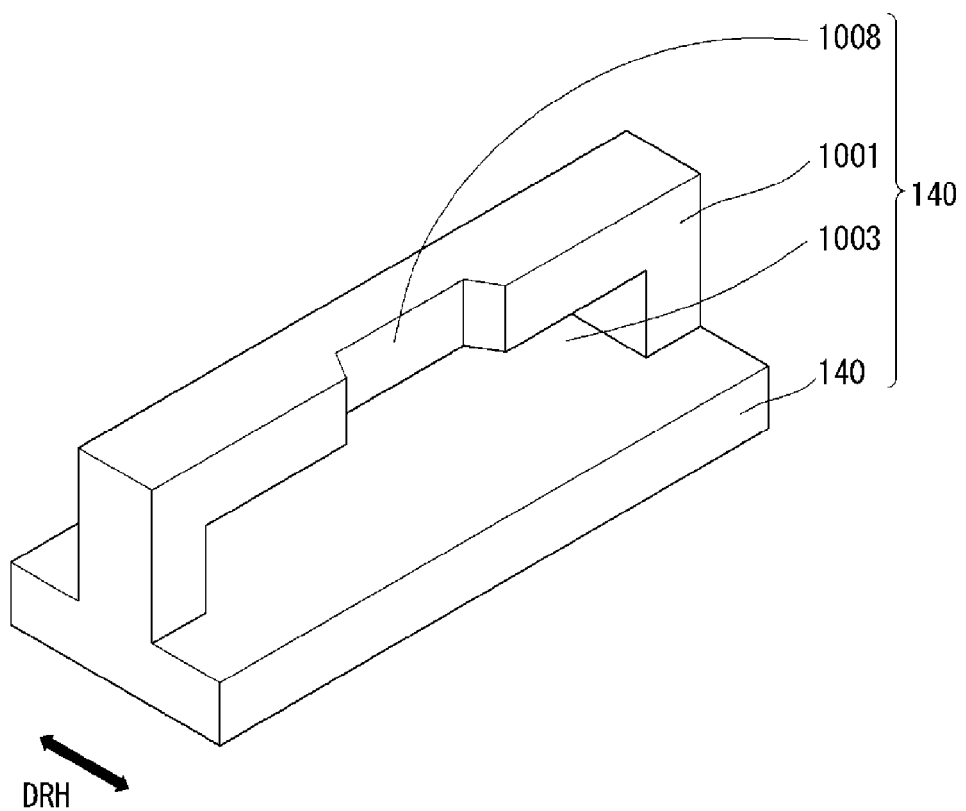

As shown in FIG. 122, the bracket 140 has the base 1000 and the first protrusion 1001. And, the first protrusion 1001 of the bracket extending away from the rear panel 111 in the vertical direction DRV (third direction) of the display panel.

The first protrusion 1001 has the opening 1003 and recess 1008 recessed in the horizontal direction DRH (third direction).

Figure 123:
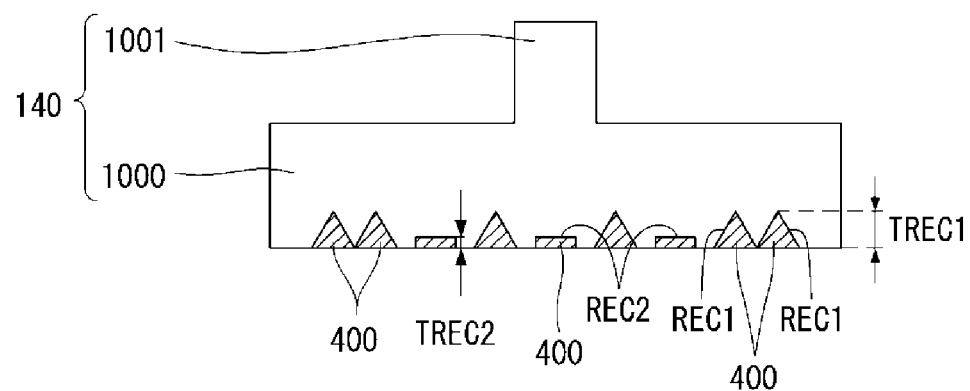
Figure 124:
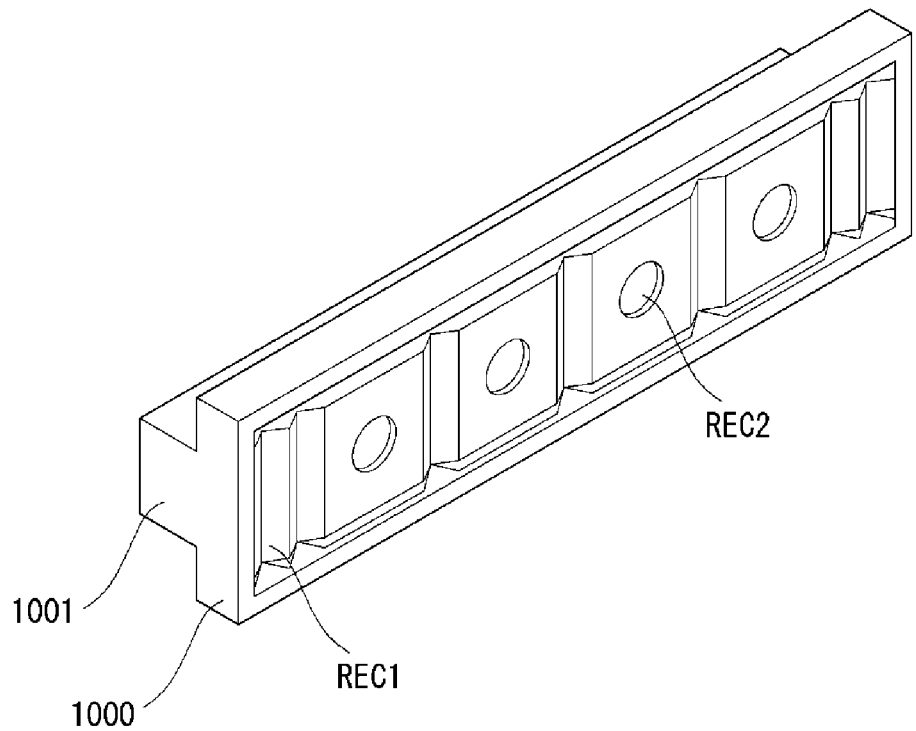

As shown in FIGS. 123 and 124, the bracket 140 has a plurality of recesses REC1, REC2. And, the adhesive layer 400 may be form at each of the recess REC1, REC2.

In this case, a height TREC1 of a first recess REC 1 may be different from a height TREC2 of a second recess REC 2.

The display apparatus according to the embodiment of the invention is not limited to the structure of the first and second recess REC1, REC2 of FIGS. 123 and 124.

Figure 125:
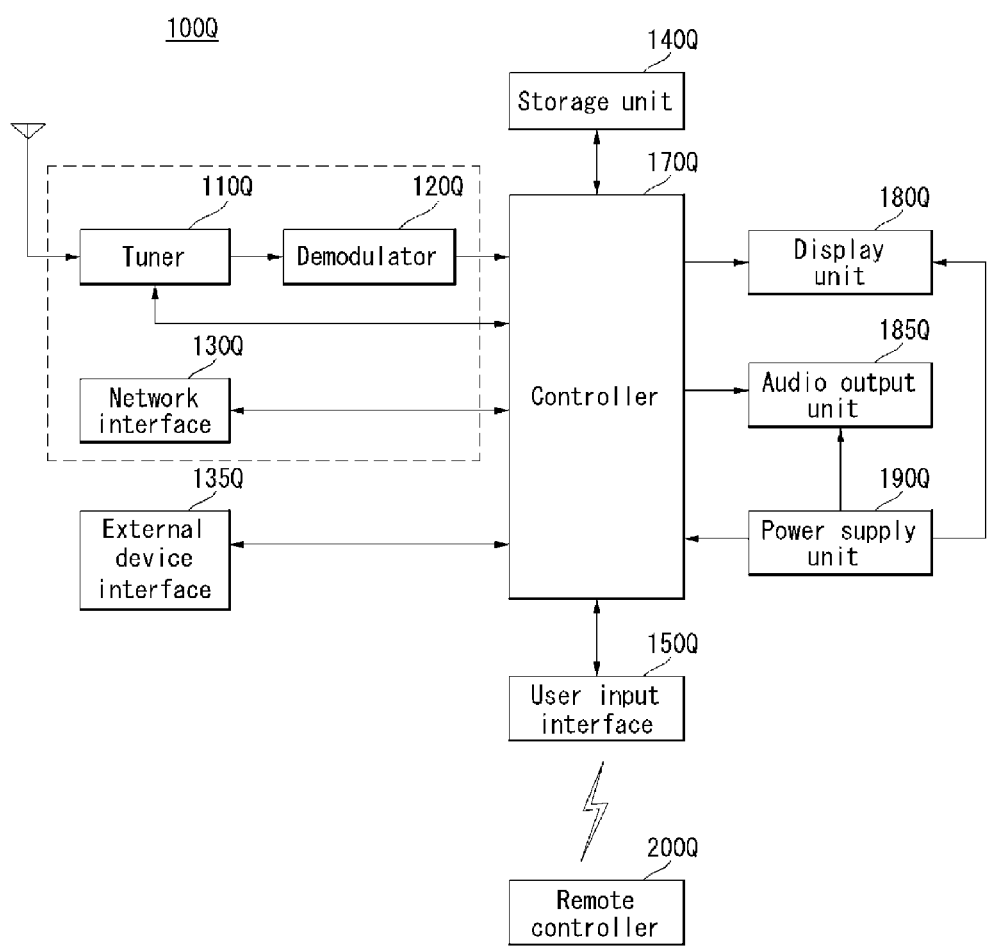
FIG. 125 illustrates another configuration of a display apparatus according to an example embodiment of the invention.

FIG. 125 illustrates another configuration of the display apparatus according to the example embodiment of the invention. In the following description, the descriptions of the configuration and the structure described above are omitted. Hereinafter, a broadcasting signal receiver is used as an electronic device, to which the display apparatus according to the embodiment of the invention is applied. The display apparatus according to the embodiment of the invention may be applied to other electronic devices such as cell phones.

A display unit 180Q shown in FIG. 125 may correspond to the display apparatus shown in FIGS. 1 to 124. Thus, the display apparatus according to the embodiment of the invention may be referred to as the display unit 180Q shown in FIG. 125.

As shown in FIG. 125, a broadcasting signal receiver 100Q according to the embodiment of the invention may include a broadcasting receiving unit 105Q, an external device interface 135Q, a storage unit 140Q, a user input interface 150Q, a controller 170Q, a display unit 180Q, an audio output unit 185Q, a power supply unit 190Q, and a photographing unit (not shown). The broadcasting receiving unit 105Q may include a tuner 110Q, a demodulator 120Q, and a network interface 130Q.

If necessary, the broadcasting signal receiver 100Q may be designed so that it includes the tuner 110Q and the demodulator 120Q and does not include the network interface 130Q. On the contrary, the broadcasting signal receiver 100Q may be designed so that it includes the network interface 130Q and does not include the tuner 110Q and the demodulator 120Q.

The tuner 110Q tunes a radio frequency (RF) broadcasting signal, which corresponds to a channel selected by the user or all of previously stored channels, among RF broadcasting signals received through an antenna. Further, the tuner 110Q converts the tuned RF broadcasting signal into a middle frequency signal, a base band image signal, or a voice signal.

The demodulator 120Q receives a digital IF signal converted by the tuner 110Q and performs a demodulating operation.

A stream signal output by the demodulator 120Q may be input to the controller 170Q. The controller 170Q performs demultiplexing, image/voice signal processing, etc. Then, the controller 170Q outputs an image to the display unit 180Q and outputs a voice to the audio output unit 185Q.

The external device interface 135Q may connect an external device to the broadcasting signal receiver 100Q. For this, the external device interface 135Q may include an audio-visual (AV) input/output unit (not shown) or a wireless communication unit (not shown).

The network interface 130Q provides an interface for connecting the broadcasting signal receiver 100Q to a wired/wireless network including an internet network. The network interface 130Q may correspond to the wireless communication unit, which was described in detail above.

The storage unit 140Q may store a program for the signal processing of the controller 170Q and the control operation of the controller 170Q or may store the processed image signal, the processed voice signal, or a data signal.

The user input interface 150Q may transfer the signal the user inputs to the controller 170Q, or may transfer the signal from the controller 170Q to the user.

For example, the user input interface 150Q may receive and process the control signal indicating the turn-on or turn-off operation, the channel selection, the screen setting, etc. from a remote controller 200Q based on various communication manners such as a RF communication manner and an infrared communication manner. Alternatively, the user input interface 150Q may operate so that the control signal from the controller 170Q is transmitted to the remote controller 200Q.

For example, the user input interface 150Q may transfer a control signal, which is input from a power key, a channel key, a volume key, a local key, etc., to the controller 170Q.

The controller 170Q may perform the demultiplexing processing on the stream input through the tuner 110Q, the demodulator 120Q, or the external device interface 135Q or may perform the processing of demultiplexed signals, thereby generating or outputting the signals for outputting the image or the voice.

The image signal processed by the controller 170Q may be input to the display unit 180Q and may display an image corresponding to the image signal. Further, the image signal processed by the controller 170Q may be input to an external output device through the external device interface 135Q.

The voice signal processed by the controller 170Q may be output to the audio output unit 185Q. Further, the voice signal processed by the controller 170Q may be input to the external output device through the external device interface 135Q.

The controller 170Q may control the entire operation of the broadcasting signal receiver 100Q. For example, the controller 170Q may control the tuner 110Q, so that the tuner 110Q tunes a RF broadcasting signal corresponding to a channel selected by the user or a previously stored channel.

The controller 170Q may control the broadcasting signal receiver 100Q using a user command or an internal program input through the user input interface 150Q.

The display unit 180Q may convert the image signal, the data signal, and an OSD signal, which are processed by the controller 170Q, or the image signal and the data signal which are received from the external device interface 135Q, into red, green, and blue signals and may generate a driving signal.

The audio output unit 185Q may receive the voice signal (for example, stereo signal, 3.1 channel signal, or 5.1 channel signal) processed by the controller 170Q and may output the voice.

The power supply unit 190Q supplies the power required in all of the components of the broadcasting signal receiver 100Q.

The remote controller 200Q transmits the user command the user inputs to the user input interface 150Q. For this, the remote controller 200Q may use Bluetooth, RF communication, infrared communication, Ultra-wideband (UWB), Zigbee, etc.

The remote controller 200Q may receive the image, the voice, or the data signal output from the user input interface 150Q and may display the image, the voice, or the data signal or may output the voice or the vibration.

The broadcasting signal receiver 100Q may not include the tuner 110Q and the demodulator 120Q. Further, the broadcasting signal receiver 100Q may receive image contents through the network interface 130Q or the external device interface 135Q and may reproduce the image contents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display apparatus, comprising:
    a display panel including a front substrate and a rear substrate;
    a frame provided behind the display panel;
    a side cover positioned relative to sides of the display panel, the side cover including
    a side wall,
    a first tab portion extending from a first portion of the side wall in a first direction, and
    a second tab portion extending from a second portion of the side wall in a second direction, the second direction being different to the first direction,
    the side cover being connected to the frame; and
    a back cover provided behind the frame,
    a connection side cover which extends in the second direction and is provided between and coupled to edges of the side cover,
    wherein the first tab portion is spaced from the second tab portion with a gap at or near a corner of the side cover, and
    wherein the first portion of the side wall is connected to the second portion of the side wall at or near the corner of the side cover.

2. The apparatus of claim 1, wherein the second direction is substantially perpendicular to the first direction.

3. The apparatus of claim 1, wherein a cover is disposed into or over the gap.

4. The apparatus of claim 1, wherein a resin is disposed into or over the gap.

5. The apparatus of claim 1, wherein the side cover includes:
    a first side cover;
    a second side cover positioned relative to the first side cover;
    a third side cover positioned relative to the first side cover and opposite to the second side cover; and
    a fourth side cover positioned relative to the second and third side cover and opposite to the first side cover,
    wherein the corner includes:
    a first corner located at a bent region where the first and the second side covers meet,
    a second corner located at a bent region where the first and the third side coves meet,
    a third corner located at a bent region where the second and fourth side covers meet, and
    a fourth corner located at a bent region where the third and fourth side covers meet.

6. The apparatus of claim 5, wherein the fourth side cover includes a first overhang extending from the second side cover in a parallel direction of the first side cover and a second overhang extending from the third side cover in a parallel direction of the first side cover, the first and second overhangs being separated to form an opening therebetween, wherein the connection side cover is positioned between the first and second overhangs of the fourth side cover.

7. The apparatus of claim 1, further comprising a hole in each of the corner.

8. The apparatus of claim 7, wherein the hole is positioned between the gap and the side wall.

9. The apparatus of claim 8, wherein a width of the hole is greater than a width of the gap.

10. The apparatus of claim 7, further comprising a cover member attached to cover the hole.

11. The apparatus of claim 1,
    wherein an end of the back cover is provided on the first and second tab portions.

12. The apparatus of claim 11, wherein the side cover comprises a protrusion protruding in a direction toward a rear of the display panel, wherein the end of the back cover is positioned relative to the protrusion.

13. The apparatus of claim 1, further comprising:
    at least one of a wireless communication unit and a speaker module positioned on the connection side cover.

14. The apparatus of claim 1, further comprising a bottom cover positioned on a long side of the display panel, the bottom cover connected to the frame and the connection side cover positioned relative to the bottom cover.

15. The apparatus of claim 14, wherein the bottom cover covers a portion of a front of the display panel.

16. The apparatus of claim 1,
    wherein the back cover includes at least one first hole, at least one of the first and second portions includes at least one second hole, and the frame includes at least one third hole,
    wherein the back cover, at least one of the first and second portions of the side cover, and the frame are fastened to one another through a fastening member passing through the first, second, and third holes.

17. The apparatus of claim 1,
    wherein the back cover is divided into a first back cover and a second back cover connected to the first back cover, wherein a material forming the first back cover is different from a material forming the second back cover.

18. The display apparatus of claim 17,
    wherein the second back cover contains a material capable of transmitting a radio wave, wherein a wireless communication unit is provided between the frame and the second back cover.

19. The display apparatus of claim 1, wherein a corner portion of the side wall and a first edge respectively of the first tab portion and the second tab portion form a first gap region of the gap, wherein a second edge respectively of the first tab portion and the second tab portion forms a second gap region of the gap, and
wherein the first gap region is closer to the corner than the second gap region.

20. The display apparatus of claim 1, wherein an end of the back cover is provided over at least part of the first and second tab portions.

21. A display apparatus, comprising:
a display panel including a front substrate and a rear substrate;
a frame provided behind the display panel;
a side cover positioned relative to sides of the display panel, the side cover including
a side wall,
a first tab portion extending from a first portion of the side wall in a first direction, and
a second tab portion extending from a second portion of the side wall in a second direction, the second direction being substantially different to the first direction,
the side cover connected to the frame; and
a back cover provided behind the frame,
wherein a corner portion of the side wall and a first edge respectively of the first tab portion and the second tab portion form a first gap region of a gap at or near a corner of the side cover,
wherein a second edge respectively of the first tab portion and the second tab portion forms a second gap region of the gap near the corner of the side cover, and
wherein the first gap region is closer to the corner than the second gap region.

22. The apparatus of claim 21, wherein the first gap region extends along a length of the first edge.

23. The apparatus of claim 21, wherein the first gap region is positioned at the corner of the side cover.

24. The apparatus of claim 21, wherein the side cover includes:
a first side cover;
a second side cover positioned relative to the first side cover;
a third side cover positioned relative to the first side cover and opposite to the second side cover; and
a fourth side cover positioned relative to the second and third side cover and opposite to the first side cover,
wherein the corner includes:
a first corner located at a bent region where the first and the second side covers meet,
a second corner located at a bent region where the first and the third side coves meet,
a third corner located at a bent region where the second and fourth side covers meet, and
a fourth corner located at a bent region where the third and fourth side covers meet.

25. The apparatus of claim 24, wherein the fourth side cover includes a first overhang extending from the second side cover in a parallel direction of the first side cover and a second overhang extending from the third side cover in a parallel direction of the first side cover, the first and second overhangs being separated to form an opening therebetween, wherein a connection side cover is positioned between the first and second overhangs of the fourth side cover.

26. The apparatus of claim 21, wherein a width of the first gap region is greater than a width of the second gap region.

27. The apparatus of claim 21, further comprising a cover member attached to cover the first gap region.

28. The apparatus of claim 21,
wherein an end of the back cover is provided on the first and second tab portions.

29. The apparatus of claim 28, wherein the side cover comprises a protrusion protruding in a direction toward a rear of the display panel, wherein the end of the back cover is positioned relative to the protrusion.

30. The apparatus of claim 21, further comprising:
at least one of a wireless communication unit and a speaker module positioned on the connection side cover.

31. The apparatus of claim 21, further comprising a bottom cover positioned on a long side of the display panel, the bottom cover connected to the frame and the connection side cover positioned relative to the bottom cover.

32. The apparatus of claim 31, wherein the bottom cover covers a portion of a front of the display panel.

33. The apparatus of claim 31,
wherein the back cover includes at least one first hole, at least one of the first and second portions includes at least one second hole, and the frame includes at least one third hole,
wherein the back cover, at least one of the first and second portions of the side cover, and the frame are fastened to one another through a fastening member passing through the first, second, and third holes.

34. The apparatus of claim 31,
wherein the back cover is divided into a first back cover and a second back cover connected to the first back cover, wherein a material forming the first back cover is different from a material forming the second back cover.

35. The display apparatus of claim 34,
wherein the second back cover contains a material capable of transmitting a radio wave,
wherein a wireless communication unit is provided between the frame and the second back cover.

36. The display apparatus of claim 21, wherein the first tab portion is spaced form the second tab portion with the first and second gap regions, and
wherein the first portion of the side wall is connected to the second portion of the side wall at or near the corner.

37. The display apparatus of claim 21, wherein a connection side cover which extends in the second direction and is provided between and coupled to edges of the side cover.

38. The display apparatus of claim 21, wherein an end of the back cover is provided over at least part of the first and second tab portions.

39. A display apparatus, comprising:
a display panel including a front substrate and a rear substrate;
a frame provided behind the display panel;
a side cover positioned relative to sides of the display panel, the side cover including
a side wall,
a first tab portion extending from a first portion of the side wall in a first direction, and
a second tab portion extending from a second portion of the side wall in a second direction, the second direction being different to the first direction,
the side cover being connected to the frame; and
a back cover provided behind the frame, wherein the first tab portion is spaced from the second tab portion with a gap at or near a corner of the side cover, wherein the first portion of the side wall is connected to the second portion of the side wall at or near the corner of the side cover, wherein an end of the back cover is provided over at least part of the tab portion.

40. The display apparatus of claim 39, wherein a corner portion of the side wall and a first edge respectively of the first tab portion and the second tab portion form a first gap region of the gap, wherein a second edge respectively of the first tab portion and the second tab portion forms a second gap region of the gap, and wherein the first gap region is closer to the corner than the second gap region.

41. The display apparatus of claim 39, wherein a connection side cover which extends in the second direction and is provided between and coupled to edges of the side cover.

42. The display apparatus of claim 39, further comprising a hole in each of the corner, wherein the hole is positioned between the gap and the side wall, wherein a width of the hole is greater than a width of the gap.

43. The apparatus of claim 39, wherein the end of the back cover is provided over and direct contact with at least part of the first and second tab portions.

44. The apparatus of claim 39, wherein the end of the back cover is provided over but not in direct contact with at least part of the first and second tab portions.

45. The apparatus of claim 39, wherein the side cover includes:

a first side cover;

a second side cover positioned relative to the first side cover;

a third side cover positioned relative to the first side cover and opposite to the second side cover; and a fourth side cover positioned relative to the second and third side cover and opposite to the first side cover, wherein the corner includes:

a first corner located at a bent region where the first and the second side covers meet, a second corner located at a bent region where the first and the third side coves meet, a third corner located at a bent region where the second and fourth side covers meet, and a fourth corner located at a bent region where the third and fourth side covers meet.

46. The apparatus of claim 45, wherein the fourth side cover includes a first overhang extending from the second side cover in a parallel direction of the first side cover and a second overhang extending from the third side cover in a parallel direction of the first side cover, the first and second overhangs being separated to form an opening therebetween, wherein a connection side cover is positioned between the first and second overhangs of the fourth side cover.

47. The apparatus of claim 39, further comprising a hole in each of the corner.

48. The apparatus of claim 47, wherein the hole is positioned between the gap and the side wall.

49. The apparatus of claim 48, wherein a width of the hole is greater than a width of the gap.

50. The apparatus of claim 48, further comprising a cover member attached to cover the hole.

51. The apparatus of claim 39, wherein the side cover comprises a protrusion protruding in a direction toward a rear of the display panel, wherein the end of the back cover is positioned relative to the protrusion.

52. The apparatus of claim 39, further comprising:

at least one of a wireless communication unit and a speaker module positioned on the connection side cover.

53. The apparatus of claim 39, further comprising a bottom cover positioned on a long side of the display panel, the bottom cover connected to the frame and the connection side cover positioned relative to the bottom cover.

54. The apparatus of claim 53, wherein the bottom cover covers a portion of a front of the display panel.

55. The apparatus of claim 39, wherein the back cover includes at least one first hole, at least one of the first and second portions includes at least one second hole, and the frame includes at least one third hole, wherein the back cover, at least one of the first and second portions of the side cover, and the frame are fastened to one another through a fastening member passing through the first, second, and third holes.

56. The apparatus of claim 39, wherein the back cover is divided into a first back cover and a second back cover connected to the first back cover, wherein a material forming the first back cover is different from a material forming the second back cover.

57. The display apparatus of claim 56, wherein the second back cover contains a material capable of transmitting a radio wave, wherein a wireless communication unit is provided between the frame and the second back cover.

* * * * *